(12) United States Patent
Yanaka et al.

(10) Patent No.: US 10,475,820 B2
(45) Date of Patent: Nov. 12, 2019

(54) PEELING METHOD, DISPLAY DEVICE, MODULE, AND ELECTRONIC DEVICE

(71) Applicant: Semiconductor Energy Laboratory Co., Ltd., Atsugi-shi, Kanagawa-ken (JP)

(72) Inventors: Junpei Yanaka, Tochigi (JP); Kayo Kumakura, Tochigi (JP); Masataka Sato, Tochigi (JP); Satoru Idojiri, Tochigi (JP); Kensuke Yoshizumi, Isehara (JP); Mari Tateishi, Ebina (JP); Natsuko Takase, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/143,970

(22) Filed: Sep. 27, 2018

(65) Prior Publication Data

US 2019/0035820 A1  Jan. 31, 2019

Related U.S. Application Data

(62) Division of application No. 15/596,412, filed on May 16, 2017, now Pat. No. 10,096,621.

(30) Foreign Application Priority Data

May 18, 2016 (JP) .................................. 2016-099426
May 18, 2016 (JP) .................................. 2016-099428

(51) Int. Cl.
*H01L 27/12* (2006.01)
*H01L 23/29* (2006.01)
(Continued)

(52) U.S. Cl.
CPC ........ *H01L 27/1225* (2013.01); *H01L 23/293* (2013.01); *H01L 27/124* (2013.01);
(Continued)

(58) Field of Classification Search
CPC ............. H01L 27/1225; H01L 27/3262; H01L 27/124; H01L 27/1266; H01L 23/293; H01L 2227/323
See application file for complete search history.

(56) References Cited

U.S. PATENT DOCUMENTS 6,127,199 A    10/2000  Inoue et al.
6,372,608 B1    4/2002  Shimoda et al.
(Continued)

FOREIGN PATENT DOCUMENTS

EP    0858110 A    8/1998
EP    1351308 A    10/2003
(Continued)

*Primary Examiner* — Selim U Ahmed
(74) *Attorney, Agent, or Firm* — Robinson Intellectual Property Law Office; Eric J. Robinson

(57) ABSTRACT

To provide a peeling method that achieves low cost and high mass productivity. The peeling method includes the steps of: forming a first layer with a photosensitive material over a formation substrate; forming a first region and a second region having a smaller thickness than the first region in the first layer by photolithography to form a resin layer having the first region and the second region; forming a transistor including an oxide semiconductor in a channel formation region over the first region in the resin layer; forming a conductive layer over the second region in the resin layer; and irradiating the resin layer with laser light to separate the transistor and the formation substrate.

25 Claims, 39 Drawing Sheets

(51) Int. Cl.
*H01L 27/32* (2006.01)
*H01L 51/00* (2006.01)

(52) U.S. Cl.
CPC ...... *H01L 27/1266* (2013.01); *H01L 27/3262* (2013.01); *H01L 51/003* (2013.01); *H01L 2227/323* (2013.01)

(56) References Cited

U.S. PATENT DOCUMENTS

| | | | |
|---|---|---|---|
| 6,645,830 | B2 | 11/2003 | Shimoda et al. |
| RE38,466 | E | 3/2004 | Inoue et al. |
| 6,818,530 | B2 | 11/2004 | Shimoda et al. |
| 7,094,665 | B2 | 8/2006 | Shimoda et al. |
| 7,285,476 | B2 | 10/2007 | Shimoda et al. |
| RE40,601 | E | 12/2008 | Inoue et al. |
| 7,468,308 | B2 | 12/2008 | Shimoda |
| 8,222,666 | B2 | 7/2012 | Hatano et al. |
| 8,242,494 | B2 | 8/2012 | Suzawa et al. |
| 8,378,343 | B2 | 2/2013 | Yamazaki et al. |
| 8,450,769 | B2 | 5/2013 | Hatano et al. |
| 8,686,417 | B2 | 4/2014 | Suzawa et al. |
| 8,759,132 | B2 | 6/2014 | Kimura et al. |
| 8,766,314 | B2 | 7/2014 | Hatano et al. |
| 8,980,685 | B2 | 3/2015 | Suzawa et al. |
| 9,171,867 | B2 | 10/2015 | Kimura et al. |
| 9,425,371 | B2 | 8/2016 | Hatano et al. |
| 9,437,831 | B2 | 9/2016 | Yamazaki et al. |
| 9,559,316 | B2 | 1/2017 | Yamazaki et al. |
| 9,559,317 | B2 | 1/2017 | Yamazaki et al. |
| 9,647,242 | B2 | 5/2017 | Fukuda et al. |
| 9,799,716 | B2 | 10/2017 | Hatano et al. |
| 2003/0116768 | A1* | 6/2003 | Ishikawa .......... H01L 29/78633 257/79 |
| 2005/0161680 | A1* | 7/2005 | Kawakami .......... H01L 27/3244 257/79 |
| 2006/0012742 | A1* | 1/2006 | Tsai .................... H01L 27/3248 349/139 |
| 2011/0031493 | A1 | 2/2011 | Yamazaki et al. |
| 2011/0294244 | A1 | 12/2011 | Hattori et al. |
| 2014/0217383 | A1 | 8/2014 | Park et al. |
| 2015/0155505 | A1 | 6/2015 | Yamazaki et al. |
| 2016/0035758 | A1 | 2/2016 | Kimura et al. |
| 2016/0283028 | A1 | 9/2016 | Yamazaki et al. |
| 2016/0299387 | A1 | 10/2016 | Yamazaki et al. |
| 2016/0358986 | A1 | 12/2016 | Yamazaki et al. |
| 2017/0031192 | A1 | 2/2017 | Yamazaki et al. |
| 2017/0031471 | A1 | 2/2017 | Yamazaki et al. |
| 2017/0033172 | A1 | 2/2017 | Yamazaki et al. |
| 2017/0133450 | A1 | 5/2017 | Yamazaki et al. |
| 2017/0294462 | A1 | 10/2017 | Yamazaki et al. |
| 2018/0166524 | A1 | 6/2018 | Yamazaki et al. |
| 2019/0096977 | A1 | 3/2019 | Yamazaki et al. |

FOREIGN PATENT DOCUMENTS

| | | | |
|---|---|---|---|
| EP | 1655633 | A | 5/2006 |
| EP | 1744365 | A | 1/2007 |
| EP | 1758169 | A | 2/2007 |
| JP | 10-206896 | A | 8/1998 |
| JP | 2009-260166 | A | 11/2009 |
| JP | 2010-165673 | A | 7/2010 |
| JP | 2011-248072 | A | 12/2011 |
| JP | 2015-072361 | A | 4/2015 |
| JP | 2015-187701 | A | 10/2015 |
| JP | 2015-223823 | A | 12/2015 |
| WO | WO-2010/071089 | | 6/2010 |
| WO | WO-2011/040441 | | 4/2011 |
| WO | WO-2015/083029 | | 6/2015 |

* cited by examiner

PEELING METHOD, DISPLAY DEVICE, MODULE, AND ELECTRONIC DEVICE

BACKGROUND OF THE INVENTION

1. Field of the Invention

One embodiment of the present invention relates to a peeling method. One embodiment of the present invention relates to a method for manufacturing a device including a peeling step. In particular, one embodiment of the present invention relates to a flexible display device and a method for manufacturing the flexible display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

Note that in this specification and the like, a semiconductor device means all the devices that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

Display devices using organic electroluminescent (EL) elements or liquid crystal elements have been known. Examples of the display device also include a light-emitting device provided with a light-emitting element such as a light-emitting diode (LED), and electronic paper performing display by an electrophoretic method or the like.

The organic EL element generally has a structure in which a layer containing a light-emitting organic compound is provided between a pair of electrodes. When voltage is applied to this element, light emission can be obtained from the light-emitting organic compound. With the use of such an organic EL element, thin, lightweight, high-contrast, and low-power-consumption display devices can be achieved.

A flexible display device can be obtained by formation of a semiconductor element such as a transistor or a display element such as an organic EL element over a flexible substrate (film).

In a manufacturing method of a flexible display device that is disclosed in Patent Document 1, laser light irradiation is performed on a supporting substrate (a glass substrate) over which a sacrifice layer, a heat-resistant resin layer, and an electronic element are provided in that order, and the heat-resistant resin layer is peeled from the glass substrate.

REFERENCE

Patent Document

[Patent Document 1] Japanese Published Patent Application No. 2015-223823

SUMMARY OF THE INVENTION

An object of one embodiment of the present invention is to provide a novel peeling method. An object of one embodiment of the present invention is to provide a peeling method that achieves high mass productivity at low cost. An object of one embodiment of the present invention is to provide a peeling method with a high yield. An object of one embodiment of the present invention is to perform peeling using a large-sized substrate.

An object of one embodiment of the present invention is to provide a novel method for manufacturing a display device. An object of one embodiment of the present invention is to provide a highly reliable display device. An object of one embodiment of the present invention is to provide a small, thin, or lightweight display device. An object of one embodiment of the present invention is to provide a flexible display device or a display device having a curved surface. An object of one embodiment of the present invention is to provide a non-breakable display device. An object of one embodiment of the present invention is to manufacture a display device at a low temperature. An object of one embodiment of the present invention is to provide a method for manufacturing a display device through a simplified manufacturing process. An object of one embodiment of the present invention is to provide a method for manufacturing a display device which achieves high mass productivity at low cost. An object of one embodiment of the present invention is to manufacture a display device using a large-sized substrate.

Note that the description of these objects does not disturb the existence of other objects. One embodiment of the present invention does not necessarily achieve all the objects. Other objects can be derived from the description of the specification, the drawings, and the claims.

(1) One embodiment of the present invention is a peeling method including the steps of: forming a first layer with a photosensitive material over a formation substrate; forming a first region and a second region having a smaller thickness than the first region in the first layer by photolithography to form a resin layer having the first region and the second region; forming a transistor including an oxide semiconductor in a channel formation region over the first region in the resin layer; forming a conductive layer over the second region in the resin layer; and irradiating the resin layer with laser light to separate the transistor and the formation substrate.

In embodiment (1), the resin layer having the first region and the second region is preferably processed into an island shape with a multi-tone mask. Alternatively, in embodiment (1), the resin layer having the first region, the second region, and an opening is preferably formed with a multi-tone mask.

(2) One embodiment of the present invention is a peeling method including the steps of: forming a first layer with a photosensitive material over a formation substrate; forming a depressed portion in the first layer by photolithography to form a resin layer having a depressed portion; forming, over the resin layer, an insulating layer having an opening that overlaps with a bottom surface of the depressed portion of the resin layer and covering a side surface of the depressed portion of the resin layer; forming, over the insulating layer, a transistor including an oxide semiconductor in a channel formation region; forming a conductive layer that overlaps with the bottom surface of the depressed portion of the resin layer with the opening of the insulating layer positioned therebetween; and irradiating the resin layer with laser light to separate the transistor and the formation substrate.

(3) One embodiment of the present invention is a peeling method including the steps of: forming a first layer with a photosensitive material over a formation substrate; forming a depressed portion in the first layer by photolithography to form a resin layer having a depressed portion; forming, over the resin layer, an insulating layer covering a side surface and a bottom surface of the depressed portion of the resin layer; forming, over the insulating layer, a transistor including an oxide semiconductor in a channel formation region; forming a conductive layer that overlaps with the bottom surface of the depressed portion of the resin layer with the insulating layer positioned therebetween; and irradiating the resin layer with laser light to separate the transistor and the formation substrate.

In embodiment (2) or (3), the resin layer having the depressed portion is preferably processed into an island shape with use of a multi-tone mask. Alternatively, in embodiment (2) or (3), the resin layer having the depressed portion and the opening is preferably formed with a multi-tone mask.

In embodiment (1) or (2), after the transistor and the formation substrate are separated from each other, the resin layer is preferably subjected to ashing to expose the conductive layer. In embodiment (3), after the transistor and the formation substrate are separated from each other, it is preferable that the resin layer be subjected to ashing and a portion of the insulating layer which overlaps with the conductive layer be removed to expose the conductive layer.

In embodiment (1), (2), or (3), an oxide conductive layer is preferably formed as the conductive layer.

In embodiment (1), (2), or (3), the conductive layer is preferably formed with the same material in the same step as an electrode or the oxide semiconductor of the transistor.

In embodiment (1), (2), or (3), the resin layer is preferably irradiated with laser light from the formation substrate side.

(4) One embodiment of the present invention is a display device including a resin layer, a conductive layer over the resin layer, a transistor over the resin layer, and a display element electrically connected to the transistor. The resin layer includes an opening. In the opening, at least part of the conductive layer is exposed. The transistor includes an oxide semiconductor in a channel formation region.

(5) One embodiment of the present invention is a display device including a resin layer, an insulating layer over the resin layer, a conductive layer over the insulating layer, a transistor over the insulating layer, and a display element electrically connected to the transistor. The resin layer includes an opening. The insulating layer includes an opening that overlaps with the opening of the resin layer. At least part of the conductive layer is exposed in the opening of the resin layer. The transistor includes an oxide semiconductor in a channel formation region.

(6) One embodiment of the present invention is a display device including a resin layer, an insulating layer over the resin layer, a conductive layer over the insulating layer, a transistor over the insulating layer, and a display element electrically connected to the transistor. The resin layer includes an opening. The insulating layer covers a periphery of the opening of the resin layer and includes an opening overlapping with the opening of the resin layer. At least part of the conductive layer is exposed in the opening of the resin layer. The transistor includes an oxide semiconductor in a channel formation region.

In embodiment (4), (5), or (6), the thickness of the resin layer is preferably greater than or equal to 0.1 μm and less than or equal to 3 μm.

In embodiment (4), (5), or (6), the 5% weight loss temperature of the resin layer is preferably lower than 400° C.

In embodiment (4), (5), or (6), an exposed surface of the conductive layer preferably has a portion that projects from an exposed surface of the resin layer.

(7) One embodiment of the present invention is a module including the display device with any of the above structures and a circuit board. The conductive layer is electrically connected to the circuit board through the opening of the resin layer.

(8) One embodiment of the present invention is an electronic device including the above-described module and at least one of an antenna, a battery, a housing, a camera, a speaker, a microphone, and an operation button.

According to one embodiment of the present invention, a novel peeling method can be provided. According to one embodiment of the present invention, a peeling method that achieves high mass productivity at low cost can be provided. According to one embodiment of the present invention, a peeling method with a high yield can be provided. According to one embodiment of the present invention, peeling can be performed using a large-sized substrate.

According to one embodiment of the present invention, a novel method for manufacturing a display device can be provided. According to one embodiment of the present invention, a highly reliable display device can be provided. According to one embodiment of the present invention, a small, thin, or lightweight display device can be provided. According to one embodiment of the present invention, a flexible display device or a display device having a curved surface can be provided. According to one embodiment of the present invention, a non-breakable display device can be provided. According to one embodiment of the present invention, a display device can be manufactured at a low temperature. According to one embodiment of the present invention, a method for manufacturing a display device through a simplified manufacturing process can be provided. According to one embodiment of the present invention, a method for manufacturing a display device which achieves high mass productivity at low cost can be provided. According to one embodiment of the present invention, a display device can be manufactured using a large-sized substrate.

Note that the description of these effects does not preclude the existence of other effects. One embodiment of the present invention does not necessarily achieve all the effects listed above. Other effects can be derived from the description of the specification, the drawings, and the claims.

DETAILED DESCRIPTION OF THE INVENTION

Figure 1A:
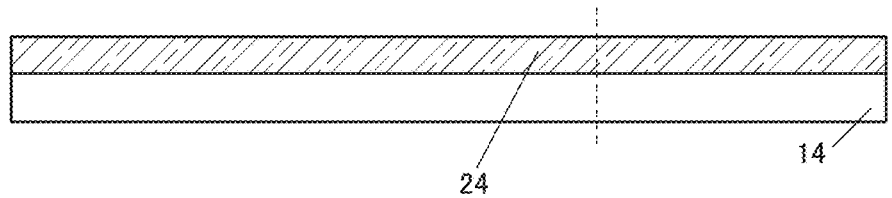
FIGS. 1A to 1E illustrate an example of a method for manufacturing a display device.

Embodiments will be described in detail with reference to the drawings. Note that the present invention is not limited to the following description, and it will be easily understood by those skilled in the art that modes and details can be modified in various ways without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is used for portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". The term "insulating film" can be changed into the term "insulating layer".

Note that in this specification and the like, a "substrate" preferably has a function of supporting at least one of a functional circuit, a functional element, a functional film, and the like. A "substrate" does not necessarily have a function of supporting a functional circuit, a functional element, a functional film, and the like, and may have a function of protecting a surface of the device, or a function of sealing at least one of a functional circuit, a functional element, a functional film, and the like, for example.

Embodiment 1

In this embodiment, a peeling method and a method for manufacturing a display device, which are embodiments of the present invention, will be described with reference to FIGS. 1A to 1E to FIGS. 18A and 18B.

In this embodiment, a display device including a transistor and an organic EL element (also referred to as an active-matrix organic EL display device) is described as an example. The display device can be a flexible display device by using a flexible material for a substrate. Note that one embodiment of the present invention is not limited to a light-emitting device, a display device, and an input/output device (e.g., a touch panel) each including an organic EL element, and can be applied to a variety of devices such as a semiconductor device, a light-emitting device, a display device, and an input/output device each including another functional element.

In the peeling method of one embodiment of the present invention, first, a first layer is formed over a formation substrate with use of a photosensitive material. Next, a first region and a second region that is thinner than the first region are formed in the first layer by photolithography, so that a resin layer including the first region and the second region is formed. Next, a transistor that includes an oxide semiconductor in a channel formation region is formed over the first region in the resin layer, and a conductive layer is formed over the second region in the resin layer. Next, the resin layer is irradiated with laser light. Then, the transistor and the formation substrate are separated.

In one embodiment of the present invention, the resin layer is formed with a photosensitive material. Use of a photosensitive material facilitates formation of a resin layer with a desired shape. For example, a resin layer having two or more regions with different thicknesses can be formed easily.

After the peeling, the resin layer remains on the transistor side. The first region and the second region that is thinner than the first region are formed in the resin layer, and the conductive layer is formed to overlap with the second region, in which case the conductive layer can be easily exposed after the peeling step. Specifically, the amount (thickness) of the resin layer to be removed to expose the conductive layer can be small because the thickness of the second region is smaller than that of the first region.

Even when the resin layer is removed until the conductive layer is exposed, part of the first region in the resin layer can be left. The left resin layer can be used as a protective layer.

The exposed conductive layer can be used as, for example, a rear electrode, a through electrode, or an external connection terminal. The conductive layer can be electrically connected to a circuit board such as a flexible printed substrate (FPC).

Ashing is preferably used for removal of the resin layer. Specifically, ashing using oxygen plasma is preferably performed.

An oxide conductive layer is preferably used as the conductive layer. In the case where ashing using oxygen plasma is performed for removal of the resin layer in order to expose the conductive layer, if a metal film is used as the conductive layer, the metal film might be oxidized and have reduced conductivity. Use of an oxide conductive layer as the conductive layer can suppress a reduction in conductivity of the conductive layer caused by ashing of the resin layer.

In the peeling method of one embodiment of the present invention, first, the first layer is formed with a photosensitive material over the formation substrate. Next, a depressed portion is formed in the first layer by photolithography, whereby a resin layer having a depressed portion is formed. Then, an insulating layer is formed over the resin layer. This insulating layer has an opening overlapping with a bottom surface of the depressed portion of the resin layer and covers a side surface of the depressed portion of the resin layer. Next, a transistor including an oxide semiconductor in a channel formation region is formed over the insulating layer, and a conductive layer that overlaps with the bottom surface of the depressed portion of the resin layer with the opening of the insulating layer positioned therebetween is formed. Then, the resin layer is irradiated with laser light. After that, the transistor and the formation substrate are separated.

The insulating layer covering the side surface of the depressed portion of the resin layer can prevent impurities such as hydrogen contained in the resin layer from entering the transistor.

By providing the conductive layer that overlaps with the bottom surface of the depressed portion of the resin layer with the opening of the insulating layer positioned therebetween, after the peeling step, the conductive layer can be easily exposed. Specifically, the depressed portion of the resin layer has a smaller thickness than the other portion of the resin layer, which means that the amount of the resin layer reduced to expose the conductive layer can be small. Furthermore, the conductive layer can be exposed only by removing the resin layer without removing the insulating layer.

The display device of one embodiment of the present invention preferably includes an oxide semiconductor in a channel formation region of the transistor.

In the case where low temperature polysilicon (LTPS) is used for the channel formation region of the transistor, the resin layer is required to have heat resistance because a temperature of approximately 500° C. to 550° C. needs to be applied. Furthermore, the resin layer needs to have a large thickness so that damage in a step of laser crystallization is reduced.

In contrast, a transistor including an oxide semiconductor can be formed at a temperature lower than or equal to 350° C., or even lower than or equal to 300° C. Therefore, the resin layer is not required to have high heat resistance. Accordingly, the upper temperature limit of the resin layer may be low, and the range of choices for the materials can be widened. Furthermore, the transistor including an oxide semiconductor does not need a laser crystallization step; thus, the resin layer can be thin. Since the resin layer is not required to have high heat resistance and can be thin, the manufacturing cost of a device can be significantly reduced. An oxide semiconductor is preferably used, in which case the steps can be simplified as compared with the case where LTPS is used.

As described above, an oxide conductive layer is preferably formed as the conductive layer.

For example, the conductive layer and an electrode or an oxide semiconductor of the transistor can be formed with the same material at the same step.

For example, conductive materials such as a metal, an alloy, and an oxide conductive layer used for an electrode of a transistor can be used for the conductive layer.

For example, the conductive layer and the oxide conductive layer that is used for a source electrode and a drain electrode of the transistor are formed with the same material at the same step.

Alternatively, for example, an oxide semiconductor layer used as the conductive layer and an oxide semiconductor layer used as the semiconductor layer of the transistor are formed with the same material in the same step. After that, the resistance of only the oxide semiconductor layer used as the conductive layer is reduced (it can also be said that an oxide conductive layer is formed).

Alternatively, for example, an oxide semiconductor layer used as the conductive layer and an oxide semiconductor layer used as the electrode (e.g., a gate electrode) of the transistor are formed with the same material in the same step. After that, the resistance of the oxide semiconductor layer used as the conductive layer and the resistance of the oxide semiconductor layer used as the electrode of the transistor are reduced.

The oxide semiconductor is a semiconductor material whose resistance can be controlled by oxygen vacancies in the film of the semiconductor material and/or the concentration of impurities (typically, hydrogen, water, or the like) in the film of the semiconductor material. Thus, the resistivity of the oxide semiconductor layer or the oxide conductive layer can be controlled by selecting treatment for increasing oxygen vacancies and/or impurity concentration in the oxide semiconductor layer or treatment for reducing oxygen vacancies and/or impurity concentration in the oxide semiconductor layer.

Specifically, the resistivity of the oxide semiconductor can be controlled by plasma treatment. For example, plasma treatment using a gas containing one or more kinds selected from a rare gas (He, Ne, Ar, Kr, or Xe), hydrogen, boron, phosphorus, and nitrogen can be employed. For example, plasma treatment can be performed in an Ar atmosphere, a mixed gas atmosphere of Ar and nitrogen, a mixed gas atmosphere of Ar and hydrogen, an ammonia atmosphere, a mixed gas atmosphere of Ar and ammonia, or a nitrogen atmosphere. Thus, the oxide semiconductor layer can have a high carrier density and a low resistivity.

Hydrogen, boron, phosphorus, or nitrogen is injected into the oxide semiconductor layer by an ion implantation method, an ion doping method, a plasma immersion ion implantation method, or the like, so that the resistivity of the oxide semiconductor layer can be reduced.

Alternatively, a method in which a film containing hydrogen and/or nitrogen is formed in contact with the oxide semiconductor layer and hydrogen and/or nitrogen are/is diffused from the film into the oxide semiconductor layer can be employed. Thus, the oxide semiconductor layer can have a high carrier density and a low resistivity.

Hydrogen contained in the oxide semiconductor layer reacts with oxygen bonded to a metal atom to be water, and also causes oxygen vacancies in a lattice from which oxygen is released (or a portion from which oxygen is released). Entry of hydrogen into the oxygen vacancies generates an electron serving as a carrier in some cases. Furthermore, in some cases, bonding of part of hydrogen to oxygen bonded to a metal atom causes generation of an electron serving as a carrier. Thus, the oxide semiconductor layer can have a high carrier density and a low resistivity.

In the case where heat treatment is performed in the manufacturing process of the display device, oxygen is released from the oxide semiconductor layer by heating the oxide semiconductor layer, so that oxygen vacancies might be increased. Thus, the resistivity of the oxide semiconductor layer can be reduced.

Note that such an oxide conductor layer formed using an oxide semiconductor layer can be referred to as an oxide semiconductor layer having a high carrier density and a low resistivity, an oxide semiconductor layer having conductivity, or an oxide semiconductor layer having high conductivity.

The resin layer in the display device of one embodiment of the present invention has a thickness of greater than or equal to 0.1 μm and less than or equal to 3 μm. By forming the resin layer thin, the display device can be manufactured at low cost. The display device can be light-weight and thin. The display device can have higher flexibility.

According to one embodiment of the present invention, a transistor or the like is formed at a temperature of lower than or equal to the allowable temperature limit of the resin layer. The heat resistance of the resin layer can be measured by, for example, a weight loss percentage due to heat, specifically, the 5% weight loss temperature. According to one embodiment of the present invention, the 5% weight loss temperature of the resin layer can be lower than or equal to 450° C., lower than or equal to 400° C., lower than 400° C., or lower than 350° C.

According to one embodiment of the present invention, irradiation with a linear laser beam is performed. A laser apparatus used in a manufacturing line for LTPS or the like can be effectively used. A linear laser beam is condensed in a long rectangular shape (is shaped into a linear laser beam) so that the resin layer is irradiated with light.

A method for manufacturing a display device of one embodiment of the present invention will be described in detail below.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used.

As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed, exposed to light, and developed to be processed into a desired shape.

In the case of using light in a lithography method, as light used for exposure, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

Manufacturing Method Example 1A

First, a first layer 24 is formed with a photosensitive material over a formation substrate 14 (FIG. 1A).

In particular, a photosensitive and thermosetting material is preferably used. In this embodiment, an example of using a photosensitive and thermosetting material is shown.

In one embodiment of the present invention, a photosensitive material is used for the first layer 24 and part of the first layer 24 is removed by lithography using light, whereby a resin layer 23 with a desired shape can be formed.

Figure 1B:
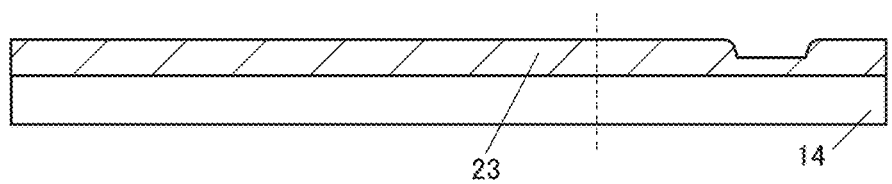

Specifically, heat treatment (also referred to as pre-baking treatment) for removing a solvent is performed after deposition of a material, and then light exposure is performed using a photomask. Next, development is performed, whereby an unnecessary portion can be removed. Then, the film processed into a desired shape is heated (also referred to as post-baking) to form the resin layer 23 (FIG. 1B). FIG. 1B illustrates an example in which the resin layer 23 has a first region and a second region (also referred to as a depressed portion) that is thinner than the first region. The light exposure is reduced as compared with that in conditions for forming an opening in the resin layer 23, whereby the resin layer 23 having a depressed portion can be formed. For example, as a method for reducing the amount of light exposure, light exposure may be performed for a short period of time, intensity of the light may be reduced, or a focus of the light may be changed, as compared with the light exposure conditions for forming an opening in the resin layer 23.

By post-baking, released gas components (e.g., hydrogen and/or water) in the resin layer 23 can be reduced. It is particularly preferable that heating be performed at a temperature higher than or equal to the formation temperature of each layer formed over the resin layer 23. For example, in the case where the formation temperature of the transistor is below 350° C., the film to be the resin layer 23 is preferably heated at a temperature higher than or equal to 350° C. and lower than or equal to 450° C., more preferably higher than or equal to 350° C. and lower than or equal to 400° C., and more preferably higher than or equal to 350° C. and lower than 375° C. Thus, a gas released from the resin layer 23 in the manufacturing process of the transistor can be significantly reduced.

The resin layer 23 has flexibility. The formation substrate 14 has lower flexibility than the resin layer 23.

When the depressed portion of the resin layer 23 has a tapered shape, the coverage with a film formed over the depressed portion of the resin layer 23 is improved; therefore, the resin layer 23 (or the first layer 24) is preferably formed with a positive-type resin.

The resin layer 23 (or the first layer 24) is preferably formed using a photosensitive polyimide resin (also referred to as a PSPI).

Examples of photosensitive materials which can be used to form the resin layer 23 (or the first layer 24) include an acrylic resin, an epoxy resin, a polyamide resin, a polyimide-amide resin, a siloxane resin, a benzocyclobutene-based resin, and a phenol resin.

The resin layer 23 (or the first layer 24) is preferably formed with a spin coater. By a spin coating method, a thin film can be uniformly formed over a large-sized substrate.

The resin layer 23 (or the first layer 24) is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. As the viscosity of the solution is lower, application is performed more easily. As the viscosity of the solution is lower, inclusion of air bubbles can be reduced more; thus, a high-quality film can be formed.

The resin layer 23 preferably has a thickness of greater than or equal to 0.01 μm and less than 10 μm, more preferably greater than or equal to 0.1 μm and less than or equal to 5 μm, more preferably greater than or equal to 0.1 μm and less than or equal to 3 μm, more preferably greater than or equal to 0.5 μm and less than or equal to 1 μm. With a solution having low viscosity, the resin layer 23 having a small thickness can be easily formed. When the resin layer 23 has a thickness in the above range, the display device can have higher flexibility. However, the thickness of the resin layer 23 is not limited to the above range, and may be greater than or equal to 10 μm. For example, the resin layer 23 may have a thickness of greater than or equal to 10 μm and less than or equal to 200 μm. The resin layer 23 preferably has a thickness of greater than or equal to 10 μm because the rigidity of the display device can be increased.

The resin layer 23 (or the first layer 24) can be formed by dip coating, spray coating, ink jetting, dispensing, screen printing, or offset printing, with a doctor knife, a slit coater, a roll coater, a curtain coater, or a knife coater.

The resin layer 23 preferably has a thermal expansion coefficient of greater than or equal to 0.1 ppm/° C. and less than or equal to 20 ppm/° C., further preferably greater than or equal to 0.1 ppm/° C. and less than or equal to 10 ppm/° C. As the resin layer 23 has a lower thermal expansion coefficient, generation of a crack in a layer included in a transistor or the like and breakage of a transistor or the like which are caused owing to the heat treatment can be further prevented.

In the case where the resin layer 23 is positioned on the display surface side of the display device, the resin layer 23 preferably has a high visible-light transmitting property.

The formation substrate 14 has stiffness high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

Figure 1C:
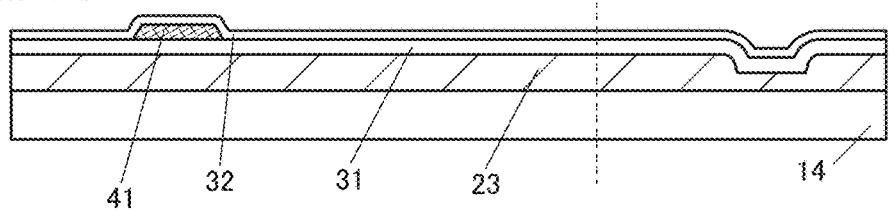

Next, the insulating layer 31 is formed over the resin layer 23 (FIG. 1C).

The insulating layer 31 is formed at a temperature lower than or equal to the allowable temperature limit of the resin layer 23. The insulating layer 31 is preferably formed at a temperature the same as or lower than heating temperature in the above-described post-baking.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, a yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film.

Note that in this specification and the like, "silicon oxynitride" refers to a material that contains more oxygen than nitrogen, and "silicon nitride oxide" refers to a material that contains more nitrogen than oxygen.

An inorganic insulating film is preferably formed at high temperatures because the film can have higher density and barrier property as the deposition temperature becomes higher.

The substrate temperature during the deposition of the insulating layer 31 is preferably higher than or equal to room temperature (25° C.) and lower than or equal to 350° C. and further preferably higher than or equal to 100° C. and lower than or equal to 300° C.

Figure 1D:
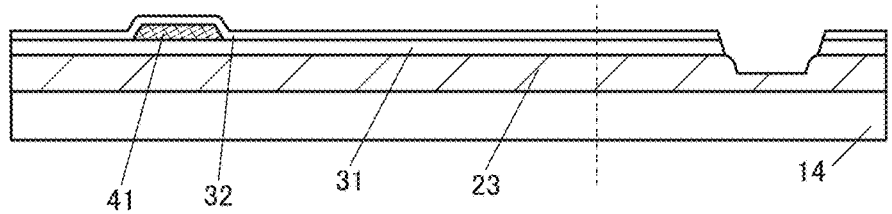
Figure 1E:
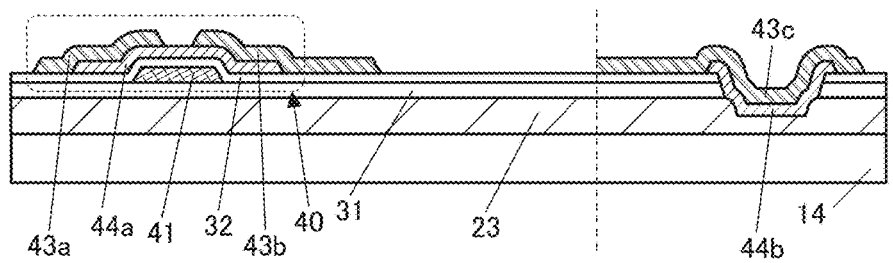

Next, a transistor 40 is formed over the insulating layer 31 (FIGS. 1C to 1E).

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

Here, the case where a bottom-gate transistor including an oxide semiconductor layer 44a is formed as the transistor 40 is shown.

In one embodiment of the present invention, an oxide semiconductor is used as a semiconductor of a transistor. A semiconductor material having a wider bandgap and a lower carrier density than silicon is preferably used because an off-state current of the transistor can be reduced.

The transistor 40 is formed at a temperature lower than or equal to the allowable temperature limit of the resin layer 23. In addition, the transistor 40 is preferably formed at a temperature lower than or equal to the heating temperature in the above-described post-baking.

Specifically, first, a conductive layer 41 is formed over the insulating layer 31 (FIG. 1C). The conductive layer 41 can be formed in the following manner: a conductive film is formed, a resist mask is formed, the conductive film is etched, and the resist mask is removed.

The substrate temperature during the deposition of the conductive film is preferably higher than or equal to room temperature and lower than or equal to 350° C. and further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or indium tin oxide containing silicon may be used. Alternatively, a semiconductor such as an oxide semiconductor or polycrystalline silicon whose resistance is lowered by containing an impurity element, for example, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed (FIG. 1C). For the insulating layer 32, the description of the inorganic insulating film that can be used for the insulating layer 31 can be referred to.

Next, an opening of the insulating layer 31 and an opening of the insulating layer 32 are provided in a region overlapping with the depressed portion of the resin layer 23 (FIG. 1D). Here, an example in which the openings of the insulating layer 31 and the insulating layer 32 are formed at a time is shown. The opening of the insulating layer 31 and the opening of the insulating layer 32 may be formed in separate steps. For example, the opening of the insulating layer 31 may be formed before the conductive layer 41 is formed. By formation of the opening, the bottom surface of the depressed portion of the resin layer 23 is exposed.

Next, the oxide semiconductor layer 44a and an oxide conductive layer 44b are formed (FIG. 1E). The oxide semiconductor layers 44a and 44b can be formed in the following manner: an oxide semiconductor film is formed, a resist mask is formed, the oxide semiconductor film is etched, and the resist mask is removed. At this time, the oxide conductive layer 44b may be a semiconductor, and a process for reducing the resistance of the oxide conductive layer 44b is preferably performed later.

The oxide conductive layer 44b is in contact with a side surface and the bottom surface of the depressed portion of the resin layer 23.

The substrate temperature during the deposition of the oxide semiconductor film is preferably lower than or equal to 350° C., more preferably higher than or equal to room temperature and lower than or equal to 200° C., and more preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the time of forming the oxide semiconductor film. To fabricate a transistor having high field-effect mobility, however, the percentage of oxygen flow rate (partial pressure of oxygen) at the time of forming the oxide semiconductor film is preferably higher than or equal to 0% and lower than or equal to 30%, more preferably higher than or equal to 5% and lower than or equal to 30%, and more preferably higher than or equal to 7% and lower than or equal to 15%.

The oxide semiconductor film preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained. The oxide semiconductor film preferably includes, for example, a film represented by an In-M-Zn-based oxide that contains at least indium, zinc, and M (aluminum, gallium, yttrium, tin, boron, silicon, titanium, iron, nickel, germanium, zirconium, molybdenum, lanthanum, cerium, neodymium, hafnium, tantalum, tungsten, or magnesium). In particular, an In-M-Zn-based oxide layer (M is Al, Ga, Y, or Sn) is preferably used, and an In—Ga—Zn-based oxide layer is more preferably used.

Note that here, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

The oxide semiconductor layer 44a and the oxide conductive layer 44b are formed with the same material in the same step, in which case the manufacturing cost can be reduced. Note that even when the oxide semiconductor layer 44a and the oxide conductive layer 44b have the same metal elements, their compositions are different in some cases. For example, a metal element in a film is released during the manufacturing process of a transistor and a capacitor, which might result in different metal compositions.

The energy gap of the oxide semiconductor is preferably 2 eV or more, further preferably 2.5 eV or more, and still further preferably 3 eV or more. The use of such an oxide semiconductor having a wide energy gap leads to a reduction in off-state current of a transistor.

In the case where the oxide semiconductor is an In-M-Zn-based oxide, it is preferable that the atomic ratio of metal elements of a sputtering target used to form a film of the In-M-Zn-base oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M: Zn=5:1:6, In:M:Zn=5:1:7, or In:M:Zn=5:1:8. Note that the atomic ratio of metal elements in the formed semiconductor layer varies from the above atomic ratios of metal elements of the sputtering targets in a range of ±40%.

The oxide semiconductor film can be formed by a sputtering method. Alternatively, a PLD method, a PECVD method, a thermal CVD method, an ALD method, a vacuum evaporation method, or the like may be used.

For example, the thickness of the oxide conductive layer 44b is preferably greater than or equal to 1 nm and less than or equal to 200 nm, more preferably greater than or equal to 5 nm and less than or equal to 100 nm.

After the oxide semiconductor is formed, plasma treatment or the like is performed to reduce the resistivity of the oxide semiconductor; thus, the oxide conductive layer 44b can be formed.

Note that by performing heat treatment in the following step, oxygen is released from the oxide conductive layer 44b and oxygen vacancies are generated, which decreases the resistivity of the oxide conductive layer 44b in some cases.

Next, a conductive layer 43a, a conductive layer 43b, and a conductive layer 43c are formed (FIG. 1E). The conductive layers 43a, 43b, and 43c can be formed in the following manner: a conductive film is formed, a resist mask is formed, the conductive film is etched, and the resist mask is removed. Each of the conductive layers 43a and 43b is connected to the oxide semiconductor layer 44a. The conductive layer 43c is connected to the oxide conductive layer 44b. The conductive layer 43c can be used as an auxiliary electrode (also referred to as an auxiliary wiring) of the oxide conductive layer 44b.

In the formation of the conductive layer 43c, at least one of hydrogen and nitrogen is supplied to the oxide conductive layer 44b, which decreases the resistivity of the oxide conductive layer 44b in some cases. Oxygen in the oxide conductive layer 44b is extracted by the conductive layer 43c, which decreases the resistivity of the oxide conductive layer 44b in some cases. A constituent element of the conductive layer 43c enters the oxide conductive layer 44b, which decreases the resistivity of the oxide conductive layer 44b in some cases. Similarly, the resistivity of portions of the oxide semiconductor layer 44a in contact with the conductive layer 43a and the conductive layer 43b is decreased in some cases by extraction of oxygen, entry of a constituent element of the conductive layer, or the like.

Note that during the processing of the conductive layers 43a and 43b, the oxide semiconductor layer 44a in a region not covered by the resist mask might be partly thinned by etching.

The substrate temperature during the deposition of the conductive film is preferably higher than or equal to room temperature and lower than or equal to 350° C. and further preferably higher than or equal to room temperature and lower than or equal to 300° C.

In the above manner, the transistor 40 can be formed (FIG. 1E). In the transistor 40, part of the conductive layer 41 functions as a gate, part of the insulating layer 32 functions as a gate insulating layer, and the conductive layers 43a and 43b function as a source and a drain.

Figure 2A:
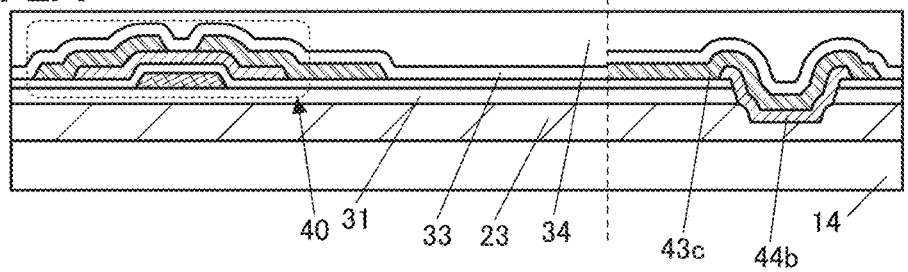
FIGS. 2A to 2D illustrate an example of a method for manufacturing a display device.

Next, an insulating layer 33 that covers the transistor 40 is formed (FIG. 2A). The insulating layer 33 can be formed in a manner similar to that of the insulating layer 31.

An oxide insulating film formed in an atmosphere containing oxygen, such as a silicon oxide film or a silicon oxynitride film, is preferably used as the insulating layer 33. An insulating film with low oxygen diffusibility and oxygen permeability, such as a silicon nitride film, is preferably stacked over the silicon oxide film or the silicon oxynitride film. The oxide insulating film formed in an atmosphere containing oxygen can easily release a large amount of oxygen by heating. By heating a stack including the oxide insulating film that releases oxygen and the insulating film with low oxygen diffusibility and oxygen permeability, oxygen can be supplied to the oxide semiconductor layer 44a. As a result, oxygen vacancies in the oxide semiconductor layer 44a can be filled and defects at the interface between the oxide semiconductor layer 44a and the insulating layer 33 can be repaired, leading to a reduction in defect levels. Accordingly, an extremely highly reliable display device can be fabricated. It is preferable that the oxide conductive layer 44b not be in contact with the insulating layer 33. This structure can suppress supply of oxygen to the oxide conductive layer 44b and accordingly suppress an increase in the resistivity of the oxide conductive layer 44b. In FIG. 2A, the oxide conductive layer 44b is covered with the conductive layer 43c; thus, the resistivity of the oxide conductive layer 44b can be kept low.

Through the above steps, the insulating layer 31, the transistor 40, the oxide conductive layer 44b, the conductive layer 43c, and the insulating layer 33 can be formed over the resin layer 23 (FIG. 2A).

If the formation substrate 14 and the transistor 40 are separated from each other at this stage by a method described later, a flexible device including no display element can be fabricated. Forming the transistor 40 or forming a capacitor, a resistor, a wiring, and the like in addition to the transistor 40, and separating the formation substrate 14 and the transistor 40 from each other by the method described later can provide a semiconductor device, for example.

Then, an insulating layer 34 is formed over the insulating layer 33 (FIG. 2A). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the allowable temperature limit of the resin layer 23. The insulating layer 34 is preferably formed at a temperature lower than or equal to the heating temperature in the above-described post-baking.

In the case of using an organic insulating film for the insulating layer 34, a temperature applied to the resin layer 23 at the formation of the insulating layer 34 is preferably higher than or equal to room temperature and lower than or equal to 350° C. and further preferably higher than or equal to room temperature and lower than or equal to 300° C.

In the case of using an inorganic insulating film for the insulating layer 34, the substrate temperature during the deposition is preferably higher than or equal to room temperature and lower than or equal to 350° C. and further preferably higher than or equal to 100° C. and lower than or equal to 300° C.

Next, an opening that reaches the conductive layer 43b is formed in the insulating layer 34 and the insulating layer 33.

Figure 2B:
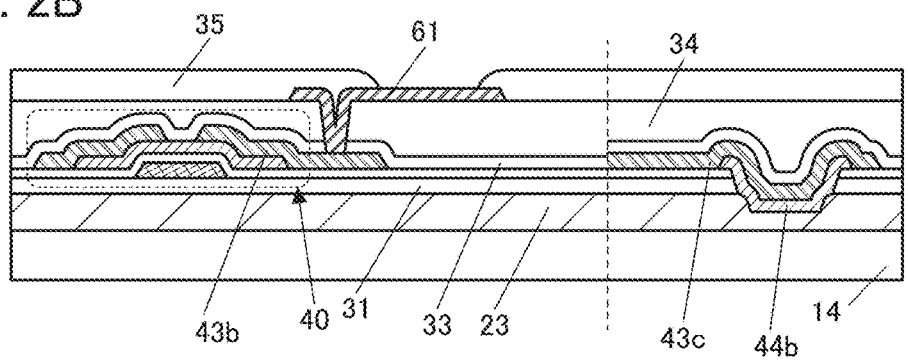

After that, a conductive layer 61 is formed (FIG. 2B). Part of the conductive layer 61 functions as a pixel electrode of a display element 60. The conductive layer 61 can be formed in the following manner: a conductive film is formed, a resist mask is formed, the conductive film is etched, and the resist mask is removed.

The conductive layer 61 is formed at a temperature lower than or equal to the allowable temperature limit of the resin layer 23. The conductive layer 61 is preferably formed at a temperature lower than or equal to the heating temperature in the above-described post-baking.

The substrate temperature during the deposition of the conductive film is preferably higher than or equal to room temperature and lower than or equal to 350° C. and further preferably higher than or equal to room temperature and lower than or equal to 300° C.

Subsequently, an insulating layer 35 that covers an end portion of the conductive layer 61 is formed (FIG. 2B). For the insulating layer 35, the description of the organic insulating film or the inorganic insulating film that can be used for the insulating layer 31 can be referred to.

The insulating layer 35 is formed at a temperature lower than or equal to the allowable temperature limit of the resin layer 23. The insulating layer 35 is preferably formed at a temperature lower than or equal to the heating temperature in the above-described post-baking.

In the case of using an organic insulating film for the insulating layer 35, a temperature applied to the resin layer 23 at the formation of the insulating layer 35 is preferably higher than or equal to room temperature and lower than or equal to 350° C. and further preferably higher than or equal to room temperature and lower than or equal to 300° C.

In the case of using an inorganic insulating film for the insulating layer 35, the substrate temperature during the deposition is preferably higher than or equal to room temperature and lower than or equal to 350° C. and further preferably higher than or equal to 100° C. and lower than or equal to 300° C.

Figure 2C:
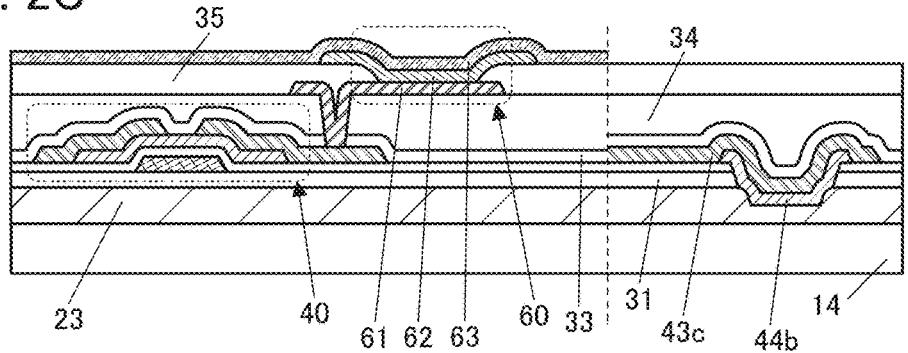

Then, an EL layer 62 and a conductive layer 63 are formed (FIG. 2C). Part of the conductive layer 63 functions as a common electrode of the display element 60.

The EL layer 62 can be formed by an evaporation method, a coating method, a printing method, a discharge method, or the like. In the case where the EL layer 62 is formed for each individual pixel, an evaporation method using a blocking mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The conductive layer 63 is formed at a temperature lower than or equal to the allowable temperature limits of the resin layer 23 and the EL layer 62. The conductive layer 63 is preferably formed at a temperature lower than or equal to the heating temperature in the above-described post-baking.

In the above manner, the display element 60 can be obtained (FIG. 2C). In the display element 60, the conductive layer 61 part of which functions as a pixel electrode, the EL layer 62, and the conductive layer 63 part of which functions as a common electrode are stacked.

Although a top-emission light-emitting element is formed as the display element 60 here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 2D:
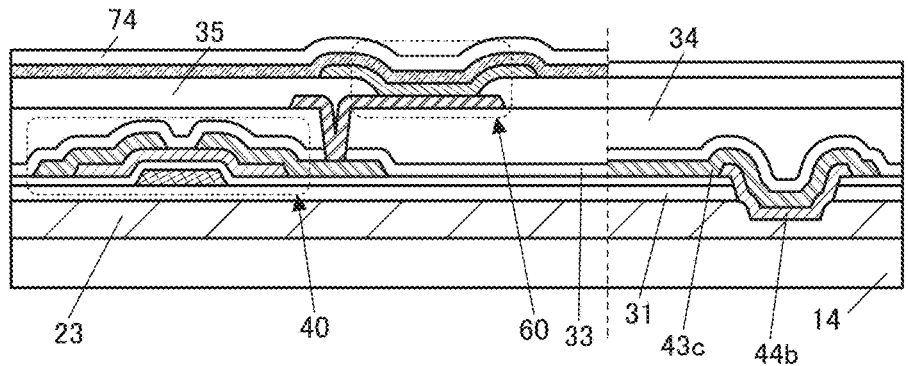

Next, an insulating layer 74 is formed so as to cover the conductive layer 63 (FIG. 2D). The insulating layer 74 functions as a protective layer that suppresses diffusion of impurities such as water into the display element 60. The display element 60 is sealed with the insulating layer 74.

The insulating layer 74 is formed at a temperature lower than or equal to the allowable temperature limit of the resin layer 23 and lower than or equal to the allowable temperature limit of the display element 60. The insulating layer 74 is preferably formed at a temperature lower than or equal to the heating temperature in the above-described post-baking.

The insulating layer 74 preferably includes an inorganic insulating film with a high barrier property that can be used for the insulating layer 31. A stack including an inorganic insulating film and an organic insulating film can also be used.

Figure 3A:
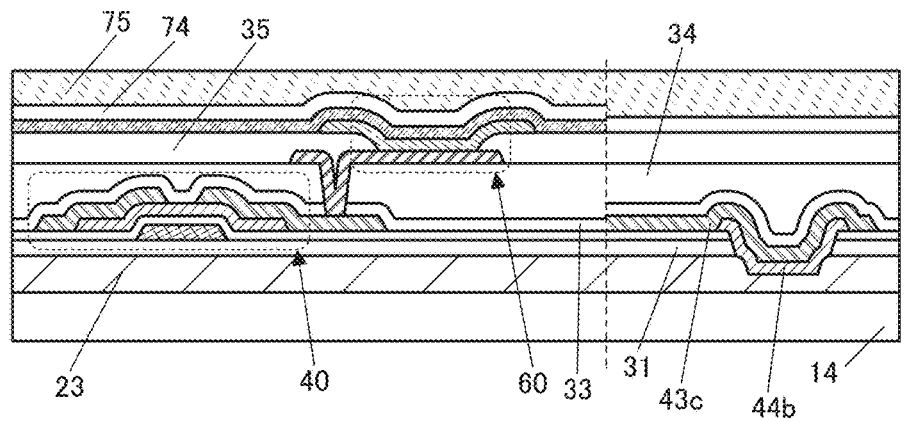
FIGS. 3A and 3B illustrate an example of a method for manufacturing a display device.

Then, a protective layer 75 is formed over the insulating layer 74 (FIG. 3A). The protective layer 75 can be used as a layer positioned on the outermost surface of a display device. The protective layer 75 preferably has a high visible-light transmitting property.

The above-described organic insulating film that can be used for the insulating layer 31 is preferably used for the protective layer 75 because damage or crack of the surface of the display device can be suppressed.

Figure 3B:
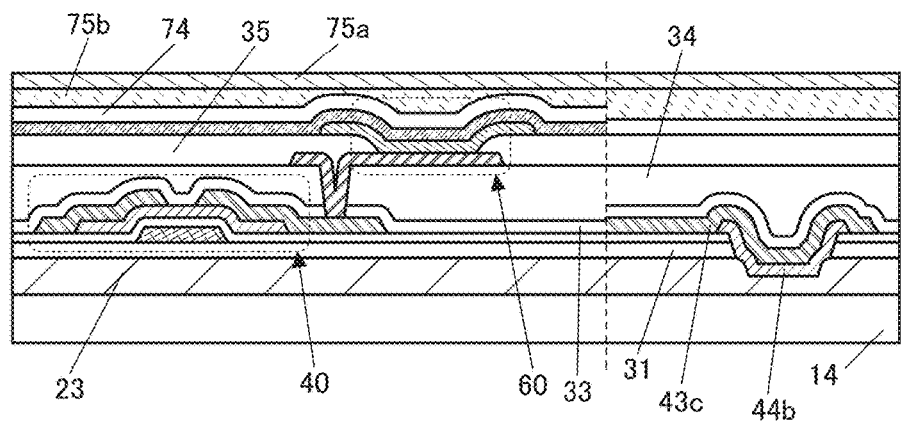

FIG. 3B illustrates an example in which a substrate 75a is attached to the insulating layer 74 with an adhesive layer 75b.

As the adhesive layer 75b, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 75a formed using any of a variety of materials such as glass, quartz, a resin, a metal, an alloy, and a semiconductor may be thin enough to be flexible.

Figure 4A:
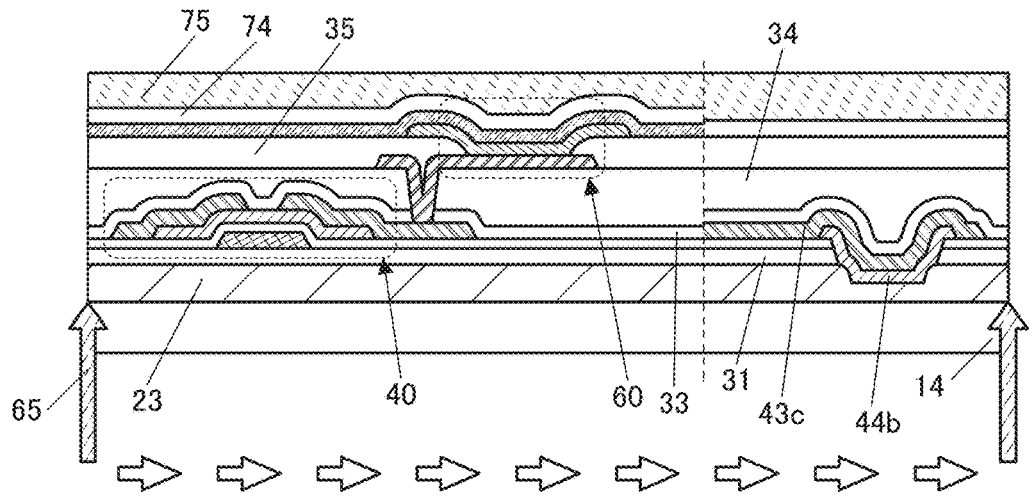
FIGS. 4A and 4B illustrate an example of a method for manufacturing a display device.

Next, the resin layer 23 is irradiated with laser light 65 through the formation substrate 14 (FIG. 4A). The laser light 65 is, for example, a linear laser beam with which scanning is performed from the left side to the right side in FIG. 4A, and the major axis is perpendicular to the scanning direction and the incident direction (from bottom to top).

The resin layer 23 absorbs the laser light 65.

With irradiation with the laser light 65, the resin layer 23 is weakened. Alternatively, with irradiation with the laser light 65, the adhesion between the resin layer 23 and the formation substrate 14 is decreased.

As the laser light 65, light having a wavelength by which at least part of the laser light 65 is transmitted through the formation substrate 14 and absorbed by the resin layer 23 is selected. The laser light 65 is preferably light having a wavelength range from visible light to ultraviolet light. For example, light having a wavelength of greater than or equal to 200 nm and less than or equal to 400 nm, preferably greater than or equal to 250 nm and less than or equal to 350 nm, can be used. In particular, an excimer laser having a wavelength of 308 nm is preferably used because the productivity is increased. The excimer laser is preferable because the excimer laser can be used also for laser crystallization of LTPS, so that the existing LTPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running cost can be reduced to approximately 1/3 of the case of an excimer laser. Further alternatively, a pulsed laser such as a picosecond laser may be used.

In the case where linear laser light is used as the laser light 65, the laser light 65 is scanned and a region to be peeled is entirely irradiated with the laser light 65 by relatively moving the formation substrate 14 and a light source.

Figure 4B:
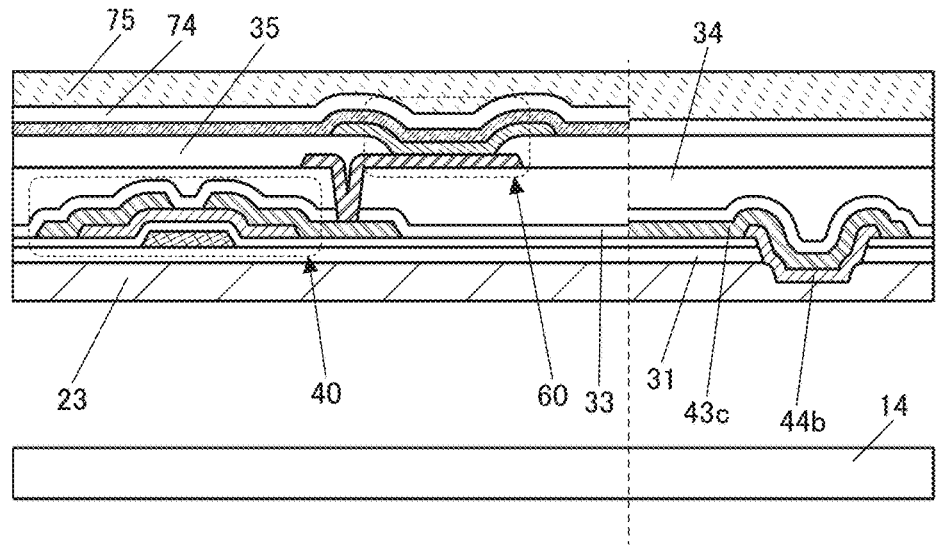

Next, the formation substrate 14 and the transistor 40 are separated from each other (FIG. 4B).

The position of the separation surface may vary depending on materials and the formation methods of the resin layer 23, the formation substrate 14, and the like, conditions of light irradiation, and the like.

FIG. 4B illustrates an example in which separation occurs at the interface between the formation substrate 14 and the resin layer 23. The resin layer 23 is exposed by the separation.

Figure 5A:
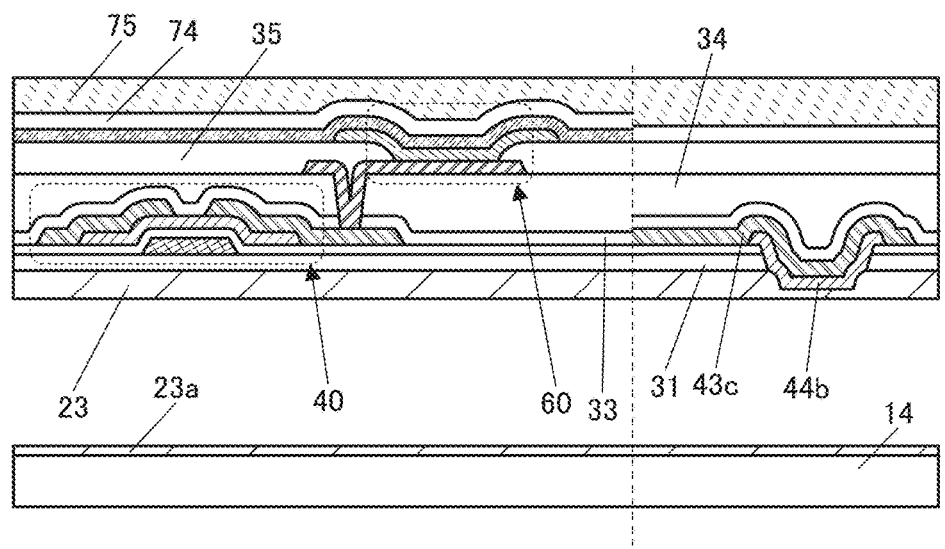
FIGS. 5A and 5B illustrate an example of a method for manufacturing a display device.

FIG. 5A illustrates an example in which separation occurs in the resin layer 23. Part of the resin layer (a resin layer 23a) remains on the formation substrate 14. The resin layer 23 that remains on the insulating layer 31 is thinner than the resin layer 23 illustrated in FIG. 4A.

Figure 5B:
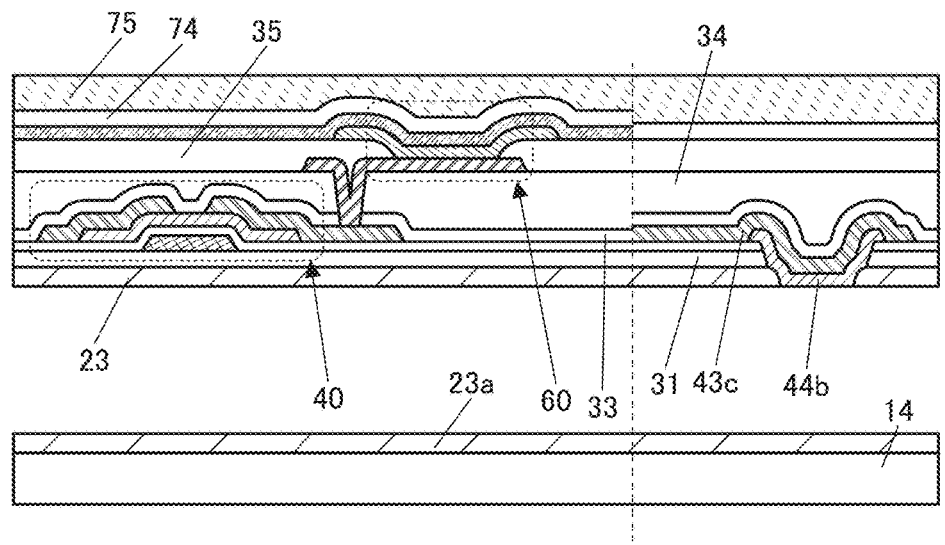

FIG. 5B illustrates an example in which separation occurs in the resin layer 23 and at an interface between the oxide conductive layer 44b and the resin layer 23. Part of the resin layer (the resin layer 23a) remains on the formation substrate 14. The oxide conductive layer 44b is exposed by the separation. The resin layer 23 that remains on the insulating layer 31 side is thinner than the resin layer 23 illustrated in FIG. 4A.

At least part of the resin layer 23 can be peeled from the formation substrate 14 by applying tensile force perpendicular to the resin layer 23, for example. Specifically, at least part of the resin layer 23 can be peeled from the formation substrate 14 by attaching a member with an attachment mechanism to the top surface of the protective layer 75 and pulling up the member.

A separation starting point may be formed by inserting a sharp instrument such as a knife between the formation substrate 14 and the insulating layer 31.

Alternatively, the separation starting point may be formed by making a cut in the resin layer 23 with a sharp instrument from the protective layer 75 side.

Figure 6A:
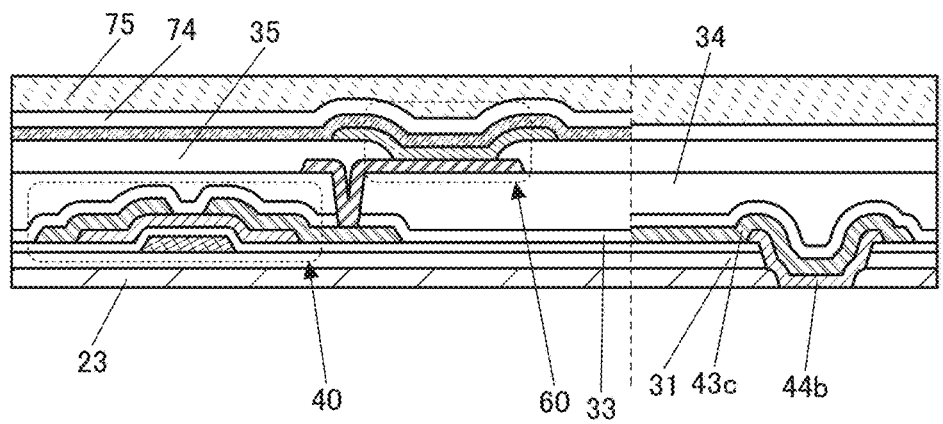
FIGS. 6A and 6B illustrate an example of a method for manufacturing a display device.

In the case where the resin layer 23 remains on the oxide conductive layer 44b and the oxide conductive layer 44b is not exposed as illustrated in FIG. 4B and FIG. 5A, at least part of the resin layer 23 is removed to expose the oxide conductive layer 44b (FIG. 6A).

There is no particular limitation on a method for removing the resin layer 23. For example, a wet etching method or a dry etching method can be used.

In particular, the resin layer 23 is preferably removed by ashing using oxygen plasma. Ashing has advantages such as high controllability, good in-plane uniformity, and high suitability for treatment using a large-sized substrate, for example.

Figure 6B:
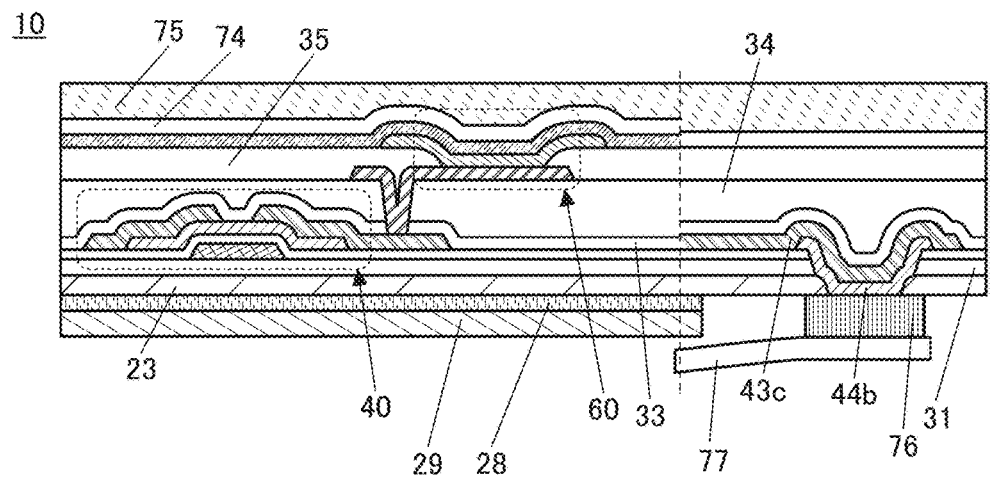

Through the separation of the formation substrate 14 and the transistor 40, the display device 10 can be fabricated (FIG. 6B). The display device 10 can remain being bent or can be bent repeatedly, for example.

As illustrated in FIG. 6B, a substrate 29 may be attached to the surface of the resin layer 23 with an adhesive layer 28. Note that the substrate 29 and the adhesive layer 28 are provided in a position that does not overlap with the exposed oxide conductive layer 44b. The substrate 29 can function as a support substrate of the display device.

The adhesive layer 28 can be formed with a material that can be used for the adhesive layer 75b. The substrate 29 can be formed with a material that can be used for the substrate 75a.

The resin layer 23 is removed such that the oxide conductive layer 44b is exposed and the resin layer 23 remains. The adhesion of the resin layer 23 to the adhesive layer 28 is higher than the adhesion of the resin layer 23 to the insulating layer 31 in some cases. The resin layer 23 can be used as a protective layer.

Then, the oxide conductive layer 44b and an FPC 77 are electrically connected to each other through a connector 76 (FIG. 6B).

As the connector 76, any of various anisotropic conductive films (ACF), anisotropic conductive pastes (ACP), and the like can be used.

Through the above steps, the display device 10 in which an oxide semiconductor is used in a transistor and an EL element is formed by a separate coloring method can be manufactured.

Figure 7A:
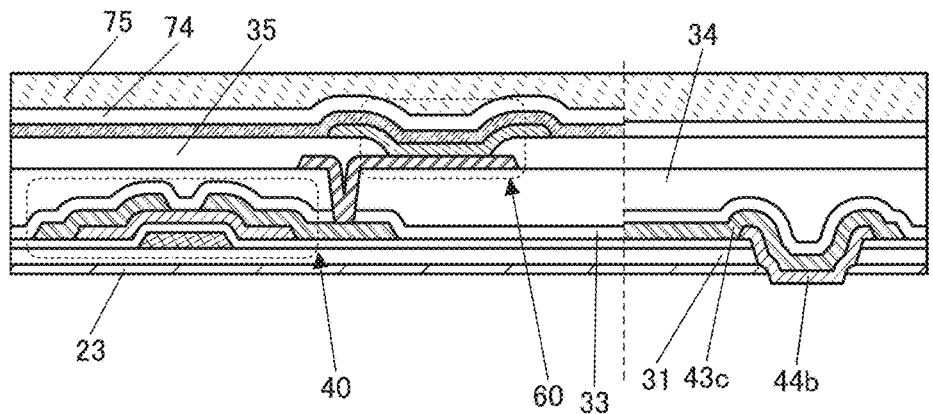
FIGS. 7A to 7C illustrate an example of a method for manufacturing a display device.

Note that as illustrated in FIG. 7A, by removing the resin layer 23, the exposed oxide conductive layer 44b projects in some cases.

Figure 7B:
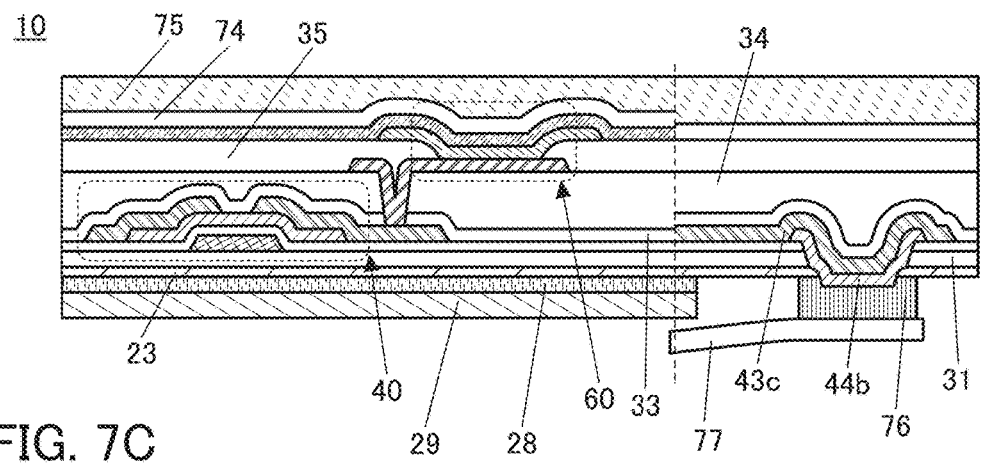

At this time, the connector 76 is preferably provided to cover the projecting oxide conductive layer 44b as illustrated in FIG. 7B, in which case the anchor effect can be obtained. Thus, adhesion between the connector 76 and the oxide conductive layer 44b can be improved.

Figure 7C:
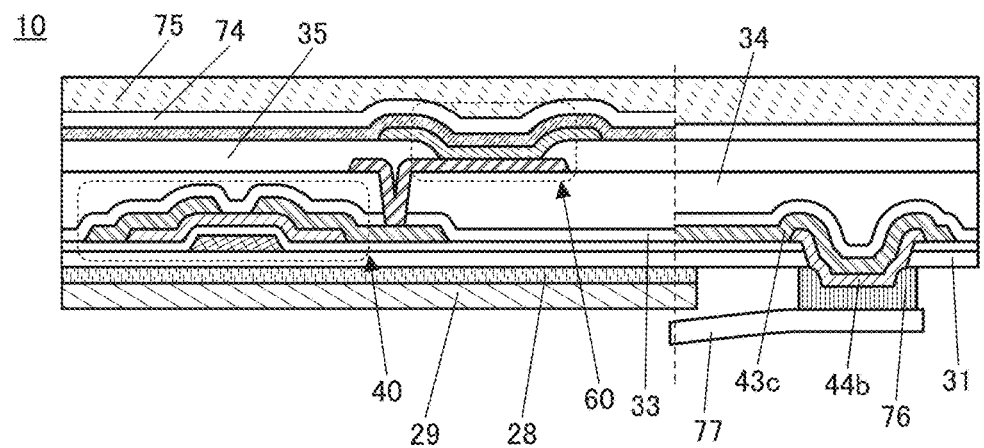

Alternatively, the resin layer 23 may be completely removed (FIG. 7C).

In the manufacturing method example 1A, an example of using a top-emission light-emitting element is described. In the case where an external connection terminal is exposed on the protective layer 75 side and electrically connected to the FPC 77, a display region cannot overlap with the FPC 77 because the protective layer 75 is on the display surface side, and thus a region of the display device that overlaps with the FPC 77 is limited. In contrast, the oxide conductive layer 44b can be easily exposed on the side opposite to the display surface by using one embodiment of the present invention. As described above, in one embodiment of the present invention, an oxide semiconductor layer is formed as the oxide conductive layer 44b. The resistivity of the oxide conductive layer 44b can be sufficiently decreased by performing at least one of a plasma treatment step, a heat treatment step, and a step of forming a layer over the oxide conductive layer 44b. Thus, the oxide conductive layer 44b and the FPC 77 can be surely electrically connected to each other. Such a structure allows the FPC 77 to be positioned on the side opposite to the display surface. Thus, a space for bending the FPC 77 in incorporating the display device in an electronic device can be saved, which enables the electronic device to be smaller.

Manufacturing Method Example 2A

In the following manufacturing method examples, description of components similar to those described in the above manufacturing method example is omitted in some cases.

Figure 8A:
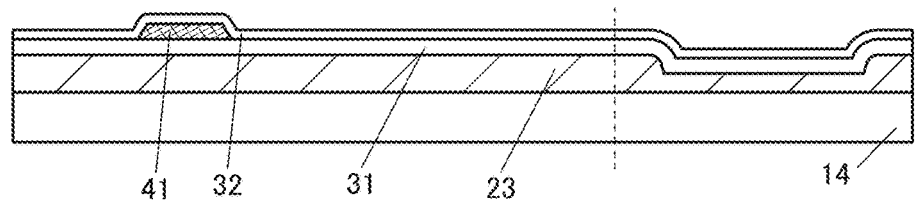
FIGS. 8A to 8D illustrate an example of a method for manufacturing a display device.

First, components from the resin layer 23 to the insulating layer 32 are formed in order over the formation substrate 14 (FIG. 8A) in a manner similar to that in the manufacturing method example 1A.

Figure 8B:
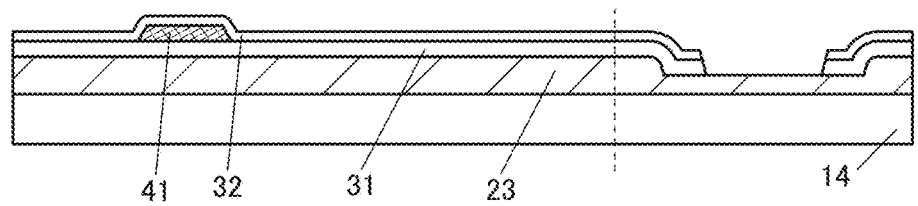

Next, an opening of the insulating layer 31 and an opening of the insulating layer 32 are provided in a region overlapping with the depressed portion of the resin layer 23. The manufacturing method example 1A shows an example in which edge portions of the insulating layer 31 and the insulating layer 32 are positioned outside the depressed portion of the resin layer 23 (FIG. 1D). The manufacturing method example 2A shows an example in which the edge portions of the insulating layer 31 and the insulating layer 32 are positioned inside the depressed portion of the resin layer 23 (FIG. 8B).

A side surface of the depressed portion of the resin layer 23 is covered with at least one of the insulating layer 31 and the insulating layer 32, in which case impurities such as water contained in the resin layer 23 can be prevented from entering the transistor 40 or the like.

Figure 8C:
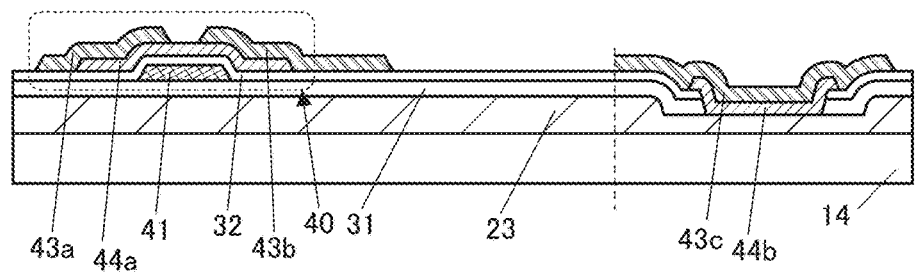

The following steps in the manufacturing method example 2A are similar to the steps in Manufacturing method example 1A. First, the oxide semiconductor layers 44a and 44b are formed, and then the conductive layers 43a, 43b, and 43c are formed (FIG. 8C).

Figure 8D:
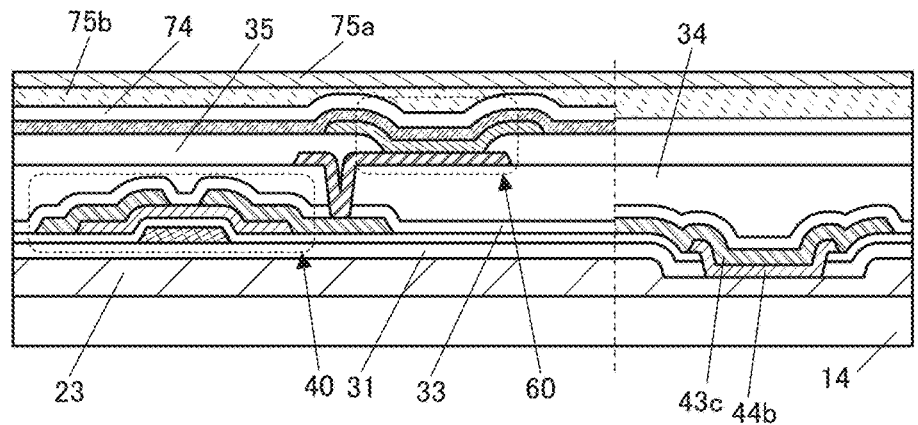

The components from the insulating layer 33 to the substrate 75a are formed in order (FIG. 8D).

Figure 9A:
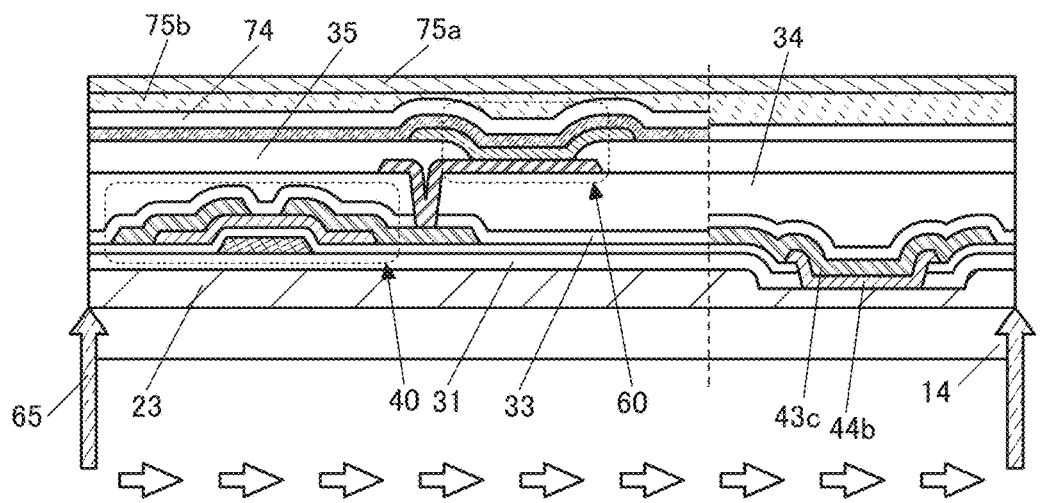
FIGS. 9A and 9B illustrate an example of a method for manufacturing a display device.

Next, the resin layer 23 is irradiated with the laser light 65 through the formation substrate 14 (FIG. 9A).

Figure 9B:
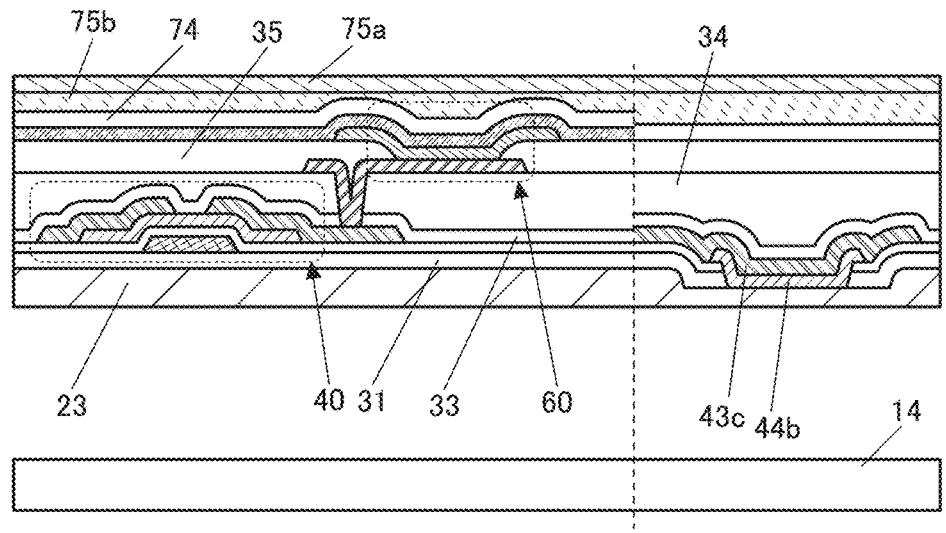

Then, the formation substrate 14 and the transistor 40 are separated (FIG. 9B). FIG. 9B illustrates an example in which separation occurs at the interface between the formation substrate 14 and the resin layer 23. The resin layer 23 is exposed by the separation.

Figure 10A:
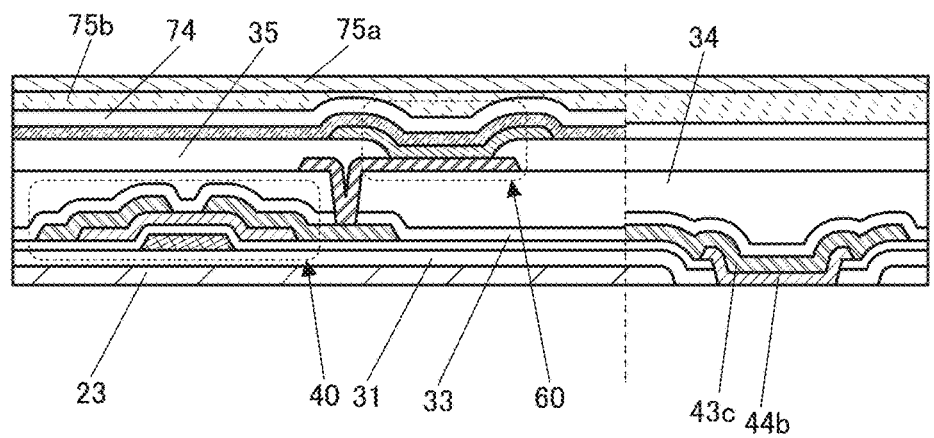
FIGS. 10A and 10B illustrate an example of a method for manufacturing a display device.

Part of the resin layer 23 is removed to expose the oxide conductive layer 44b (FIG. 10A).

The substrate 29 is attached to the resin layer 23 with the adhesive layer 28. The oxide conductive layer 44b and the FPC 77 are electrically connected to each other through the connector 76.

Figure 10B:
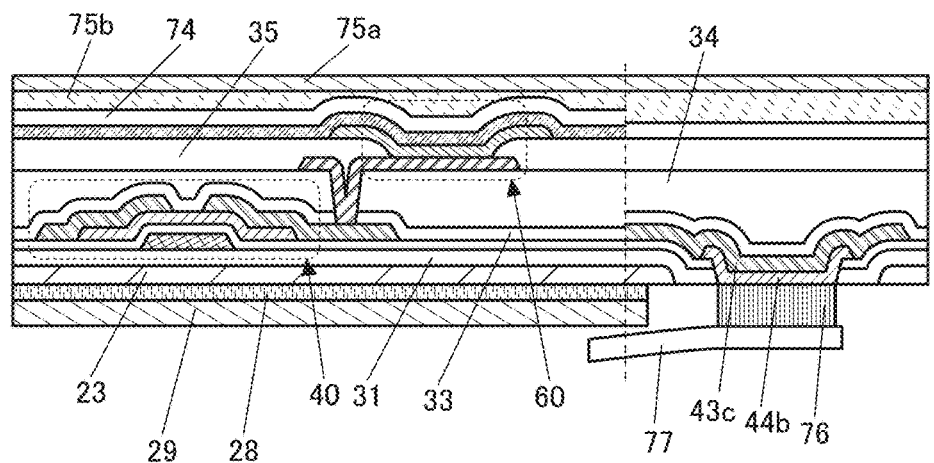

Through the above steps, the display device in which an oxide semiconductor is used in a transistor and an EL element is formed by a separate coloring method can be manufactured (FIG. 10B).

In the display device manufactured according to the manufacturing method example 2A, the insulating layer 31 and the insulating layer 32 are positioned between a side surface of the resin layer 23 and a side surface of the oxide conductive layer 44b. That is, a structure in which the resin layer 23 is not in contact with the oxide conductive layer 44b can be achieved.

Manufacturing Method Example 3A

Figure 11A:
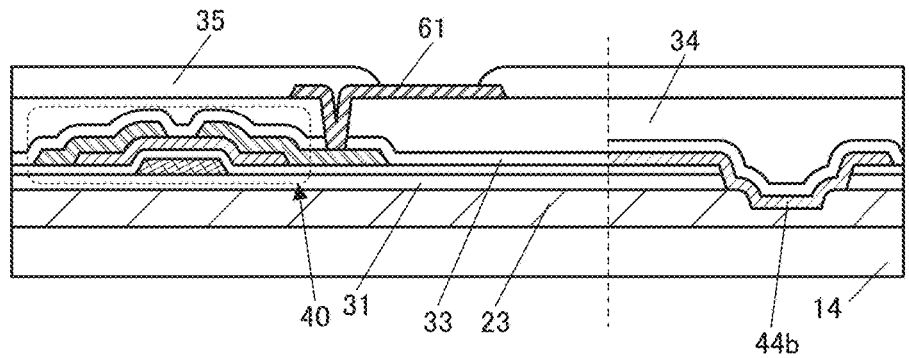
FIGS. 11A to 11C illustrate an example of a method for manufacturing a display device.

First, components from the resin layer 23 to the insulating layer 35 are formed in order over the formation substrate 14 as in Manufacturer method example 1A (FIG. 11A). Note that in the manufacturing method example 3A, an example in which the conductive layer 43c is not provided over the oxide conductive layer 44b is described.

Figure 11B:
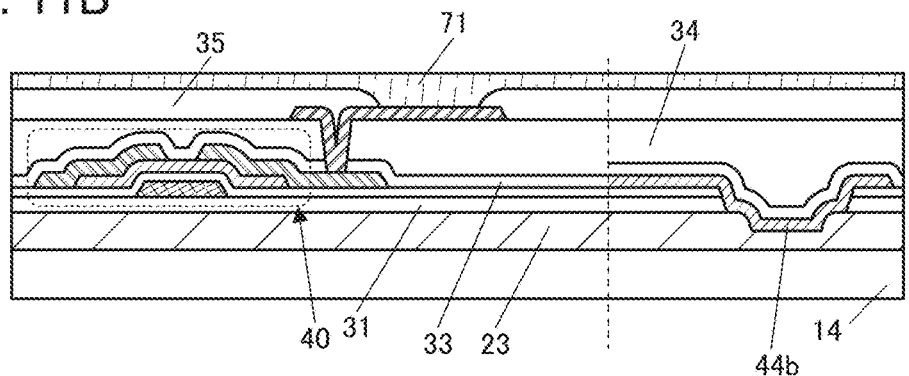

Then, a protective layer 71 is formed as illustrated in FIG. 11B.

The protective layer 71 has a function of protecting surfaces of the insulating layer 35 and the conductive layer 61 in a peeling step. The protective layer 71 can be formed using a material that can be easily removed.

For the protective layer 71 that can be removed, a water-soluble resin can be used, for example. A water-soluble resin is applied to an uneven surface to cover the unevenness, which facilitates the protection of the surface. A stack of a water-soluble resin and an adhesive that can be peeled by light or heat may be used for the protective layer 71 that can be removed.

Alternatively, for the protective layer 71 that can be removed, a base material having a property in which adhesion is strong in a normal state but weakened when irradiated with light or heated may be used. For example, a thermal peeling tape whose adhesion is weakened by heat, a UV-peeling tape whose adhesion is weakened by ultraviolet irradiation, or the like may be used. Alternatively, a weak adhesion tape with weak adhesion in a normal state or the like can be used. Alternatively, optical clear adhesive (OCA), silicone, or the like can be used. Note that the protective layer 71 does not necessarily have a property of transmitting visible light.

Figure 11C:
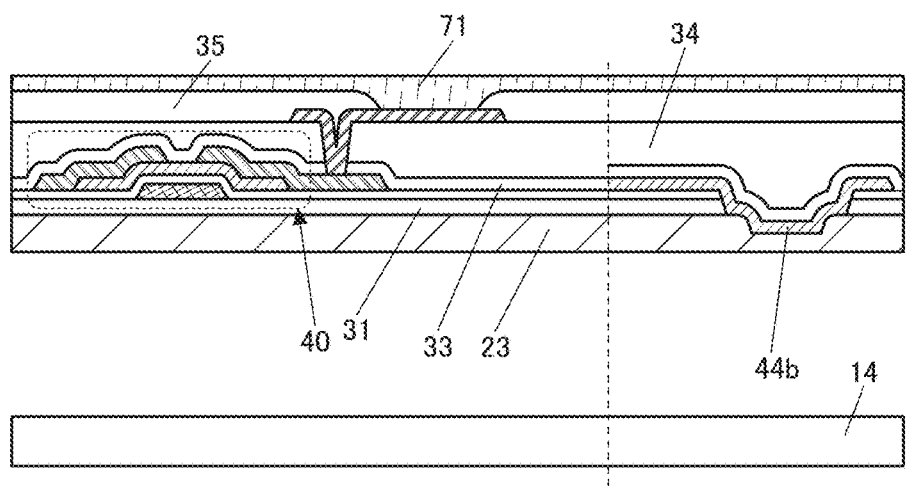

Next, the formation substrate 14 and the transistor 40 are separated from each other in a manner similar to that in the manufacturing method example 1A (FIG. 11C). FIG. 11C illustrates an example in which separation occurs at the interface between the formation substrate 14 and the resin layer 23. The resin layer 23 is exposed by the separation.

After the formation substrate 14 and transistor 40 are separated from each other, the protective layer 71 is removed.

Then, the EL layer 62 and the conductive layer 63 are formed, whereby the display element 60 is obtained. Thus, by sealing the display element 60, the display device 10 can be obtained. For sealing of the display element 60, one or more of the insulating layer 74, the protective layer 75, the substrate 75a, the adhesive layer 75b, and the like can be used.

The EL layer 62 and the conductive layer 63 may be formed while the resin layer 23 is fixed to a stage of a deposition apparatus, but are preferably formed while the resin layer 23 is fixed to a support substrate by a tape or the like and the support substrate is placed on the stage. Fixing the resin layer 23 to the support substrate facilitates the transfer of the stacked-layer structure including the resin layer 23.

In the manufacturing method example 3A, after a layer is peeled from the formation substrate 14, the EL layer 62 and the conductive layer 63 can be formed over the layer. In the case where a region having low adhesion is generated in a stack including the EL layer 62 and the like, the stack is formed after peeling so that a decrease in the yield of peeling can be suppressed. With the use of the manufacturing method example 3A, a material can be selected more freely, leading to fabrication of a highly reliable display device at lower cost.

Manufacturing Method Example 4A

Figure 12A:
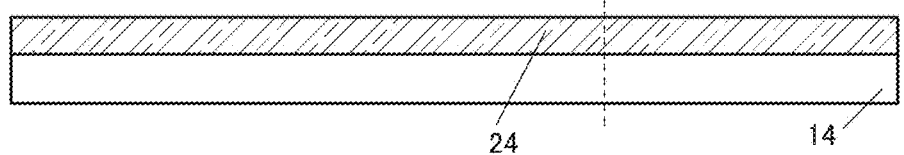
FIGS. 12A to 12E illustrate an example of a method for manufacturing a display device.
Figure 12B:
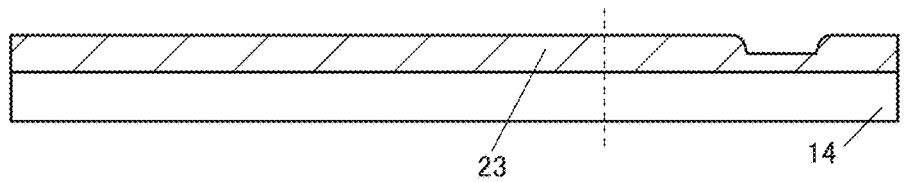

First, the first layer 24 is formed with a photosensitive material over the formation substrate 14 (FIG. 12A). Then, as in the manufacturing method example 1A, the resin layer 23 having a depressed portion is formed by photolithography (FIG. 12B).

Figure 12C:
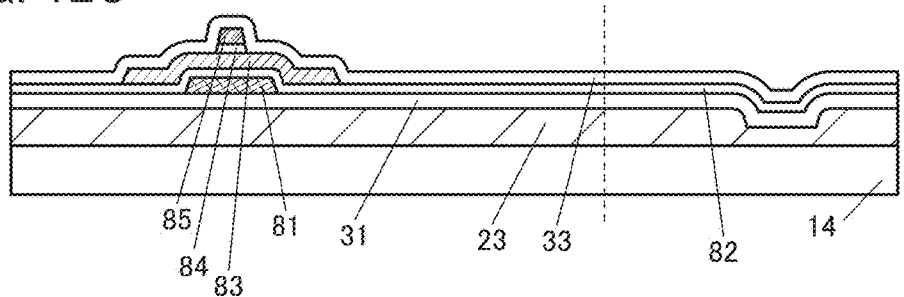

Next, the insulating layer 31 is formed over the resin layer 23 in a manner similar to that in the manufacturing method example 1A (FIG. 12C).

Figure 12D:
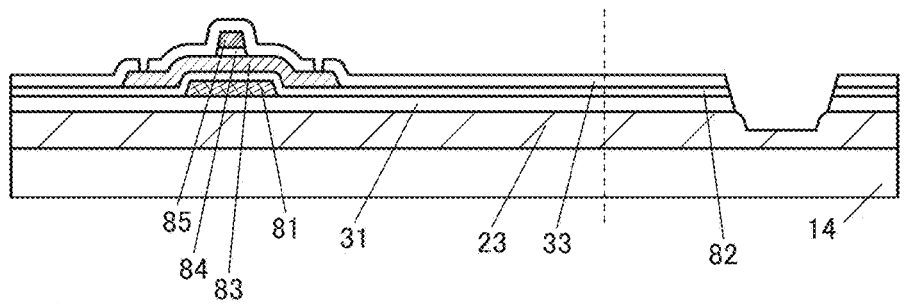
Figure 12E:
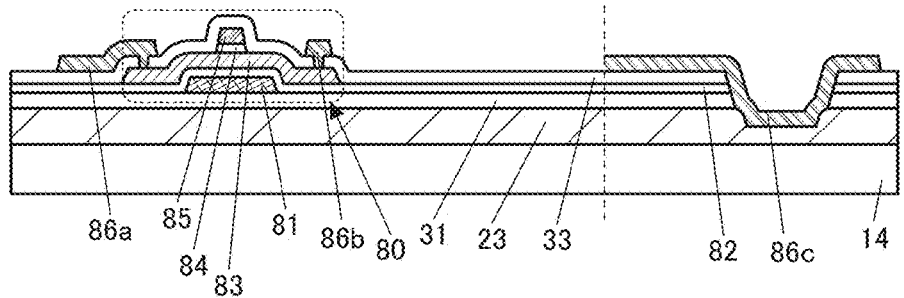

Next, a transistor 80 is formed over the insulating layer 31 (FIGS. 12C to 12E).

Here, the case where a transistor including an oxide semiconductor layer 83 and two gates is formed as the transistor 80 is shown.

The transistor 80 is formed at a temperature lower than or equal to the allowable temperature limit of the resin layer 23. The transistor 80 is preferably formed at a temperature lower than or equal to the heating temperature in the above-described post-baking.

Specifically, first, a conductive layer 81 is formed over the insulating layer 31 (FIG. 12C). The conductive layer 81 can be formed in the following manner: a conductive film is formed, a resist mask is formed, the conductive film is etched, and the resist mask is removed.

Next, an insulating layer 82 is formed (FIG. 12C). For the insulating layer 82, the description of the inorganic insulating film that can be used for the insulating layer 31 can be referred to.

Then, the oxide semiconductor layer 83 is formed (FIG. 12C). The oxide semiconductor layer 83 can be formed in the following manner: an oxide semiconductor film is formed, a resist mask is formed, the oxide semiconductor film is etched, and the resist mask is removed. For the oxide semiconductor layer 83, the description of the material that can be used for the oxide semiconductor layer 44a can be referred to.

Then, an insulating layer 84 and a conductive layer 85 are formed (FIG. 12C). For the insulating layer 84, the description of the inorganic insulating film that can be used for the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the oxide semiconductor layer 83, the insulating layer 84, and the conductive layer 85 is formed (FIG. 12C). The insulating layer 33 can be formed in a manner similar to that of the insulating layer 31.

An opening of the insulating layer 31, an opening of the insulating layer 82, and an opening of the insulating layer 33 are provided in a region overlapping with the depressed portion of the resin layer 23 (FIG. 12D). The bottom surface of the depressed portion of the resin layer 23 is exposed by providing the openings. Here, an example in which the openings of the insulating layer 31, the insulating layer 82, and the insulating layer 33 are formed at a time is shown. The openings of the insulating layer 31, the insulating layer 82, and the insulating layer 33 may be formed in separate steps. In addition, the openings may be formed in two or more of the insulating layers at the same time. For example, the opening of the insulating layer 31 may be formed before the conductive layer 81 is formed. For example, the opening of the insulating layer 82 may be formed before the oxide semiconductor layer 83 is formed. For example, the opening of the insulating layer 33 may be provided in the region overlapping with the depressed portion of the resin layer 23 in a step of forming openings that reach the oxide semiconductor layer 83.

Next, a conductive layer 86a, a conductive layer 86b, and a conductive layer 86c are formed (FIG. 12E). The conductive layers 86a, 86b, and 86c can be formed in the following manner: a conductive film is formed, a resist mask is formed, the conductive film is etched, and the resist mask is removed. The conductive layers 86a and 86b are electrically connected to the oxide semiconductor layer 83 through the openings of the insulating layer 33. The conductive layer 86c is in contact with the bottom surface of the depressed portion of the resin layer 23 through the openings provided in the insulating layer 31, the insulating layer 82, and the insulating layer 33.

Ashing using oxygen plasma is performed in a later step in some cases in order to remove the resin layer 23. At this time, if the conductive layer 86c is formed with a metal or an alloy which is easily oxidized, a surface of the conductive layer 86c is oxidized and the conductivity of the conductive layer 86c is decreased in some cases. Therefore, a material that is not easily oxidized or an oxide conductor is preferably used for the conductive layer 86c. Alternatively, in the case where the surface of the conductive layer 86c is oxidized, the oxidized portion is preferably removed by, for example, treatment for reducing the surface of the conductive layer 86c.

In the above manner, the transistor 80 can be formed (FIG. 12E). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The oxide semiconductor layer 83 includes a channel formation region and a low-resistance region. The channel formation region overlaps with the conductive layer 85 with the insulating layer 84 positioned therebetween. The low-resistance region includes a region connected to the conductive layer 86a and a region connected to the conductive layer 86b.

Figure 13A:
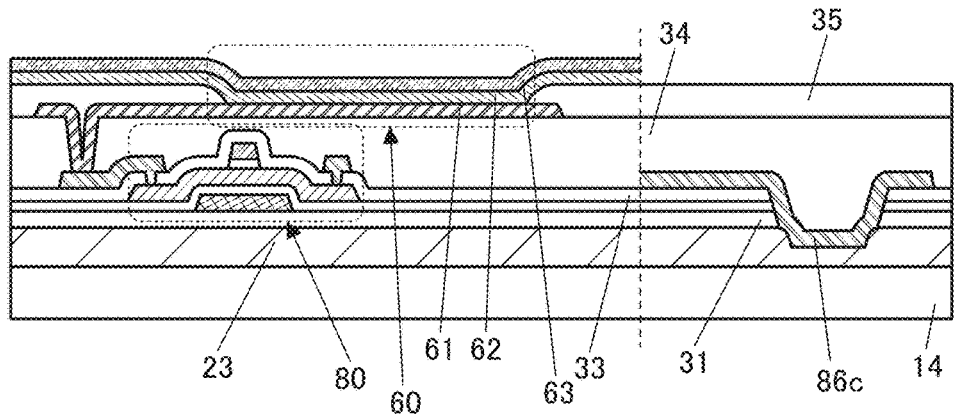
FIGS. 13A to 13C illustrate an example of a method for manufacturing a display device.

Next, components from the insulating layer 34 to the display element 60 are formed over the insulating layer 33 (FIG. 13A). For these steps, the description of the manufacturing method example 1A can be referred to.

Figure 13B:
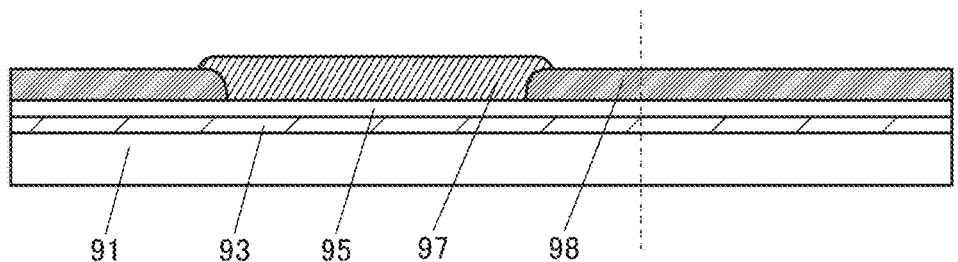

A resin layer 93 is formed over a formation substrate 91 (FIG. 13B).

The resin layer 93 has flexibility. The formation substrate 91 has lower flexibility than the resin layer 93 does. Since the resin layer 93 is formed over the formation substrate 91, the resin layer 93 can be transferred easily.

For the resin layer 93, a polyimide resin is preferably used. For the material and formation method of the resin layer 93, the description of the resin layer 23 can be referred to.

The resin layer 93 preferably has a thickness greater than or equal to 0.01 µm and less than 10 µm, further preferably greater than or equal to 0.1 µm and less than or equal to 5 µm, still further preferably greater than or equal to 0.1 µm and less than or equal to 3 µm, and yet still further preferably greater than or equal to 0.5 µm and less than or equal to 1 µm. With a solution having low viscosity, the resin layer 93 having a small thickness can be easily formed. The thickness of the resin layer 93 may be greater than or equal to 10 µm. For example, the resin layer 93 may have a thickness greater than or equal to 10 µm and less than or equal to 200 µm. The resin layer 93 having a thickness greater than or equal to 10 µm is favorable because the rigidity of the display device can be increased.

In the case where the resin layer 93 is positioned on the display surface side of the display device, the resin layer 93 preferably has a high visible-light transmitting property.

For the formation substrate 91, the description of the formation substrate 14 can be referred to.

Next, an insulating layer 95 is formed over the resin layer 93. Then, a coloring layer 97 and a light-blocking layer 98 are formed over the insulating layer 95 (FIG. 13B).

For the insulating layer 95, the description of the insulating layer 31 can be referred to.

A color filter or the like can be used as the coloring layer 97. The coloring layer 97 is provided to overlap with the display region of the display element 60.

A black matrix or the like can be used as the light-blocking layer 98. The light-blocking layer 98 is provided to overlap with the insulating layer 35.

Figure 13C:
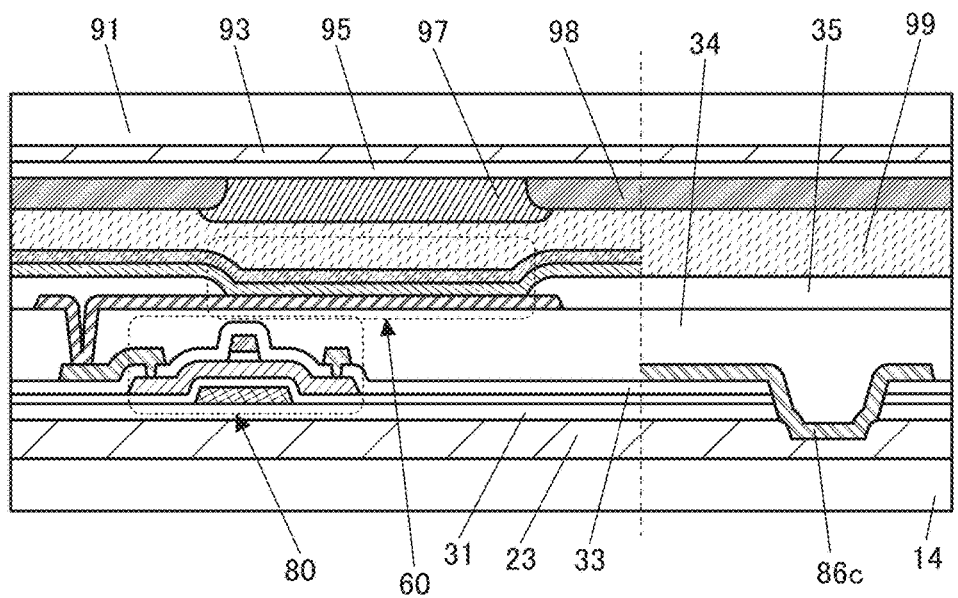

Next, a surface of the formation substrate 14 on which the transistor 80 and the like are formed and a surface of the formation substrate 91 on which the resin layer 93 and the like are formed are attached to each other with an adhesive layer 99 (FIG. 13C).

Figure 14A:
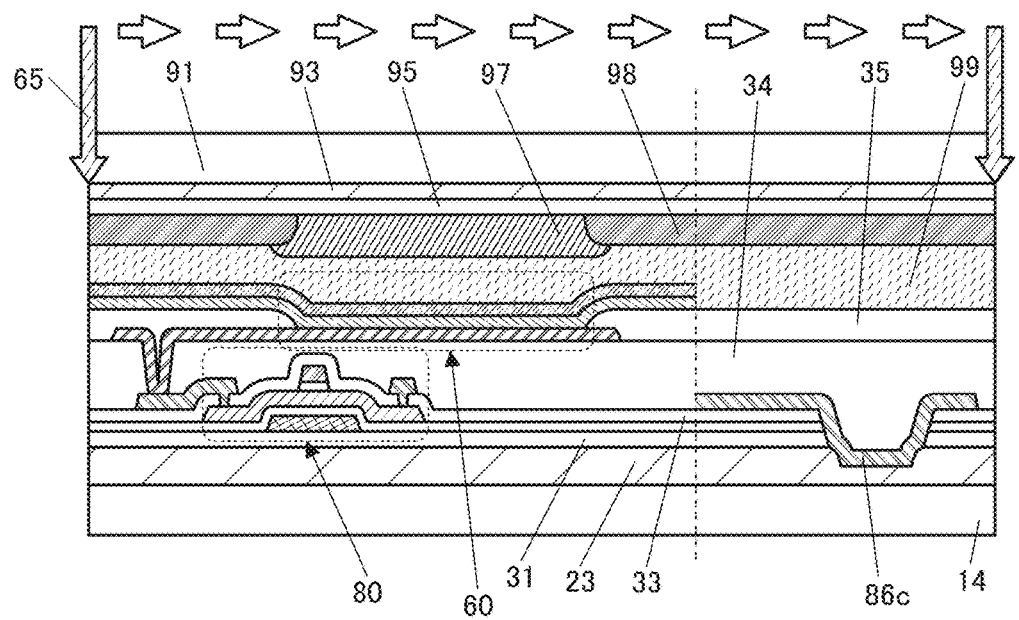
FIGS. 14A and 14B illustrate an example of a method for manufacturing a display device.

Next, the resin layer 93 is irradiated with the laser light 65 through the formation substrate 91 (FIG. 14A). Note that either the formation substrate 14 or the formation substrate 91 may be separated first. Here, an example in which the formation substrate 91 is separated ahead of the formation substrate 14 is shown.

With irradiation with the laser light 65, the resin layer 93 is weakened. Alternatively, with irradiation with the laser light 65, the adhesion between the resin layer 93 and the formation substrate 91 is decreased.

Figure 14B:
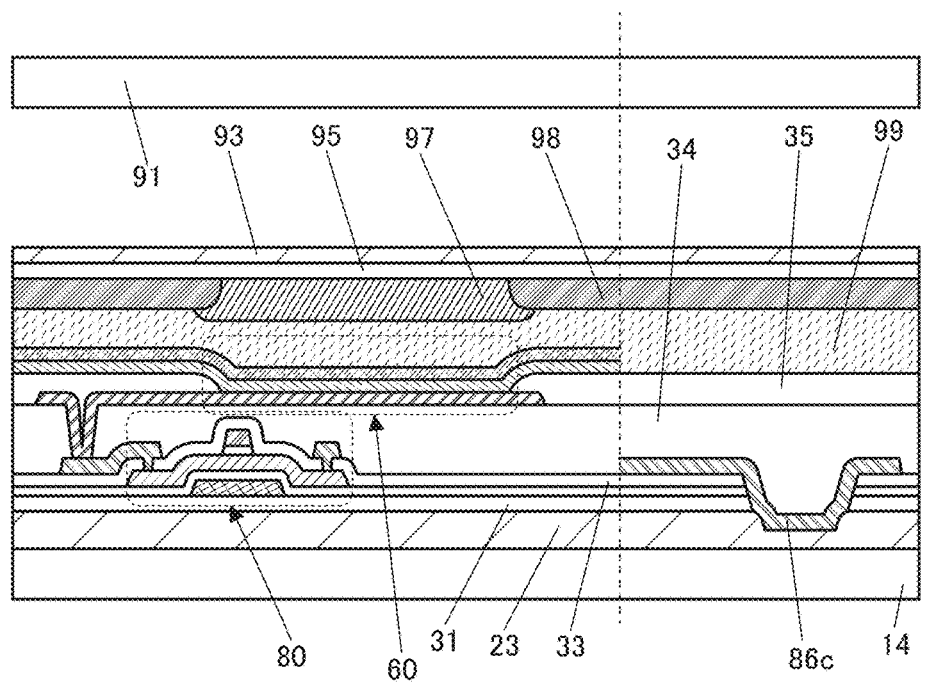

Then, the formation substrate 91 and the insulating layer 95 are separated from each other (FIG. 14B). FIG. 14B illustrates an example in which separation occurs at the interface between the formation substrate 91 and the resin layer 93.

Note that separation occurs in the resin layer 93 in some cases. At this time, part of the resin layer remains over the formation substrate 91 and thus the thickness of the resin layer 93 remaining on the insulating layer 95 side is reduced as compared with that in FIG. 14A.

Figure 15A:
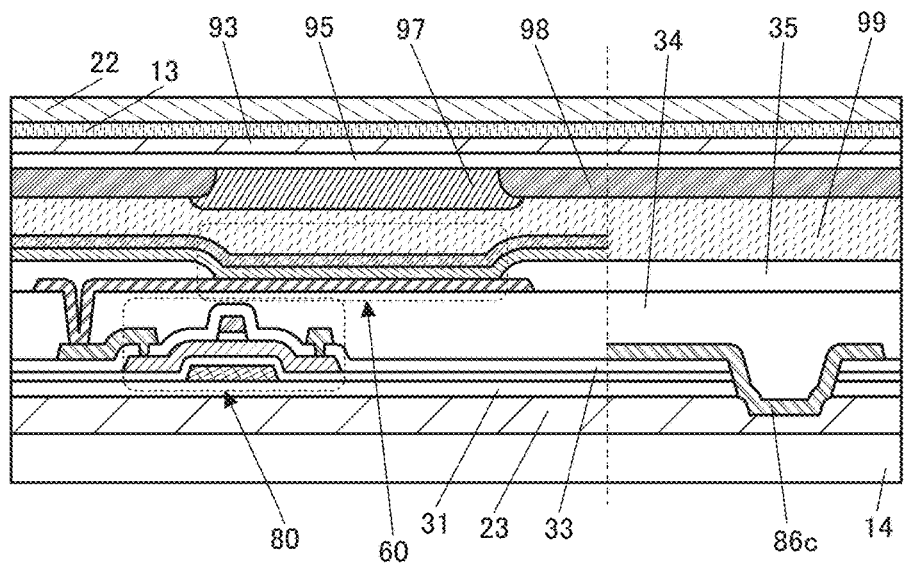
FIGS. 15A and 15B illustrate an example of a method for manufacturing a display device.

Then, the exposed resin layer 93 (or insulating layer 95) and the substrate 22 are attached to each other with an adhesive layer 13 (FIG. 15A).

In FIG. 15A, light emitted from the display element 60 is extracted to the outside of the display device through the coloring layer 97 and the resin layer 93. Thus, the resin layer 93 preferably has high visible-light transmittance. In the peeling method of one embodiment of the present invention, the thickness of the resin layer 93 can be reduced. Therefore, the visible-light transmittance of the resin layer 93 can be increased.

In addition, the resin layer 93 may be removed, and the substrate 22 may be attached to the insulating layer 95 with the adhesive layer 13.

The material that can be used for the adhesive layer 75b can be used for the adhesive layer 13.

The material that can be used for the substrate 75a can be used for the substrate 22.

Figure 15B:
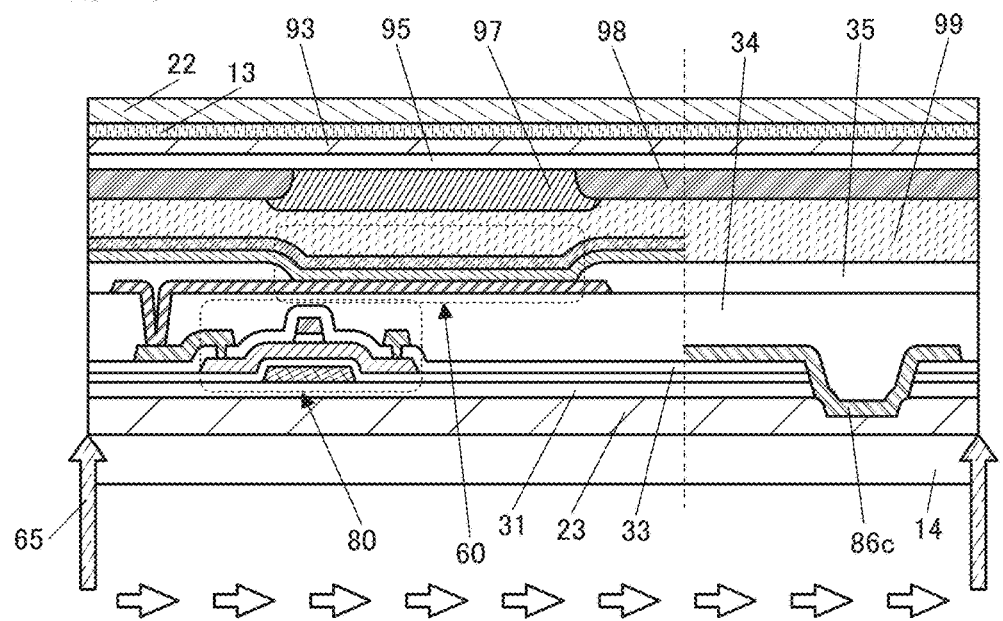

Next, the resin layer 23 is irradiated with the laser light 65 through the formation substrate 14 (FIG. 15B).

With irradiation with the laser light 65, the resin layer 23 is weakened. Alternatively, with irradiation with the laser light 65, the adhesion between the resin layer 23 and the formation substrate 14 is decreased.

Figure 16A:
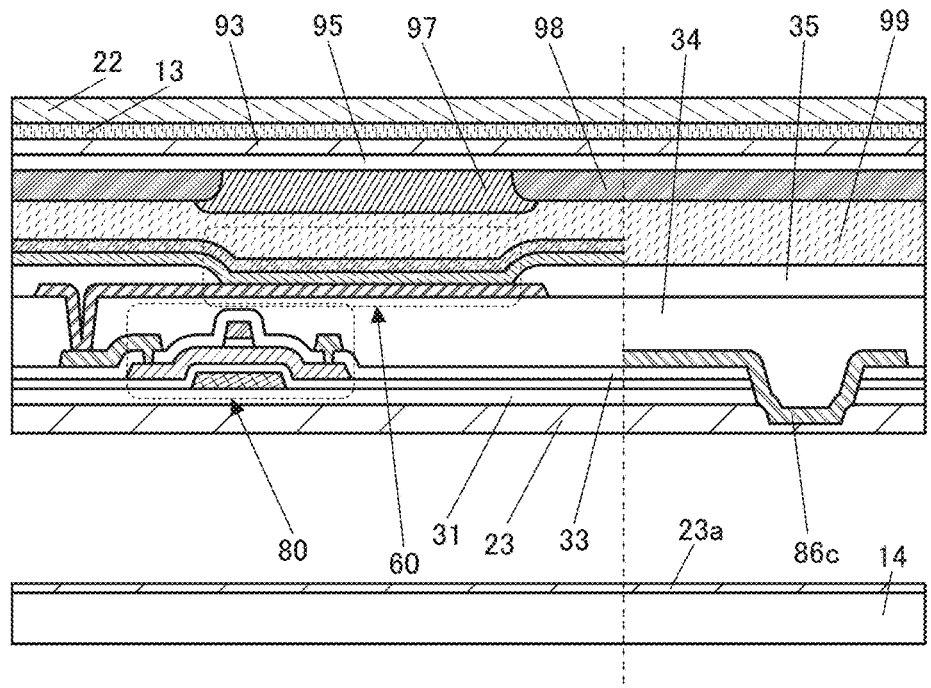
FIGS. 16A and 16B illustrate an example of a method for manufacturing a display device.

Then, the formation substrate 14 and the transistor 80 are separated (FIG. 16A).

FIG. 16A illustrates an example in which separation occurs in the resin layer 23. Part of the resin layer (the resin layer 23a) remains on the formation substrate 14. The resin layer 23 that remains on the insulating layer 31 is thinner than the resin layer 23 illustrated in FIG. 15B.

Figure 16B:
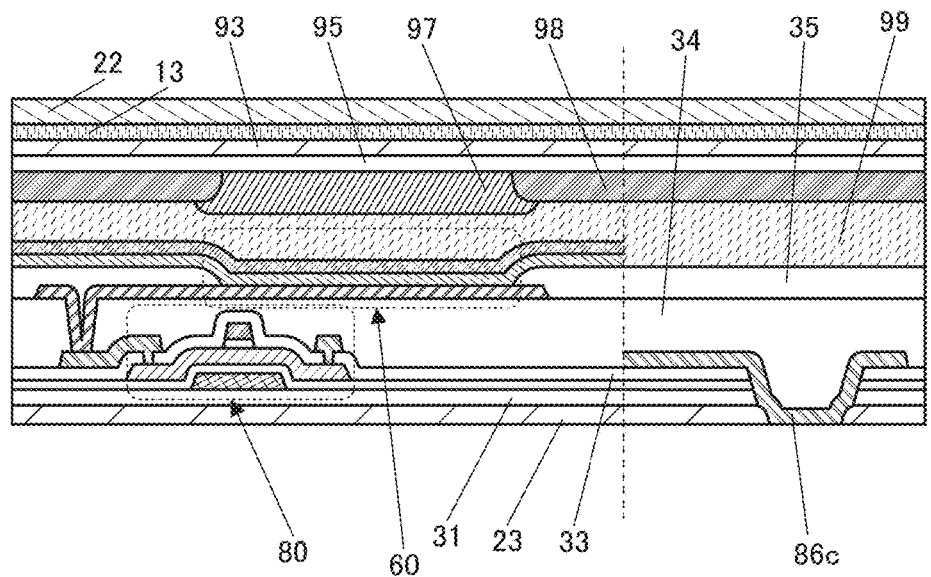

Part of the resin layer 23 is removed to expose the conductive layer 86c (FIG. 16B).

Figure 17A:
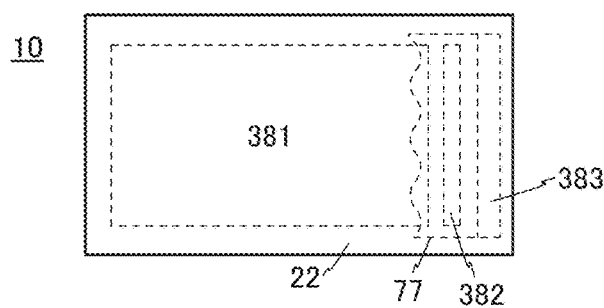
FIGS. 17A and 17B illustrate an example of a display device.
Figure 17B:
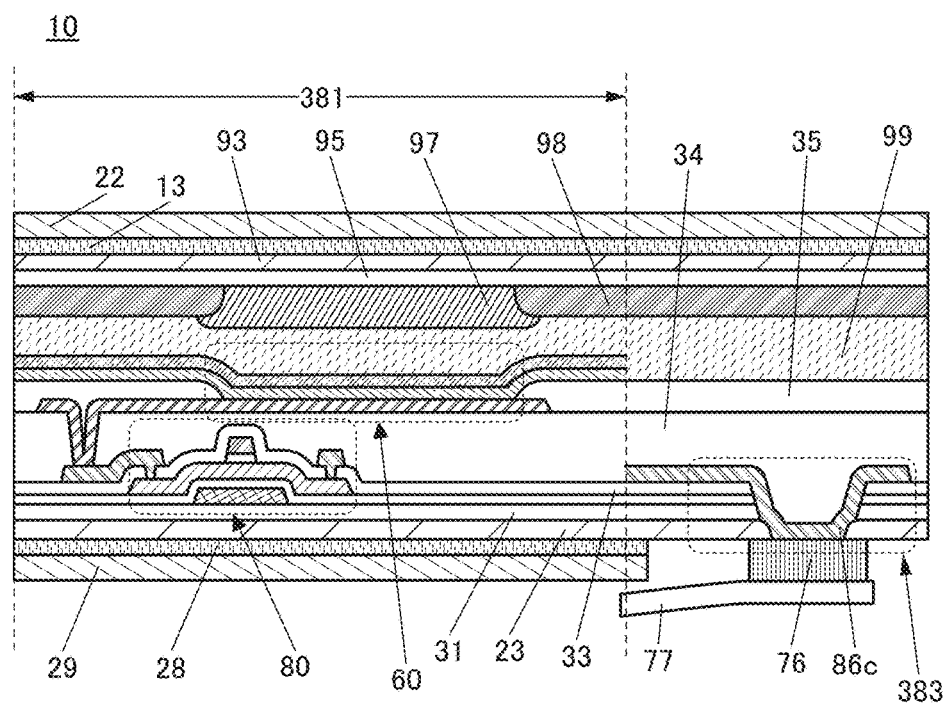

The separation of the formation substrate 14 and the transistor 80 can obtain the display device 10 (FIGS. 17A and 17B). The display device 10 can remain being bent or can be bent repeatedly, for example.

FIG. 17A is a top view of the display device 10. FIG. 17B is a cross-sectional view of a display portion 381 of the display device 10 and a cross-sectional view of a connection portion 383 for connection to the FPC 77.

The display device 10 includes a pair of substrates (the substrate 22 and the substrate 29). The substrate 22 side corresponds to a display surface side. The display device includes the display portion 381 and a driver circuit portion 382. The FPC 77 is attached to the display device.

As illustrated in FIG. 17B, the substrate 29 may be attached to the surface of the resin layer 23, with the adhesive layer 28. Note that the substrate 29 and the adhesive layer 28 are provided in a position that does not overlap with the conductive layer 86c.

Then, the conductive layer 86c and the FPC 77 are electrically connected to each other through the connector 76 (FIG. 17B).

In the manufacturing method example 4A, an example using a top-emission light-emitting element is described. In the case where the external connection terminal is exposed on the substrate 22 side and electrically connected to the FPC 77, the display region cannot overlap with the FPC 77 because the substrate 22 is on the display surface side, and thus a region of the display device that overlaps with the FPC 77 is limited. In contrast, in one embodiment of the present invention, the conductive layer 86c can be easily exposed on the side opposite to the display surface. Therefore, the conductive layer 86c and the FPC 77 can be electrically connected to each other. Such a structure allows the FPC 77 to be positioned on the side opposite to the display surface. Thus, a space for bending the FPC 77 in incorporating the display device in an electronic device can be saved, which enables the electronic device to be smaller.

The manufacturing method example 4A is an example in which the peeling method of one embodiment of the present invention is performed twice to fabricate a display device. In one embodiment of the present invention, each of the functional elements and the like included in the display device is formed over the formation substrate; thus, even in the case where a high-resolution display device is manufactured, high alignment accuracy of the flexible substrate is not required. It is thus easy to attach the flexible substrate.

Modification Example 1A

In one embodiment of the present invention, a display device having a bottom-emission structure can be fabricated.

Figure 18A:
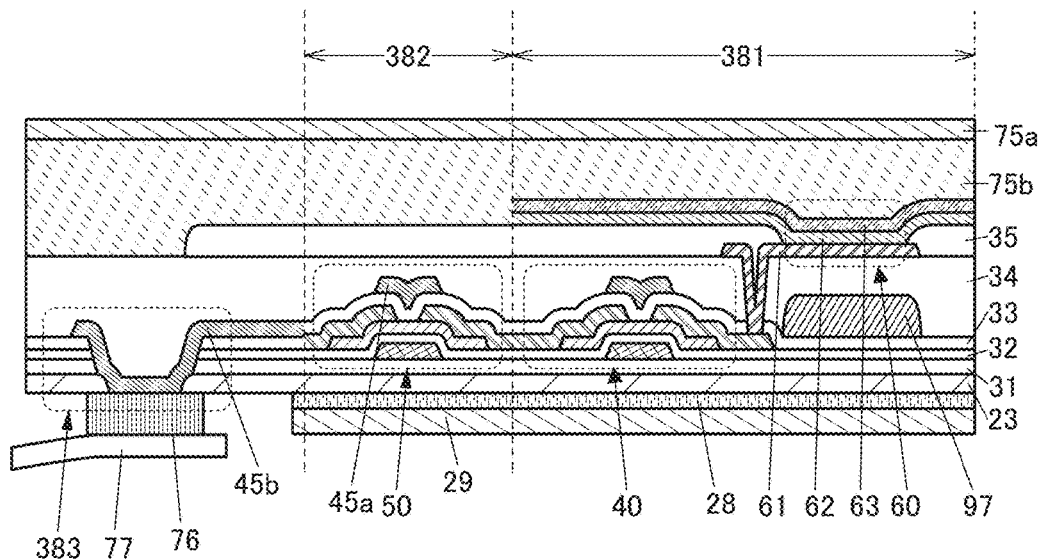
FIGS. 18A and 18B illustrate an example of a display device.

The display device in FIG. 18A is a bottom-emission display device using a color filter method. FIG. 18A is a cross-sectional view of the display portion 381 of the display device, a cross-sectional view of the driver circuit portion 382, and a cross-sectional view of the connection portion 383 for connection to the FPC 77.

The display device in FIG. 18A includes the substrate 29, the adhesive layer 28, the resin layer 23, the insulating layer 31, the transistor 40, a transistor 50, the conductive layer 45b, the insulating layer 33, the insulating layer 34, the insulating layer 35, the display element 60, the adhesive layer 75b, the substrate 75a, and the coloring layer 97.

FIG. 18A is an example including the transistor 40 and the transistor 50 which are each a transistor in which a conductive layer 45a functioning as a gate is added to the components of the transistor 40 in FIG. 6B.

The connection portion 383 includes the conductive layer 45b that is formed with the same material in the same step as the conductive layer 45a.

The display element 60 emits light to the coloring layer 97 side.

The FPC 77 and the conductive layer 45b are electrically connected to each other through the connector 76. In the cross-sectional view of a connection portion for connection to the FPC 77, an example in which the end portion of the insulating layer 35 is not exposed at the end portion of the display device is shown.

Modification Example 2A

Figure 18B:
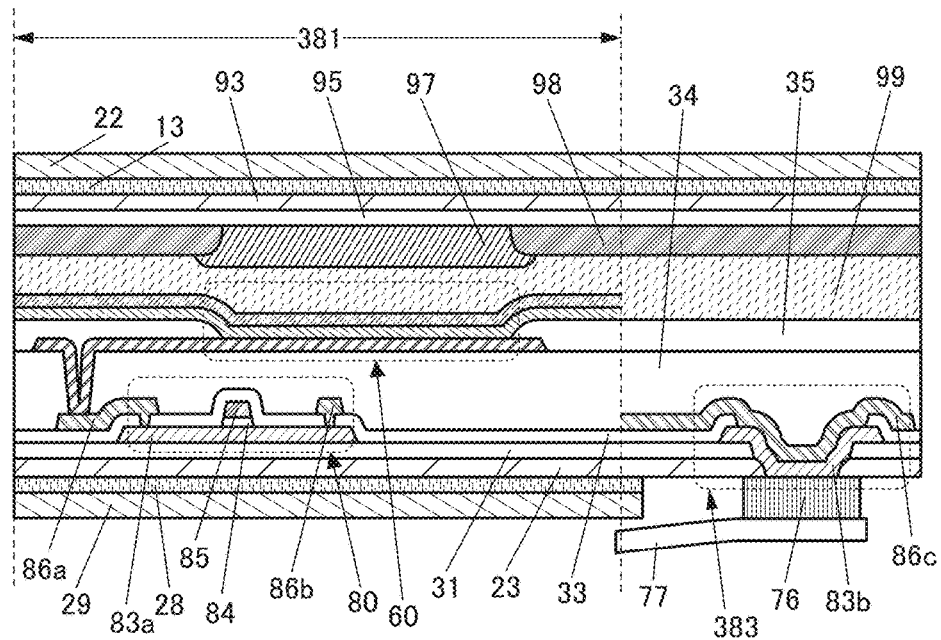

The display device in FIG. 18B is different from the display device in FIG. 17B in that the conductive layer 81 and the insulating layer 82 are not provided in the transistor 80. The transistor illustrated in FIG. 18B includes an oxide semiconductor layer 83a, the insulating layer 84, the conductive layer 85, the conductive layer 86a, and the conductive layer 86b. An oxide conductive layer 83b and the conductive layer 86c are provided in the connection portion 383 illustrated in FIG. 18B.

As described above, in one embodiment of the present invention, a flexible device can be fabricated by separating the transistor or the like from the formation substrate using the resin layer.

In one embodiment of the present invention, since the resin layer is formed with a photosensitive material, the resin layer with a desired shape can be easily formed. Since the conductive layer is provided over the opening of the resin layer, the conductive layer can be electrically connected to the circuit board. The external connection terminal and the circuit board can be electrically connected to each other on the surface opposite to the display surface. A space for bending the FPC and the like in incorporating the display device in an electronic device can be saved, which enables the electronic device to be smaller.

In one embodiment of the present invention, the manufacturing process of the transistor can be performed at a low temperature with the use of an oxide semiconductor in the channel formation region of the transistor. Furthermore, the resin layer can have a small thickness and low heat resistance. Thus, there are advantages in that the material of the resin layer can be selected from a wide range, high mass productivity can be obtained at low cost, and peeling and fabrication of the display device can be performed using a large-sized substrate, for example.

This embodiment can be combined with any of the other embodiments as appropriate.

Embodiment 2

In this embodiment, a peeling method and a method for manufacturing a display device, which are embodiments of the present invention, will be described with reference to FIGS. 19A to 19E to FIGS. 32A and 32B. Note that portions similar to those described in Embodiment 1 are not described in some cases.

In this embodiment, an active-matrix organic EL display device is described as an example. The display device can be a flexible display device by using a flexible material for a substrate.

In the peeling method of one embodiment of the present invention, first, a first layer is formed over a formation substrate with use of a photosensitive material. A depressed portion is formed in the first layer by photolithography, whereby a resin layer having a depressed portion is formed. An insulating layer is formed over the resin layer to cover a side surface and a bottom surface of the depressed portion of the resin layer. A transistor including an oxide semiconductor in a channel formation region is formed over the insulating layer, and a conductive layer that overlaps with the bottom surface of the depressed portion of the resin layer with the insulating layer positioned therebetween is formed. Next, the resin layer is irradiated with laser light. Then, the transistor and the formation substrate are separated.

The insulating layer covering the side and bottom surfaces of the depressed portion of the resin layer can more surely prevent impurities such as hydrogen contained in the resin layer from entering the transistor in the manufacturing process. After the peeling step, at least part of the resin layer and part of the insulating layer are removed, in which case the conductive layer can be exposed. By providing the conductive layer that overlaps with the bottom surface of the depressed portion of the resin layer through the insulating layer, after the peeling step, the conductive layer can be easily exposed. Specifically, the depressed portion of the resin layer has a smaller thickness than the other portion of the resin layer, which means that the amount (thickness) of the resin layer reduced to expose the conductive layer can be small.

Even when the resin layer is removed until the conductive layer is exposed, part of the resin layer can be left. The left resin layer can be used as a protective layer.

The insulating layer can be left between a side surface of the resin layer and a side surface of the conductive layer. That is, a structure in which the resin layer is not in contact with the conductive layer can be achieved.

The exposed conductive layer can be used as a rear electrode, a through electrode, or an external connection terminal. The conductive layer can be electrically connected to a circuit board such as an FPC.

Ashing is preferably used for removal of the resin layer. Specifically, ashing using oxygen plasma is preferably performed.

The display device of one embodiment of this embodiment preferably includes an oxide semiconductor in a channel formation region of the transistor.

A conductive layer overlapping with the bottom surface of the depressed portion of the resin layer with the insulating layer positioned therebetween can be formed with the same material in the same step as an electrode or an oxide semiconductor of the transistor. The description of Embodiment 1 can be referred to for a specific method for forming the conductive layer.

A method for manufacturing a display device of one embodiment of the present invention will be described in detail below.

Manufacturing Method Example 1B

Figure 19A:
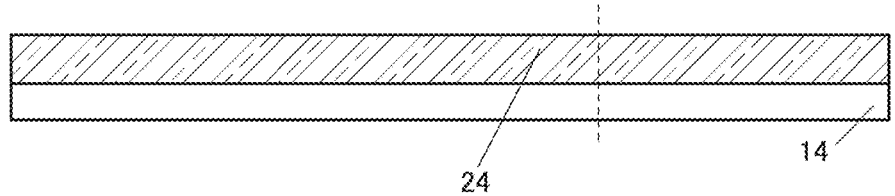
FIGS. 19A to 19E illustrate an example of a method for manufacturing a display device.
Figure 19B:
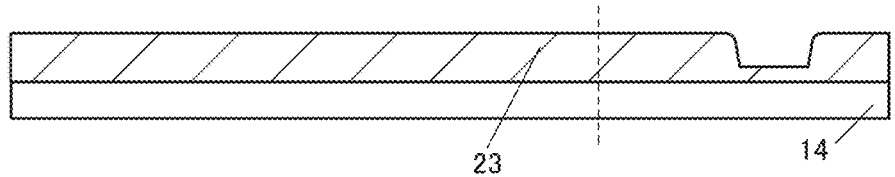

First, the first layer 24 is formed with a photosensitive material over the formation substrate 14 (FIG. 19A), and is processed into the resin layer 23 with a desired shape by photolithography (FIG. 19B). FIG. 19B illustrates an example in which the resin layer 23 has a first region and a second region (also referred to as a depressed portion) that is thinner than the first region.

The depth of the depressed portion is preferably larger than the thickness of the insulating layer 31 to be formed later. With such a structure, the conductive layer 41b can be easily exposed after the peeling step. In addition, the resin layer 23 can be used as a mask for removing a portion of the insulating layer 31 which overlaps with the conductive layer 41b, in which case a portion of the insulating layer 31 which does not overlap with the conductive layer 41b can be prevented from being removed.

The depth of the depressed portion is preferably larger than the sum of the thickness of the insulating layer 31 and the thickness of the conductive layer 41b. With such a structure, the resin layer 23 can be prevented from being completely removed when part of the resin layer 23 and part of the insulating layer 31 are removed in order to expose the conductive layer 41b. The resin layer 23 that remains in the display device can be used as a protective layer, which is preferable.

For example, the depth of the depressed portion of the resin layer 23 is preferably greater than or equal to 0.1 µm and less than or equal to 3 µm, more preferably greater than or equal to 0.5 µm and less than or equal to 2 µm.

For a material and a formation method of the resin layer 23, Embodiment 1 can be referred to.

Figure 19C:
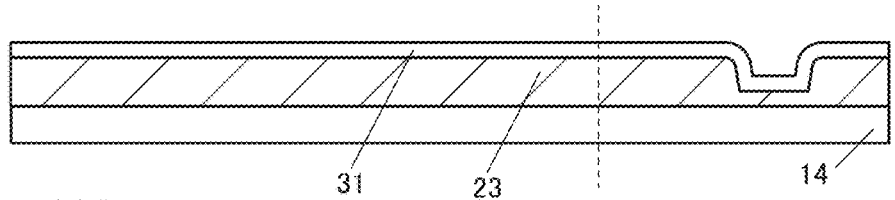

Next, the insulating layer 31 is formed over the resin layer 23 (FIG. 19C).

Figure 19D:
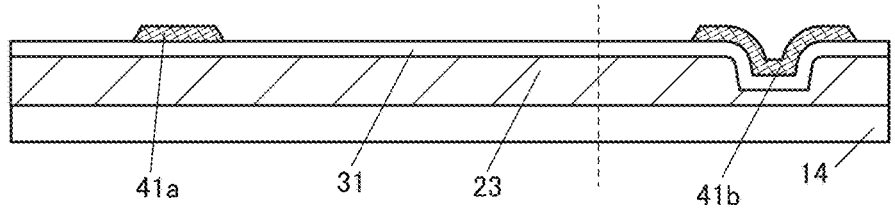
Figure 19E:
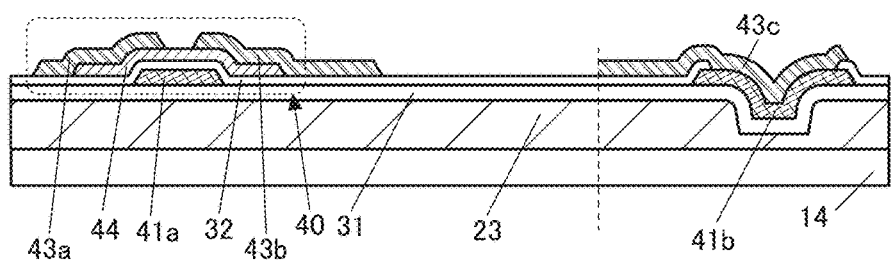

Then, the transistor 40 is formed over the insulating layer 31 (FIGS. 19D and 19E).

Here, the case where a bottom-gate transistor including the oxide semiconductor layer 44 is formed as the transistor 40 is described.

Specifically, first, a conductive layer 41a and the conductive layer 41b are formed over the insulating layer 31 (FIG. 19D). The conductive layer 41a and the conductive layer 41b can be formed in the following manner: a conductive film is formed, a resist mask is formed, the conductive film is etched, and the resist mask is removed.

The conductive layer 41b overlaps with the bottom surface of the depressed portion of the resin layer 23 with the insulating layer 31 positioned therebetween.

The substrate temperature in a step of forming the conductive film is preferably higher than or equal to room temperature and lower than or equal to 350° C., more preferably higher than or equal to room temperature and lower than or equal to 300° C.

Next, the insulating layer 32 is formed (FIG. 19E).

Then, the oxide semiconductor layer 44 is formed (FIG. 19E).

Next, a conductive layer 43a, a conductive layer 43b, and a conductive layer 43c are formed (FIG. 19E). Each of the conductive layers 43a and 43b is connected to the oxide semiconductor layer 44. The conductive layer 43c is connected to the conductive layer 41b. The conductive layer 43c can be used as an auxiliary electrode (also referred to as an auxiliary wiring) of the conductive layer 41b.

Through the above steps, the transistor 40 can be fabricated (FIG. 19E). In the transistor 40, part of the conductive layer 41a functions as a gate, part of the insulating layer 32 functions as a gate insulating layer, and the conductive layer 43a and the conductive layer 43b function as a source and a drain.

Figure 20:
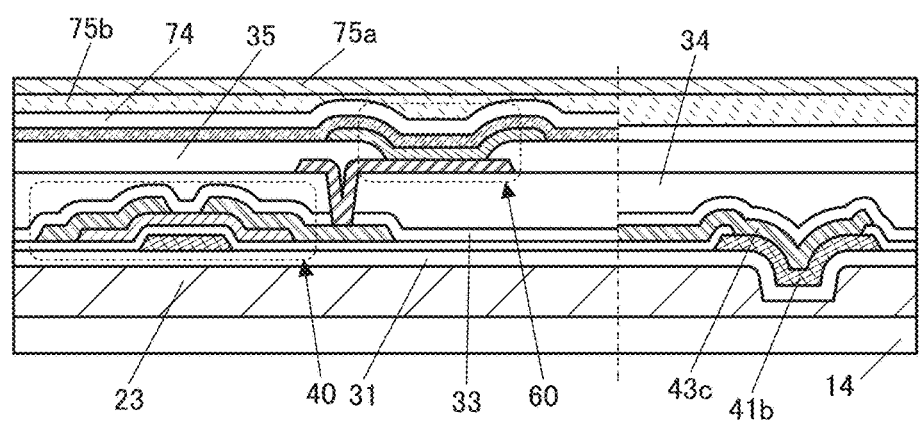
FIG. 20 illustrates an example of a method for manufacturing a display device.

Next, components from the insulating layer 33 to the substrate 75a are formed as in the manufacturing method example 1A in Embodiment 1 (FIG. 20).

Figure 21A:
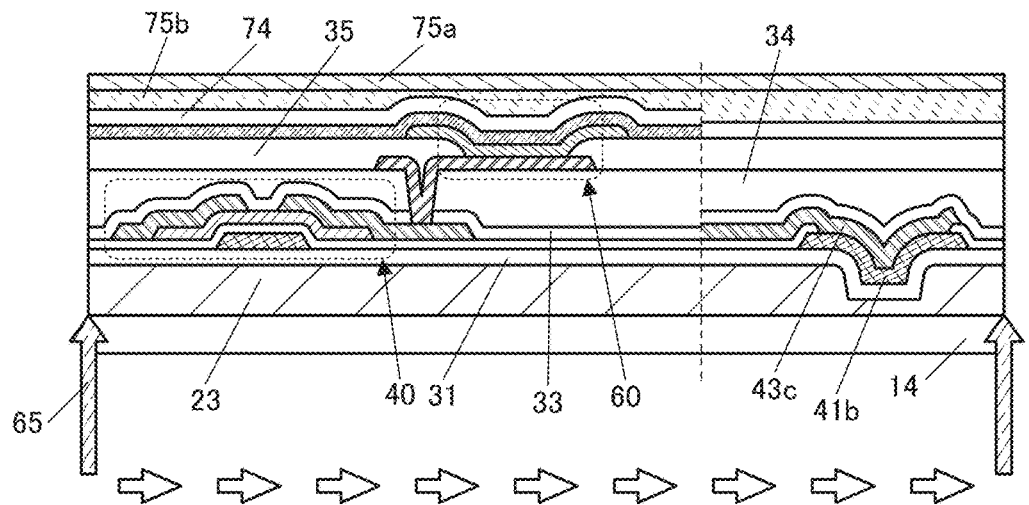
FIGS. 21A and 21B illustrate an example of a method for manufacturing a display device.

Next, the resin layer 23 is irradiated with laser light 65 through the formation substrate 14 (FIG. 21A). The laser light 65 is, for example, a linear laser beam with which scanning is performed from the left side to the right side in FIG. 21A, and the major axis is perpendicular to the scanning direction and the incident direction (from bottom to top).

The resin layer 23 absorbs the laser light 65.

With irradiation with the laser light 65, the resin layer 23 is weakened. Alternatively, with irradiation with the laser light 65, the adhesion between the resin layer 23 and the formation substrate 14 is decreased.

Figure 21B:
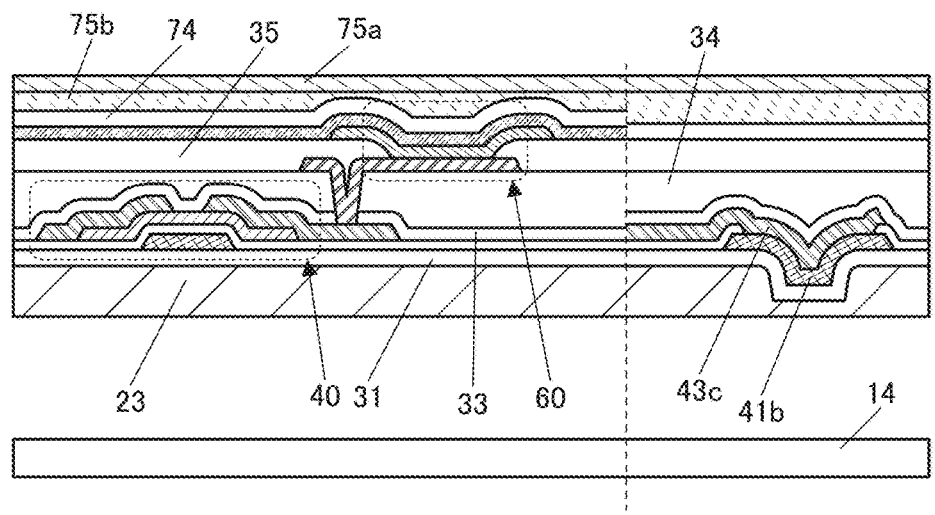

Next, the formation substrate 14 and the transistor 40 are separated (FIG. 21B).

FIG. 21B illustrates an example in which separation occurs at the interface between the formation substrate 14 and the resin layer 23. The resin layer 23 is exposed by the separation.

Figure 22A:
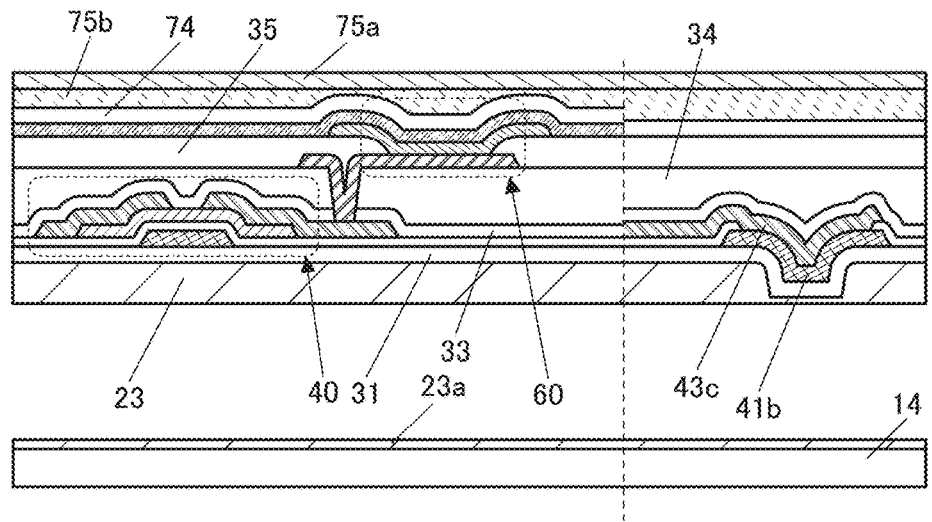
FIGS. 22A and 22B illustrate an example of a method for manufacturing a display device.

FIG. 22A illustrates an example in which separation occurs in the resin layer 23. Part of the resin layer (the resin layer 23a) remains on the formation substrate 14. The resin layer 23 that remains on the insulating layer 31 is thinner than the resin layer 23 illustrated in FIG. 21A.

Figure 22B:
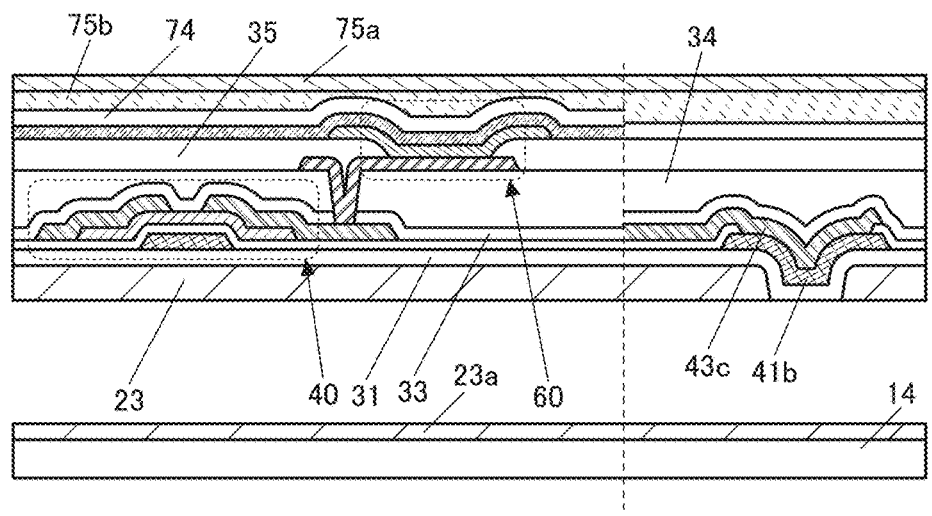

FIG. 22B illustrates an example in which separation occurs in the resin layer 23 and at an interface between the insulating layer 31 and the resin layer 23. Part of the resin layer (the resin layer 23a) remains on the formation substrate 14. The insulating layer 31 is exposed by the separation. The resin layer 23 that remains on the transistor 40 side is thinner than the resin layer 23 illustrated in FIG. 21A.

Figure 23A:
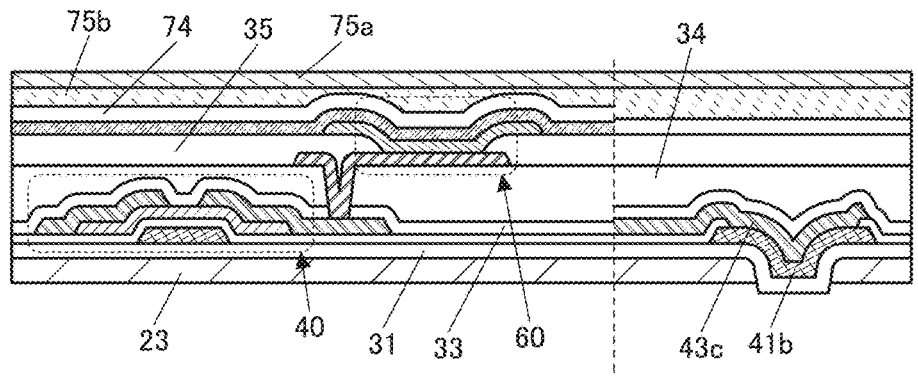
FIGS. 23A to 23C illustrate an example of a method for manufacturing a display device.
Figure 24A:
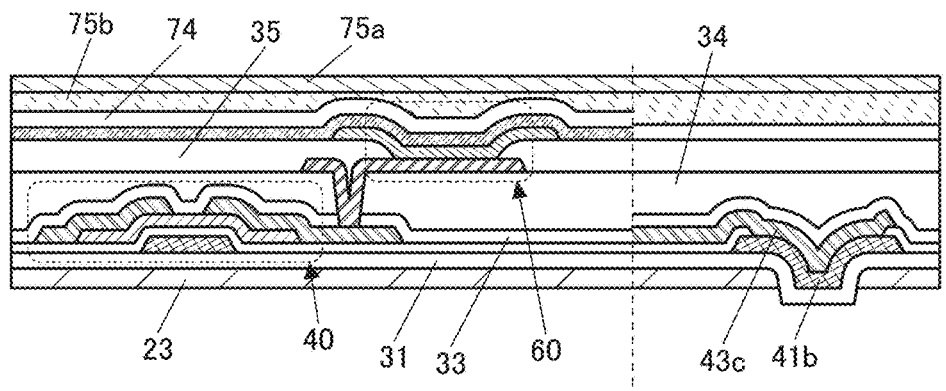
FIGS. 24A to 24C illustrate an example of a method for manufacturing a display device.
Figure 25A:
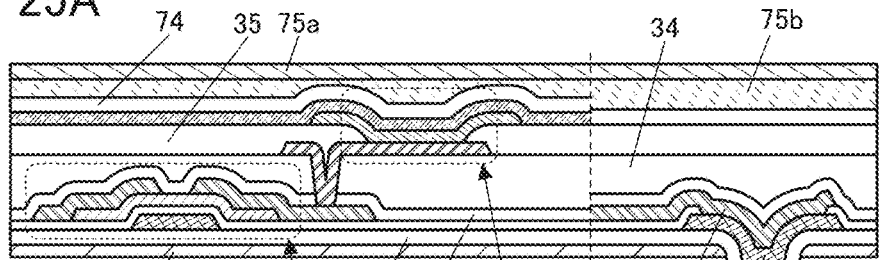
FIGS. 25A to 25D illustrate an example of a method for manufacturing a display device.

Next, the conductive layer 41b is exposed. In the case where both the resin layer 23 and the insulating layer 31 overlap with the conductive layer 41b and remain as illustrated in FIG. 21B and FIG. 22A, first, at least part of the resin layer 23 is removed to expose the insulating layer 31 (FIG. 23A, FIG. 24A, or FIG. 25A). The amount of the resin layer 23 removed is different between FIG. 23A, FIG. 24A, and FIG. 25A.

There is no particular limitation on a method for removing the resin layer 23. For example, a wet etching method or a dry etching method can be used.

In particular, the resin layer 23 is preferably removed by ashing using oxygen plasma. Ashing has advantages such as high controllability, good in-plane uniformity, and high suitability for treatment using a large-sized substrate, for example.

Figure 23B:
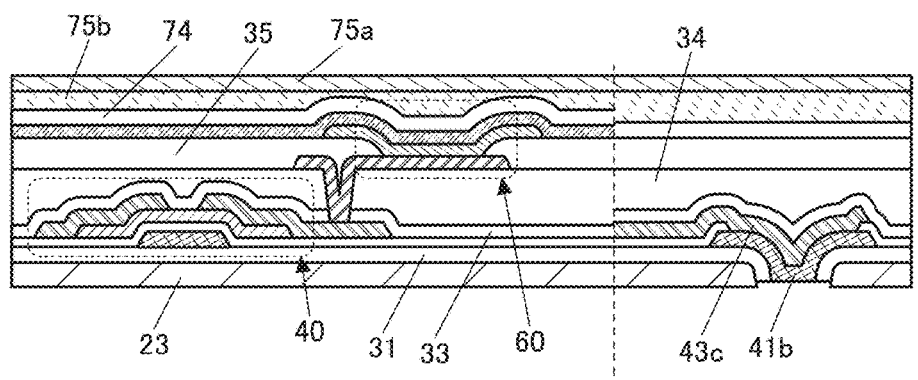
Figure 24B:
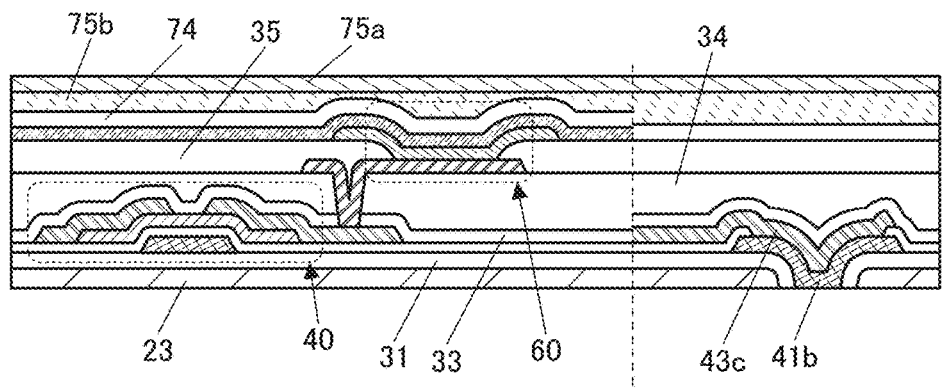
Figure 25B:
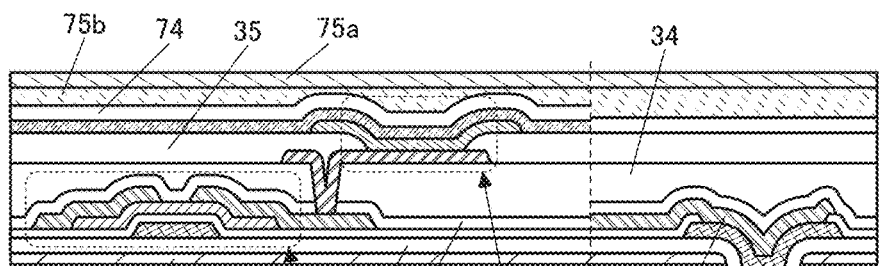

After the resin layer 23 is removed or in the case where the insulating layer 31 after peeling remains and overlaps with the conductive layer 41b as illustrated in FIG. 22B, at least part of a region in the insulating layer 31 in contact with the conductive layer 41b is removed to expose the conductive layer 41b (FIG. 23B, FIG. 24B, or FIG. 25B). By etching of the insulating layer 31, at least part of the resin layer 23 is etched, so that the resin layer 23 becomes thinner or eliminated in some cases. This phenomenon is significant in the case of a dry etching method.

FIG. 23B illustrates an example in which an exposed surface of the insulating layer 31 and an exposed surface of the conductive layer 41b are on the inner side than an exposed surface of the resin layer 23.

FIG. 24B illustrates an example in which the exposed surface of the resin layer 23, the exposed surface of the insulating layer 31, and the exposed surface of the conductive layer 41b are at substantially the same level.

FIG. 25B illustrates an example in which the exposed surface of the insulating layer 31 and the exposed surface of the conductive layer 41b are on the outer side than the exposed surface of the resin layer 23.

In FIG. 23B, FIG. 24B, and FIG. 25B, the exposed surface of the insulating layer 31 and the exposed surface of the conductive layer 41b are at substantially the same level, but one embodiment of the present invention is not limited to this. The exposed surface of the conductive layer 41b may be on the outer side or on the inner side than the exposed surface of the insulating layer 31.

Figure 23C:
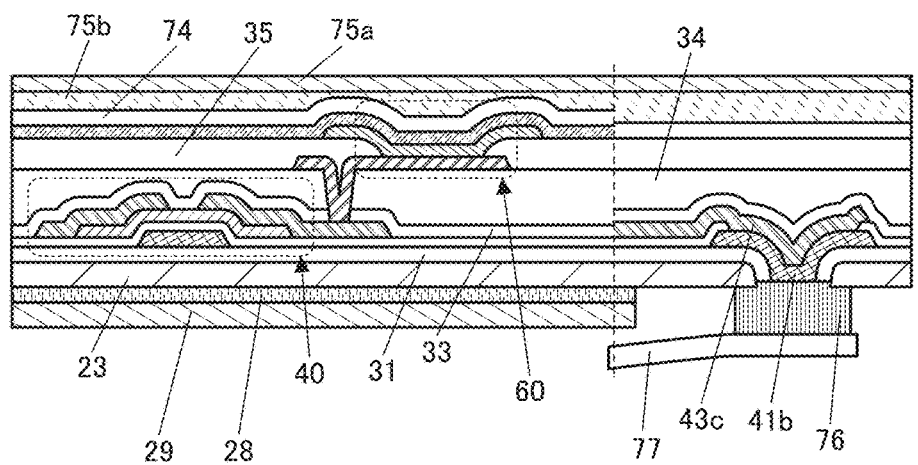
Figure 24C:
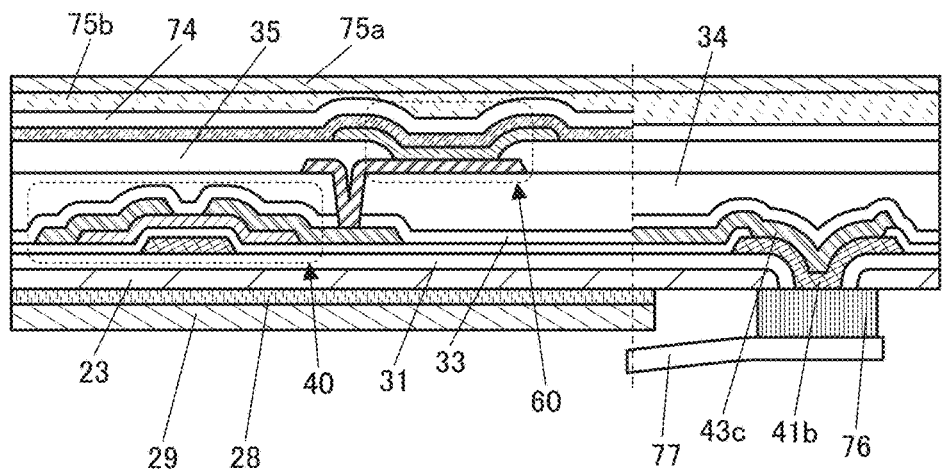
Figure 25C:
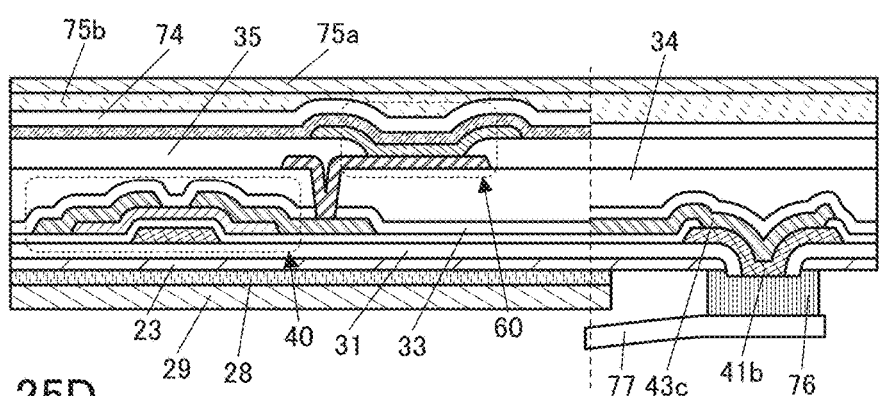

Through the separation of the formation substrate 14 and the transistor 40, the display device can be fabricated (FIG. 23C, FIG. 24C, or FIG. 25C). The display device can remain being bent or can be bent repeatedly, for example.

As illustrated in FIG. 23C, FIG. 24C, and FIG. 25C, the substrate 29 may be attached to the surface of the resin layer 23 with the adhesive layer 28. Note that the substrate 29 and the adhesive layer 28 are provided in a position that does not overlap with the exposed conductive layer 41b. The substrate 29 can function as a support substrate of the display device.

The resin layer 23 is removed such that the conductive layer 41b is exposed and the resin layer 23 remains. For example, in the case where an inorganic insulating film is used as the insulating layer 31, the adhesion of the resin layer 23 to the adhesive layer 28 is higher than the adhesion of the resin layer 23 to the insulating layer 31 in some cases. The resin layer 23 can be used as a protective layer.

Through the connector 76, the conductive layer 41b and the FPC 77 are electrically connected to each other (FIG. 23C, FIG. 24C, or FIG. 25C).

Note that the exposed surface of the conductive layer 41b and the exposed surface of the resin layer 23 forms a step in some cases. At this time, the connector 76 is preferably provided to cover the conductive layer 41b as illustrated in FIG. 23C and FIG. 25C, in which case the anchor effect can be obtained. Thus, adhesion between the connector 76 and the conductive layer 41b can be improved.

Figure 25D:
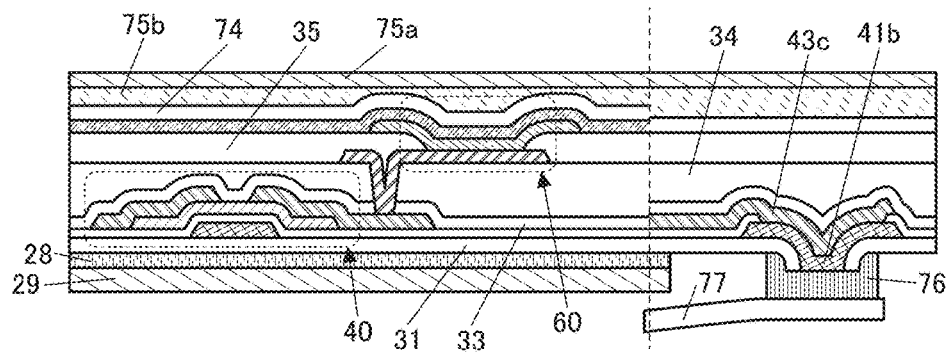

Alternatively, the resin layer 23 may be completely removed (FIG. 25D).

Through the above steps, the display device in which an oxide semiconductor is used in a transistor and an EL element is formed by a separate coloring method can be manufactured.

In the manufacturing method example 1B, an example of using a top-emission light-emitting element is described. In the case where an external connection terminal is exposed on the protective layer 75 side and electrically connected to the FPC 77, a display region cannot overlap with the FPC 77 because the protective layer 75 is on the display surface side, and thus a region of the display device that overlaps with the FPC 77 is limited. In contrast, the conductive layer 41b can be easily exposed on the side opposite to the display surface by using one embodiment of the present invention. Thus, the conductive layer 41b and the FPC 77 can be electrically connected to each other. Such a structure allows the FPC 77 to be positioned on the side opposite to the display surface. Thus, a space for bending the FPC 77 in incorporating the display device in an electronic device can be saved, which enables the electronic device to be smaller.

Note that the display device of this embodiment can be manufactured with use of the protective layer 71 described in the manufacturing method example 2A.

Manufacturing Method Example 2B

Figure 26A:
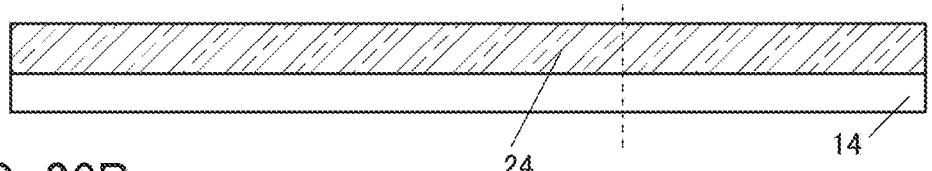
FIGS. 26A to 26E illustrate an example of a method for manufacturing a display device.
Figure 26B:
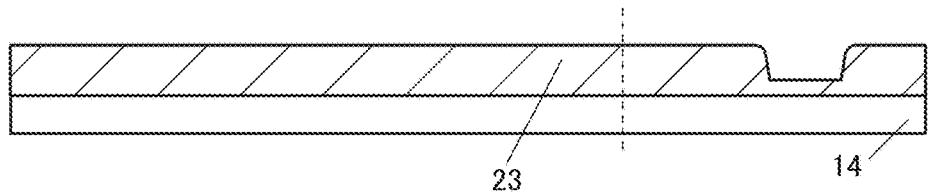

First, the first layer 24 is formed with a photosensitive material over the formation substrate 14 (FIG. 26A). Then, as in the manufacturing method example 1B, the resin layer 23 having a depressed portion is formed by photolithography (FIG. 26B).

Figure 26C:
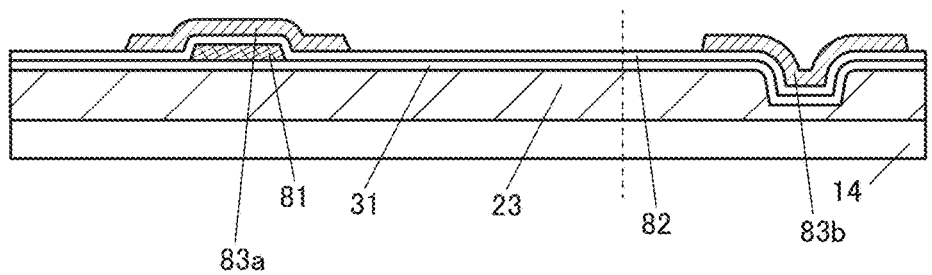

Next, the insulating layer 31 is formed over the resin layer 23 in a manner similar to that in the manufacturing method example 1B (FIG. 26C).

Figure 26D:
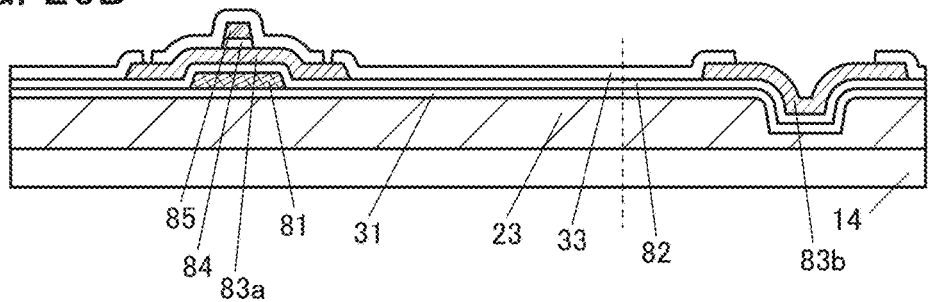
Figure 26E:
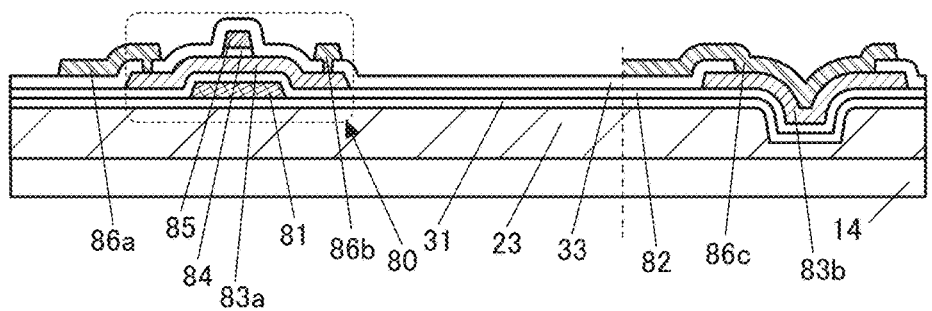

Next, the transistor 80 is formed over the insulating layer 31 (FIGS. 26C to 26E).

Here, the case where a transistor including the oxide semiconductor layer 83a and two gates is formed as the transistor 80 is shown.

Specifically, first, the conductive layer 81 is formed over the insulating layer 31 (FIG. 26C).

Next, the insulating layer 82 is formed (FIG. 26C).

Next, the oxide semiconductor layer 83a and the oxide conductive layer 83b are formed (FIG. 26C). The oxide semiconductor layers 83a and 83b can be formed in the following manner: an oxide semiconductor film is formed, a resist mask is formed, the oxide semiconductor film is etched, and the resist mask is removed. At this time, the oxide conductive layer may be a semiconductor, and a process for reducing the resistance of the oxide conductive layer 83b is preferably performed later.

The oxide conductive layer 83b overlaps with the bottom surface of the depressed portion of the resin layer 23 with the insulating layer 31 and the insulating layer 32 positioned therebetween.

The oxide semiconductor layer 83a and the oxide conductive layer 83b are formed with the same material in the same step, in which case the manufacturing cost can be reduced. Note that even when the oxide semiconductor layer 83a and the oxide conductive layer 83b have the same metal elements, their compositions are different in some cases. For example, a metal element in a film is released during the manufacturing process of a transistor and a capacitor, which might result in different metal compositions.

For example, the thickness of each of the oxide semiconductor layer 83a and the oxide conductive layer 83b is preferably greater than or equal to 1 nm and less than or equal to 200 nm, more preferably greater than or equal to 5 nm and less than or equal to 100 nm.

After the oxide semiconductor is formed, plasma treatment or the like is performed to reduce the resistivity of the oxide semiconductor; thus, the oxide conductive layer 83b can be formed.

Note that by performing heat treatment in the following step, oxygen is released from the oxide conductive layer 83b and oxygen vacancies are generated, which decreases the resistivity of the oxide conductive layer 83b in some cases.

Then, the insulating layer 84 and the conductive layer 85 are formed (FIG. 26D).

Next, the insulating layer 33 that covers the oxide semiconductor layer 83a, the oxide conductive layer 83b, the insulating layer 84, and the conductive layer 85 is formed.

Next, openings are formed in portions of the insulating layer 33 which overlap with the oxide semiconductor layer 83a and the oxide conductive layer 83b (FIG. 26D). By forming the openings, the oxide semiconductor layer 83a and the oxide conductive layer 83b are exposed.

Next, the conductive layer 86a, the conductive layer 86b, and the conductive layer 86c are formed (FIG. 26E). The conductive layers 86a and 86b are electrically connected to the oxide semiconductor layer 83a through the openings of the insulating layer 33. The conductive layer 86c is in contact with the oxide conductive layer 83b through the opening provided in the insulating layer 33. The conductive layer 86c can be used as an auxiliary electrode (also referred to as an auxiliary wiring) of the oxide conductive layer 83b.

In the formation of the conductive layer 86c, at least one of hydrogen and nitrogen is supplied to the oxide conductive layer 83b, which decreases the resistivity of the oxide conductive layer 83b in some cases. Oxygen in the oxide conductive layer 83b is extracted by the conductive layer 86c, which decreases the resistivity of the oxide conductive layer 83b in some cases. A constituent element of the conductive layer 86c enters the oxide conductive layer 83b, which decreases the resistivity of the oxide conductive layer 83b in some cases. Similarly, the resistivity of portions of the oxide semiconductor layer 83a in contact with the conductive layer 86a and the conductive layer 86b is decreased in some cases by extraction of oxygen, entry of a constituent element of the conductive layer, or the like.

In the above manner, the transistor 80 can be formed (FIG. 26E). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The oxide semiconductor layer 83a includes a channel formation region and a low-resistance region. The channel formation region overlaps with the conductive layer 85 with the insulating layer 84 positioned therebetween. The low-resistance region includes a region connected to the conductive layer 86a and a region connected to the conductive layer 86b.

Figure 27A:
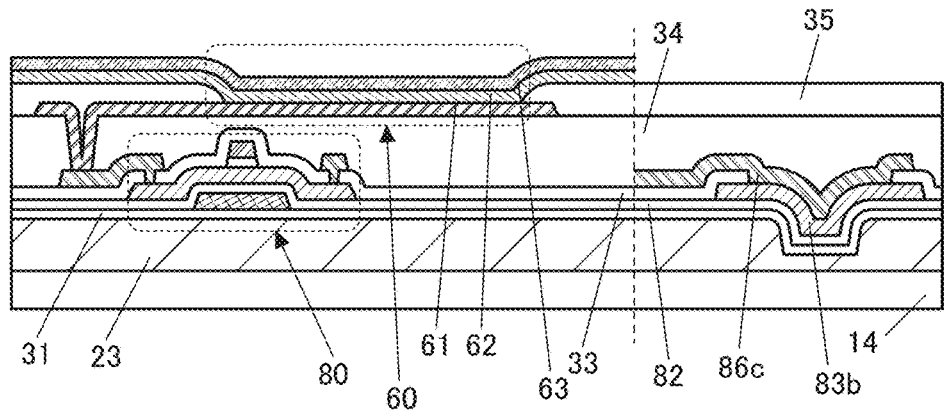
FIGS. 27A to 27C illustrate an example of a method for manufacturing a display device.

Next, components from the insulating layer 34 to the display element 60 are formed over the insulating layer 33 (FIG. 27A). For these steps, the description of the manufacturing method example 1A can be referred to.

Figure 27B:
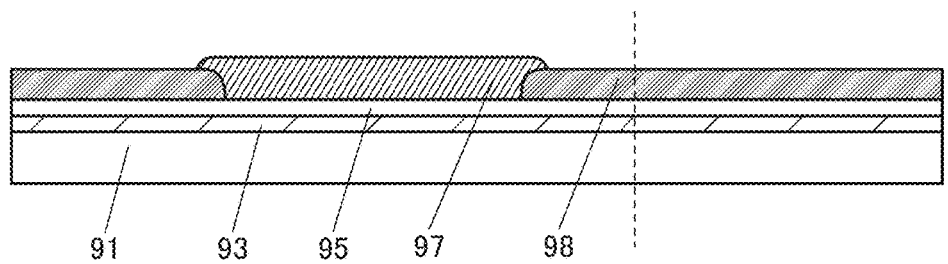

As in the manufacturing method example 4A, the resin layer 93, the light-blocking layer 98, and the coloring layer 97 are formed over the formation substrate 91 (FIG. 27B).

Figure 27C:
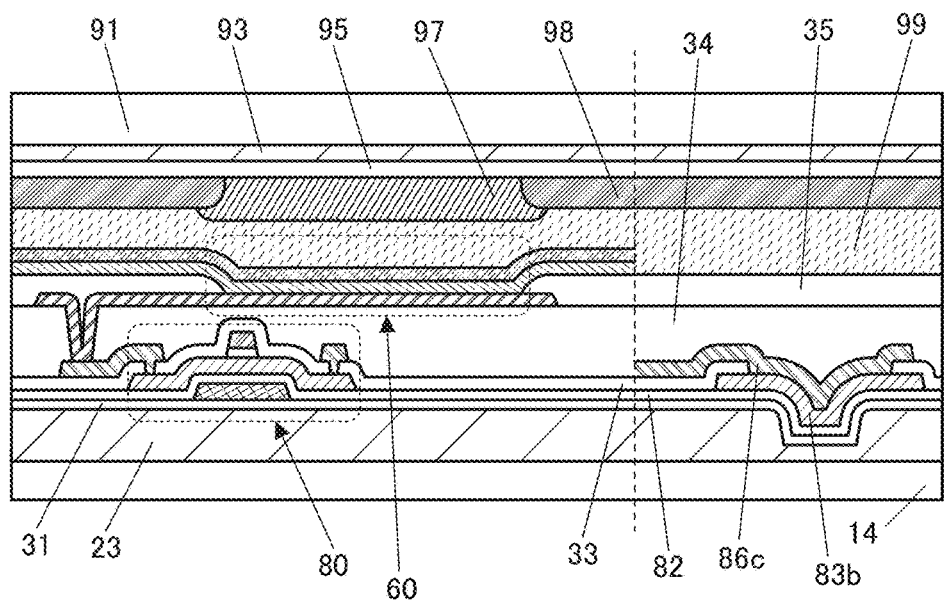

Next, a surface of the formation substrate 14 on which the transistor 80 and the like are formed and a surface of the formation substrate 91 on which the resin layer 93 and the like are formed are attached to each other with the adhesive layer 99 (FIG. 27C).

Figure 28A:
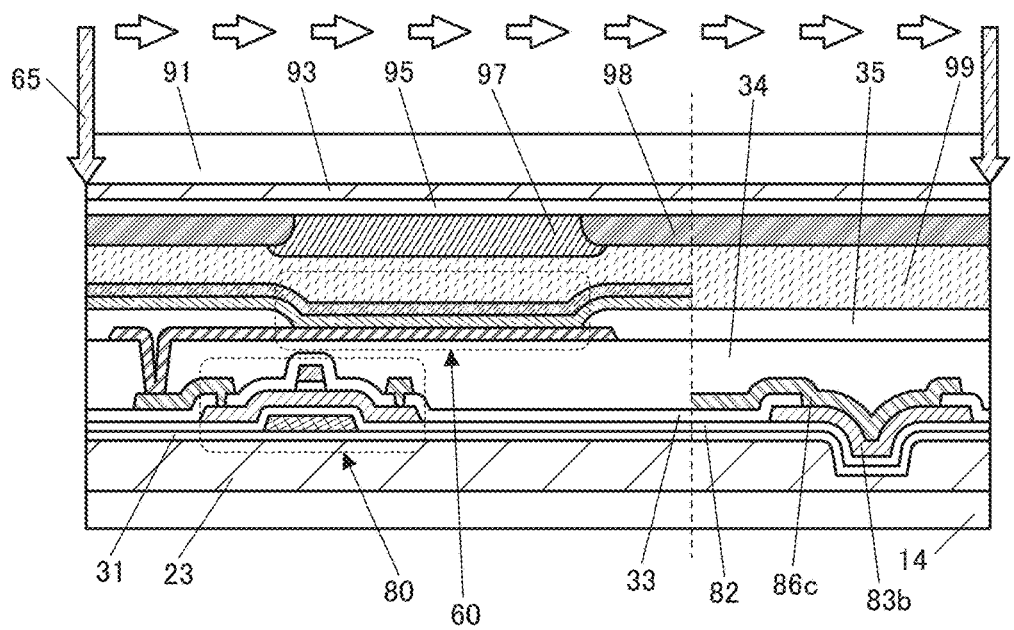
FIGS. 28A and 28B illustrate an example of a method for manufacturing a display device.

Next, the resin layer 93 is irradiated with the laser light through the formation substrate 91 (FIG. 28A). Note that either the formation substrate 14 or the formation substrate 91 may be separated first. Here, an example in which the formation substrate 91 is separated ahead of the formation substrate 14 is shown.

With irradiation with the laser light 65, the resin layer 93 is weakened. Alternatively, with irradiation with the laser light 65, the adhesion between the resin layer 93 and the formation substrate 91 is decreased.

Figure 28B:
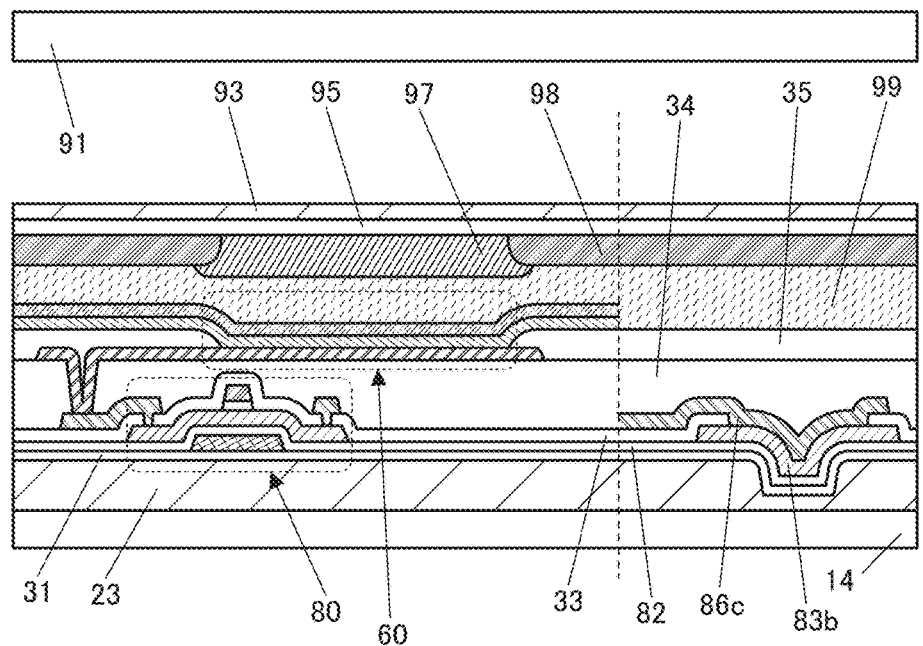

Then, the formation substrate 91 and the insulating layer 95 are separated from each other (FIG. 28B). FIG. 28B illustrates an example in which separation occurs at the interface between the formation substrate 91 and the resin layer 93.

Note that separation occurs in the resin layer 93 in some cases. At this time, part of the resin layer remains over the formation substrate 91 and thus the thickness of the resin layer 93 remaining on the insulating layer 95 side is reduced as compared with that in FIG. 28A.

Figure 29A:
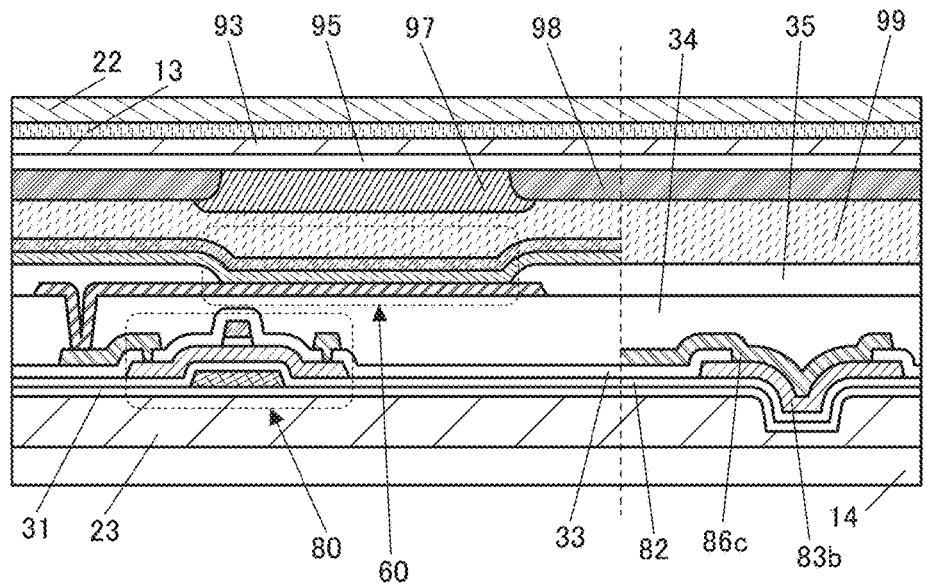
FIGS. 29A and 29B illustrate an example of a method for manufacturing a display device.

Then, the exposed resin layer 93 (or insulating layer 95) and the substrate 22 are attached to each other with an adhesive layer 13 (FIG. 29A).

In FIG. 29A, light emitted from the display element 60 is extracted to the outside of the display device through the coloring layer 97 and the resin layer 93. Thus, the resin layer 93 preferably has high visible-light transmittance. In the peeling method of one embodiment of the present invention, the thickness of the resin layer 93 can be reduced. Therefore, the visible-light transmittance of the resin layer 93 can be increased.

In addition, the resin layer 93 may be removed, and the substrate 22 may be attached to the insulating layer 95 with the adhesive layer 13.

Figure 29B:
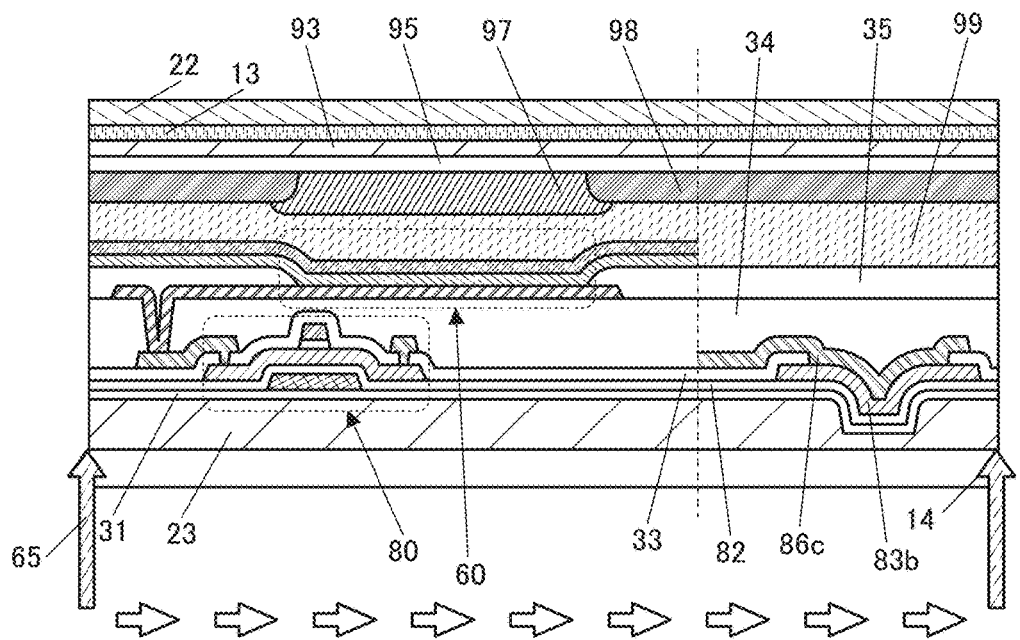

Next, the resin layer 23 is irradiated with the laser light 65 through the formation substrate 14 (FIG. 29B).

With irradiation with the laser light 65, the resin layer 23 is weakened. Alternatively, with irradiation with the laser light 65, the adhesion between the resin layer 23 and the formation substrate 14 is decreased.

Figure 30A:
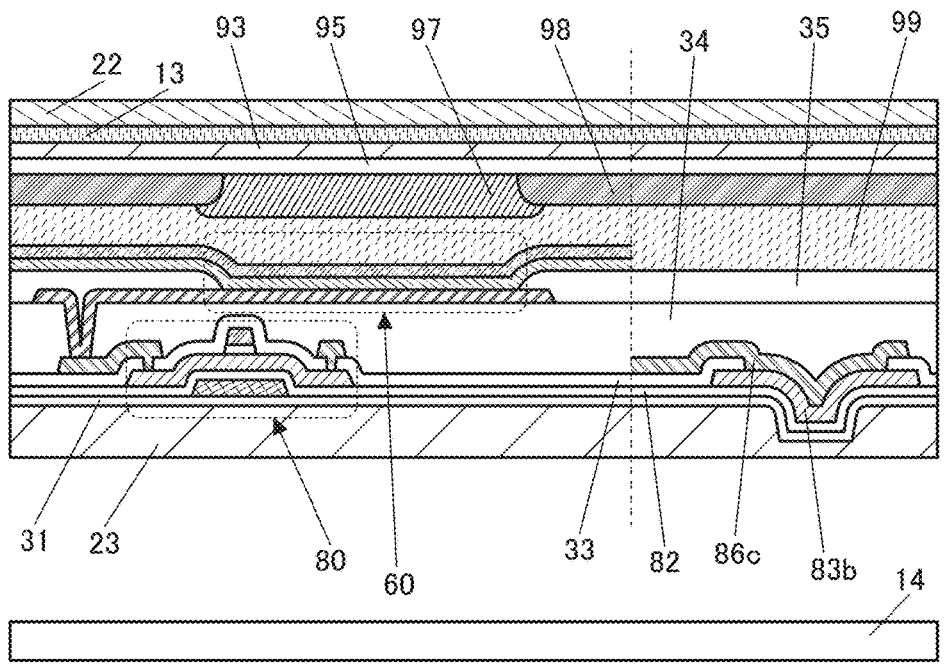
FIGS. 30A and 30B illustrate an example of a method for manufacturing a display device.

Then, the formation substrate 14 and the transistor 80 are separated (FIG. 30A).

FIG. 30A illustrates an example in which separation occurs at the interface between the formation substrate 14 and the resin layer 23.

Figure 30B:
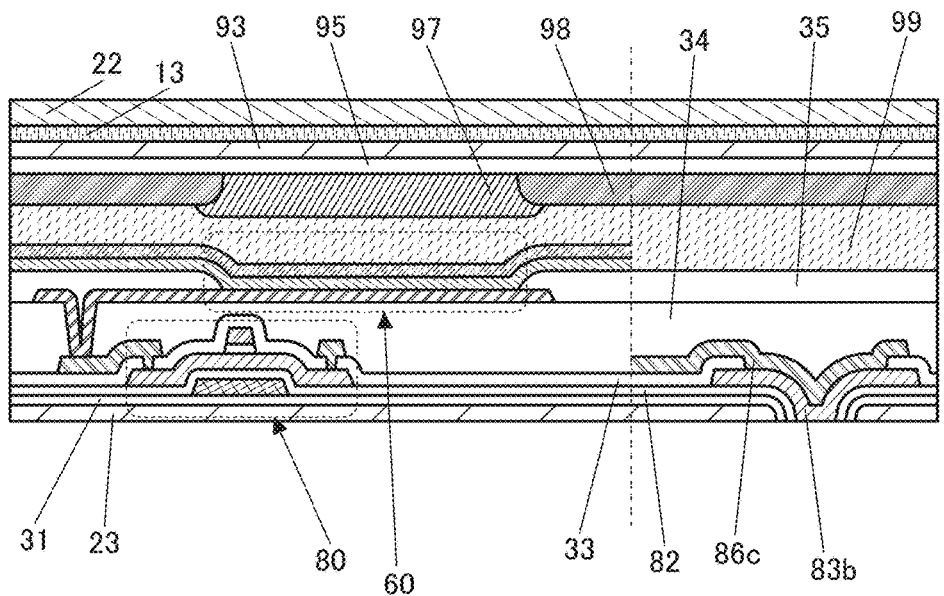

Next, part of the resin layer 23, part of the insulating layer 31, and part of the insulating layer 82 are removed to expose the oxide conductive layer 83b (FIG. 30B).

Figure 31A:
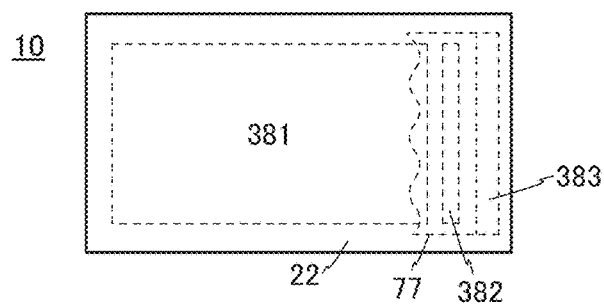
FIGS. 31A and 31B illustrate an example of a display device.
Figure 31B:
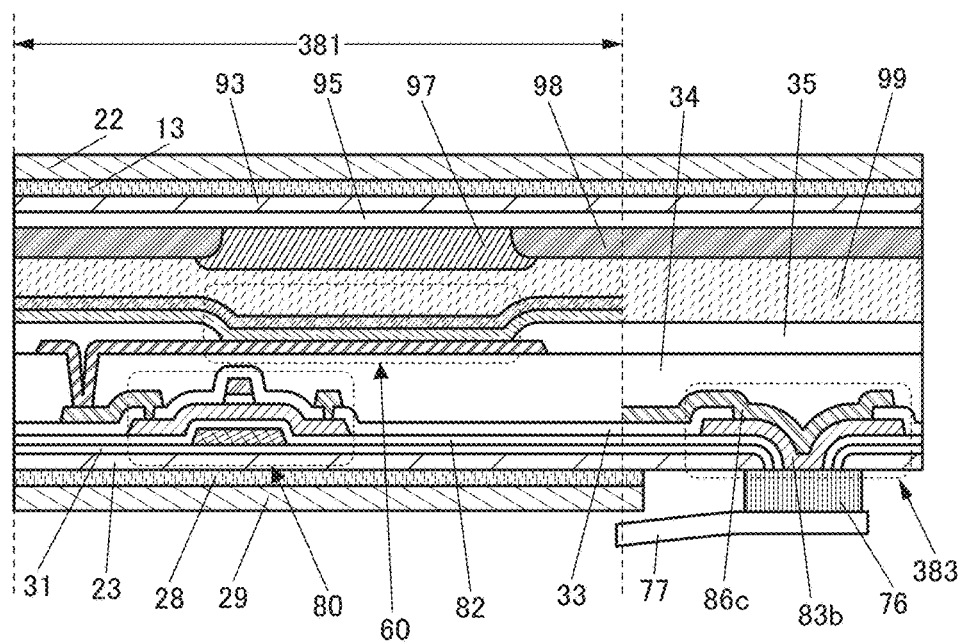

The separation of the formation substrate 14 and the transistor 80 can obtain the display device 10 (FIGS. 31A and 31B). The display device 10 can remain being bent or can be bent repeatedly, for example.

FIG. 31A is a top view of the display device 10. FIG. 31B is a cross-sectional view of the display portion 381 of the display device 10 and a cross-sectional view of the connection portion 383 for connection to the FPC 77.

The display device 10 includes a pair of substrates (the substrate 22 and the substrate 29). The substrate 22 side corresponds to a display surface side. The display device includes the display portion 381 and the driver circuit portion 382. The FPC 77 is attached to the display device.

As illustrated in FIG. 31B, the substrate 29 may be attached to the surface of the resin layer 23, with the adhesive layer 28. Note that the substrate 29 and the adhesive layer 28 are provided in a position that does not overlap with the oxide conductive layer 83b.

Then, the oxide conductive layer 83b and the FPC 77 are electrically connected to each other through the connector 76 (FIG. 31B).

In the manufacturing method example 2B, an example of using a top-emission light-emitting element is described. In the case where an external connection terminal is exposed on the substrate 22 side and electrically connected to the FPC 77, a display region cannot overlap with the FPC 77 because the substrate 22 is on the display surface side, and thus a region of the display device that overlaps with the FPC 77 is limited. In contrast, the oxide conductive layer 83b can be easily exposed on the side opposite to the display surface by using one embodiment of the present invention. As described above, in one embodiment of the present invention, an oxide semiconductor layer is formed as the oxide conductive layer 83b. The resistivity of the oxide conductive layer 83b can be sufficiently decreased by performing at least one of a plasma treatment step, a heat treatment step, and a step of forming a layer over the oxide conductive layer 83b. Thus, the oxide conductive layer 83b and the FPC 77 can be surely electrically connected to each other. Such a structure allows the FPC 77 to be positioned on the side opposite to the display surface. Thus, a space for bending the FPC 77 in incorporating the display device in an electronic device can be saved, which enables the electronic device to be smaller.

The manufacturing method example 2B is an example in which the peeling method of one embodiment of the present invention is performed twice to fabricate a display device. In one embodiment of the present invention, each of the functional elements and the like included in the display device is formed over the formation substrate; thus, even in the case where a high-resolution display device is manufactured, high alignment accuracy of the flexible substrate is not required. It is thus easy to attach the flexible substrate.

Modification Example 1B

In one embodiment of the present invention, a display device having a bottom-emission structure can be fabricated.

Figure 32A:
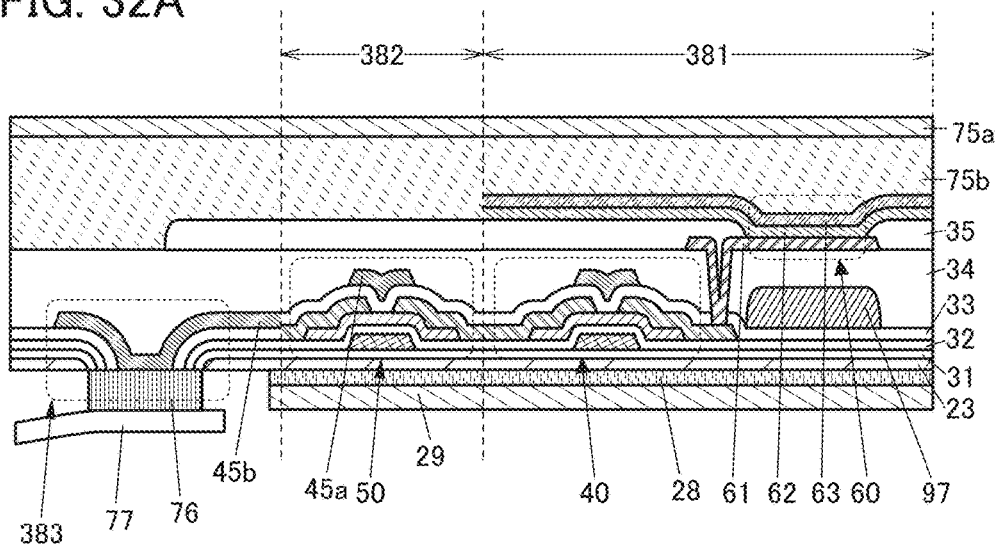
FIGS. 32A and 32B illustrate an example of a display device.

The display device in FIG. 32A is a bottom-emission display device using a color filter method. FIG. 32A is a cross-sectional view of the display portion 381 of the display device, a cross-sectional view of the driver circuit portion 382, and a cross-sectional view of the connection portion 383 for connection to the FPC 77.

The display device in FIG. 32A includes the substrate 29, the adhesive layer 28, the resin layer 23, the insulating layer 31, the transistor 40, a transistor 50, the conductive layer 45b, the insulating layer 33, the insulating layer 34, the insulating layer 35, the display element 60, the adhesive layer 75b, the substrate 75a, and the coloring layer 97.

FIG. 32A is an example including the transistor 40 and the transistor 50 which are each a transistor in which a conductive layer 45a functioning as a gate is added to the components of the transistor 40 in FIG. 24C.

The connection portion 383 includes the conductive layer 45b that is formed with the same material in the same step as the conductive layer 45a. The conductive layer 45b overlaps with the side surface of the resin layer 23 with the insulating layer 31, the insulating layer 32, and the insulating layer 33 positioned therebetween.

The display element 60 emits light to the coloring layer 97 side.

The FPC 77 and the conductive layer 45b are electrically connected to each other through the connector 76. In the cross-sectional view of a connection portion for connection to the FPC 77, an example in which the end portion of the insulating layer 35 is not exposed at the end portion of the display device is shown.

Modification Example 2B

Figure 32B:
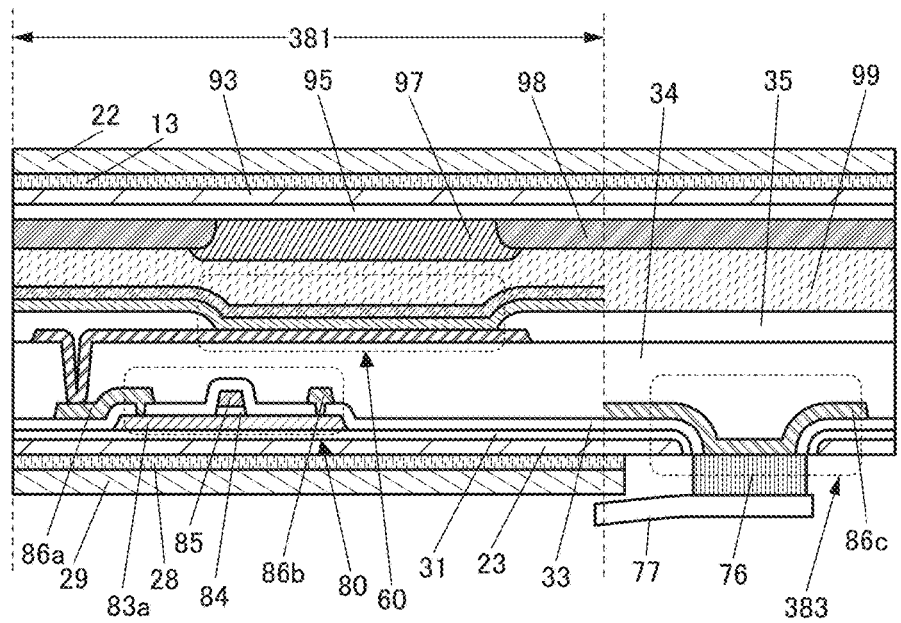

The display device in FIG. 32B is different from the display device in FIG. 31B in that the conductive layer 81 and the insulating layer 82 are not provided in the transistor 80. The transistor illustrated in FIG. 32B includes the oxide semiconductor layer 83a, the insulating layer 84, the conductive layer 85, the conductive layer 86a, and the conductive layer 86b. The conductive layer 86c are provided in the connection portion 383 illustrated in FIG. 32B. The conductive layer 86c overlaps with the side surface of the resin layer 23 with the insulating layer 31 and the insulating layer 33 positioned therebetween.

As described above, in one embodiment of the present invention, a flexible device can be fabricated by separating the transistor or the like from the formation substrate using the resin layer.

In one embodiment of the present invention, since the resin layer is formed with a photosensitive material, the resin layer with a desired shape can be easily formed. Since the conductive layer is provided over the opening of the resin layer, the conductive layer can be electrically connected to the circuit board. The external connection terminal and the circuit board can be electrically connected to each other on the surface opposite to the display surface. A space for bending the FPC and the like in incorporating the display device in an electronic device can be saved, which enables the electronic device to be smaller.

In one embodiment of the present invention, the manufacturing process of the transistor can be performed at a low temperature with the use of an oxide semiconductor in the channel formation region of the transistor. Furthermore, the resin layer can have a small thickness and low heat resistance. Thus, there are advantages in that the material of the resin layer can be selected from a wide range, high mass productivity can be obtained at low cost, and peeling and fabrication of the display device can be performed using a large-sized substrate, for example.

This embodiment can be combined with any of the other embodiments as appropriate.

Embodiment 3

In this embodiment, a peeling method of one embodiment of the present invention will be described with reference to FIGS. 33A to 33E to FIGS. 35A to 35D.

In the peeling methods of embodiments of the present invention described in Embodiments 1 and 2, the resin layer 23 is irradiated with the laser light 65 (see FIG. 4A, for example) to increase separability of the resin layer 23. On the other hand, after the resin layer 23 is irradiated with the laser light 65, the resin layer 23 might be unintentionally peeled from the formation substrate 14 while the formation substrate 14 is transferred, for example.

In view of this, in one embodiment of the present invention, a region where the resin layer 23 is not provided is formed over the formation substrate 14. The region has low separability even after the resin layer 23 is irradiated with the laser light 65, which can suppresses unintentional film peeling.

After that, treatment of forming a separation starting point (for example, making a cut with a sharp knife or the like) is performed and then the formation substrate 14 and the resin layer 23 are separated, whereby timing of separation can be surely controlled.

As described in Embodiments 1 and 2, the depressed portion is formed in the resin layer 23 in one embodiment of the present invention. In order to form the region where the resin layer 23 is not provided over the formation substrate 14 and form the depressed portion in the resin layer 23, an exposure technique using a multi-tone mask (a half-tone mask, a gray-tone mask, or the like) or a multiple exposure technique using two or more photomasks is preferably used.

Figure 33A:
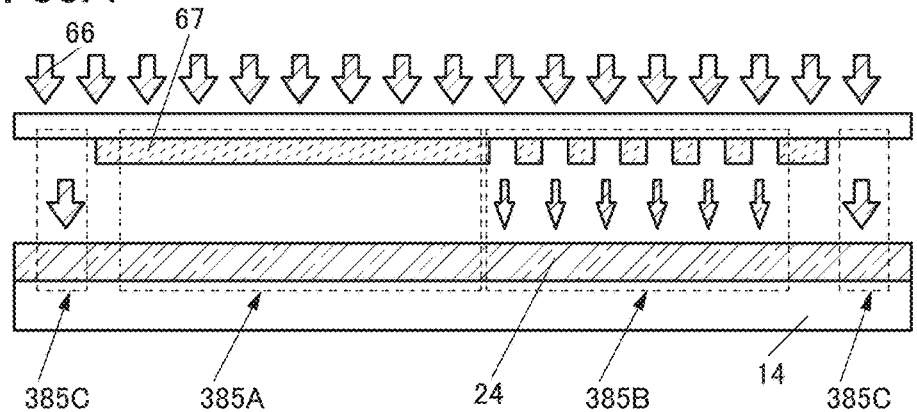
FIGS. 33A to 33E illustrate an example of a method for manufacturing a display device.
Figure 33B:
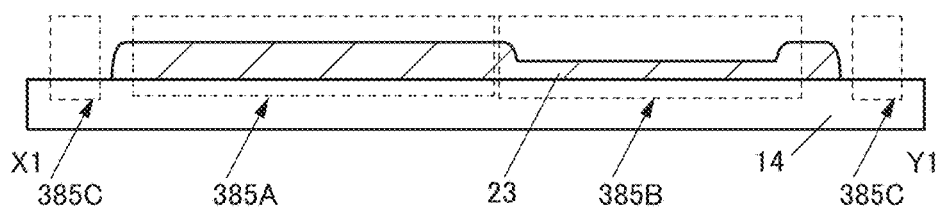
Figure 34A:
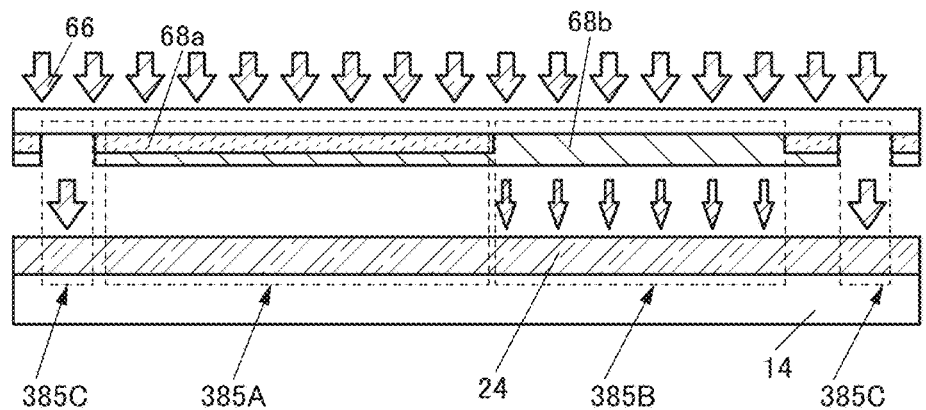
FIGS. 34A to 34E illustrate an example of a method for manufacturing a display device.
Figure 34B:
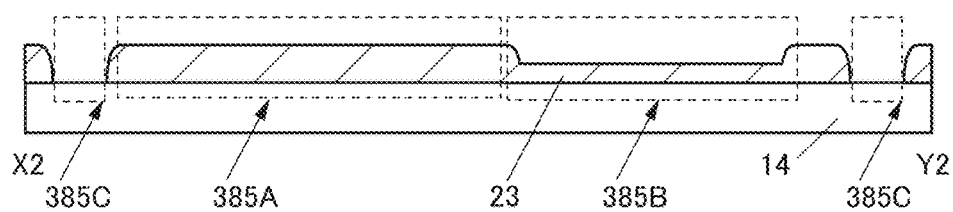

Examples of forming the resin layer 23 using a multi-tone mask are described below. FIGS. 33A and 33B illustrate an example of using a gray-tone mask. FIGS. 34A and 34B illustrate an example of using a half-tone mask.

Exposure technique using a multi-tone mask is preferred because the number of masks and exposure times are reduced as compared with the multiple exposure technique, which results in simplification of the process and reduction in cost.

Specific Example 1

First, as illustrated in FIG. 33A, the first layer 24 is formed with a photosensitive material over the formation substrate 14. Here, an example using a positive photosensitive material is described. A portion in the first layer 24 irradiated with light dissolves in an etchant and a portion in the first layer 24 not irradiated with light remains.

The first layer 24 is irradiated with light 66 through a gray-tone mask 67. The first layer 24 in a region 385C is irradiated with the light 66. Slit that is smaller than the resolution limit of the exposure apparatus is patterned in a region 385B in the gray-tone mask 67, and part of the light 66 is blocked. Thus, the amount of light with which the first layer 24 is irradiated is smaller in the region 385B than in the region 385C. In the region 385A, the gray-tone mask 67 blocks the light 66, so that the first layer 24 is not irradiated with the light 66.

Next, development and post-baking are performed, whereby the resin layer 23 can be formed (FIG. 33B). The thickness of the resin layer 23 is smaller in the region 385B than in the region 385A. The resin layer 23 is not provided in the region 385C.

With use of the gray-tone mask 67 in this manner, the region where the resin layer 23 is not provided can be formed and a depressed portion of the resin layer 23 can be formed.

Figure 35A:
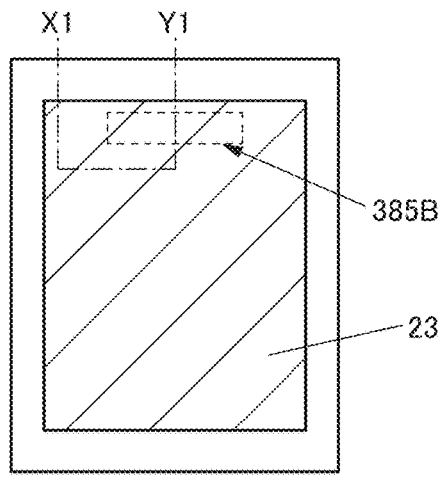
FIGS. 35A to 35D illustrate an example of a method for manufacturing a display device.

FIG. 33B is a cross-sectional view taken along X1-Y1 in FIG. 35A, for example. As illustrated in FIG. 35A, the resin layer 23 with a depressed portion and an island shape can be formed with use of a gray-tone mask. Note that the resin layer 23 with a shape of FIG. 33B and FIG. 35A may be formed with a multi-tone mask such as a half-tone mask or by the multiple exposure technique.

Figure 33C:
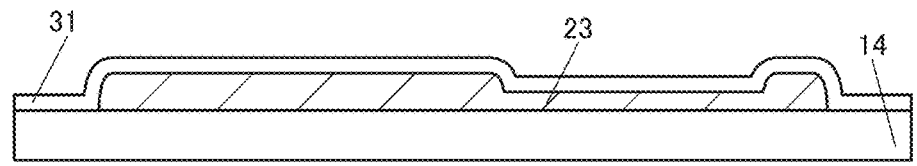

Next, the insulating layer 31 is formed over the formation substrate 14 and the resin layer 23 (FIG. 33C). In manufacturing a display device, a transistor, a display element, and the like are formed over the insulating layer 31 as described in Embodiments 1 and 2; however, description of those is omitted in this embodiment for simplification of explanation.

Then, the resin layer 23 is irradiated with laser light to increase separability of the resin layer 23. The adhesion between the formation substrate 14 and the insulating layer 31 is not decreased by laser light irradiation. Therefore, after the laser light irradiation, film peeling while the formation substrate 14 is transferred can be prevented.

Figure 33D:
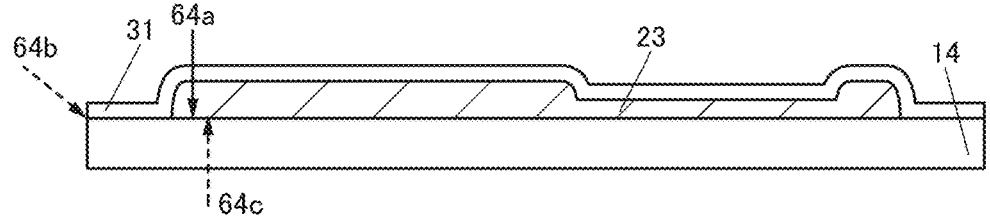
Figure 33E:
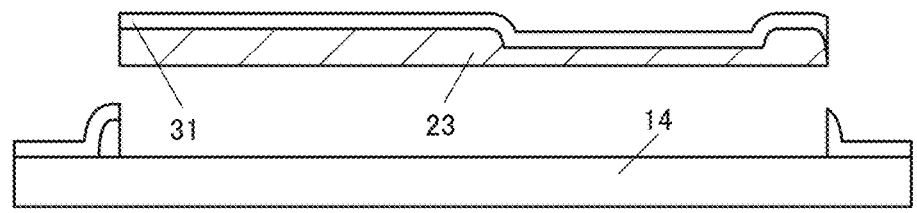

A separation starting point is formed in the resin layer 23 (FIG. 33D). Thus, the resin layer 23 and the formation substrate 14 can be separated (FIG. 33E).

For example, a cut may be formed in the insulating layer 31 and the resin layer 23 with a sharp knife 64a. Alternatively, the adhesion between the formation substrate 14 and the insulating layer 31 may be decreased by inserting a sharp knife 64b between the formation substrate 14 and the insulating layer 31. Alternatively, a crack may be formed in the resin layer 23 by irradiation with light 64c.

Figure 35B:
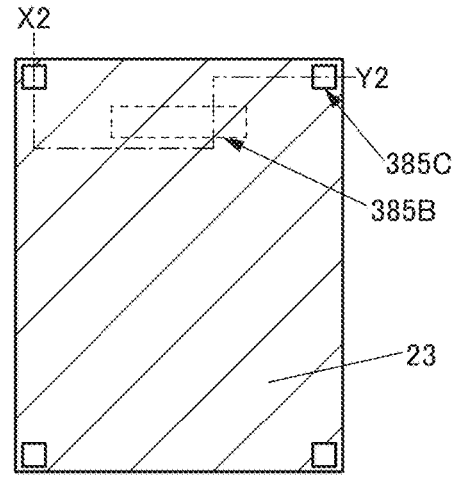
Figure 35C:
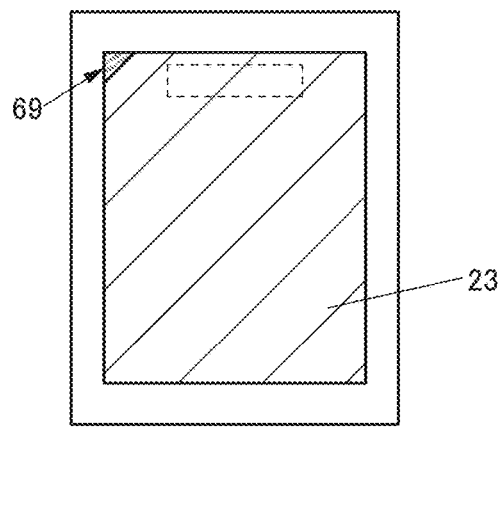

As illustrated in FIG. 35C, a separation starting point 69 is preferably set at or near a portion from which separation starts.

As described above, by forming the region in which the resin layer 23 is not provided over the formation substrate 14, the resin layer 23 can be peeled at a desired timing, increasing the yield in a process for manufacturing a display device.

Specific Example 2

First, as illustrated in FIG. 34A, the first layer 24 is formed with a photosensitive material over the formation substrate 14. Here, an example using a positive photosensitive material is described.

The first layer 24 is irradiated with the light 66 through a half-tone mask. The half-tone mask includes a light-blocking film 68a and a semi-transmissive film 68b. Neither the light-blocking film 68a nor the semi-transmissive film 68b is provided in the region 385C, and the first layer 24 is irradiated with the light 66. The light-blocking film 68a is not provided in the region 385B and the semi-transmissive film 68b is provided. Thus, the amount of light with which the first layer 24 is irradiated is smaller in the region 385B than in the region 385C. In the region 385A, the light-blocking film 68a blocks the light 66, so that the first layer 24 is not irradiated with the light 66.

Next, development and post-baking are performed, whereby the resin layer 23 can be formed (FIG. 34B). The thickness of the resin layer 23 is smaller in the region 385B than in the region 385A. The resin layer 23 is not provided in the region 385C.

With use of the half-tone mask in this manner, the region where the resin layer 23 is not provided can be formed and a depressed portion of the resin layer 23 can be formed.

FIG. 34B is a cross-sectional view taken along X2-Y2 in FIG. 35B, for example. As illustrated in FIG. 35B, the resin layer 23 with a depressed portion and an opening can be formed with use of a half-tone mask. Note that the resin layer 23 with a shape of FIG. 34B and FIG. 35B may be formed with a multi-tone mask such as a gray-tone mask or by the multiple exposure technique.

Figure 34C:
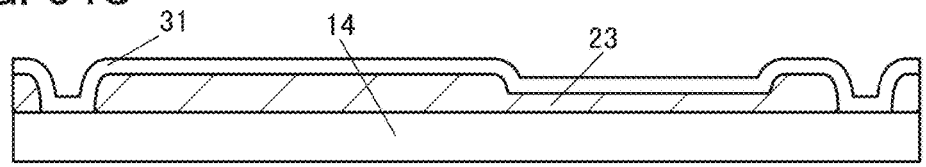

Next, the insulating layer 31 is formed over the formation substrate 14 and the resin layer 23 (FIG. 34C).

Then, the resin layer 23 is irradiated with laser light to increase separability of the resin layer 23. The adhesion between the formation substrate 14 and the insulating layer 31 is not decreased by laser light irradiation. Therefore, after the laser light irradiation, film peeling while the formation substrate 14 is transferred can be prevented.

Figure 34D:
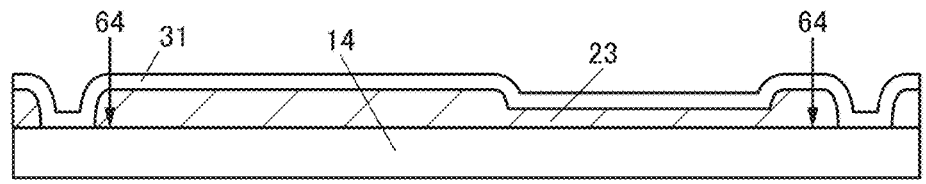
Figure 34E:
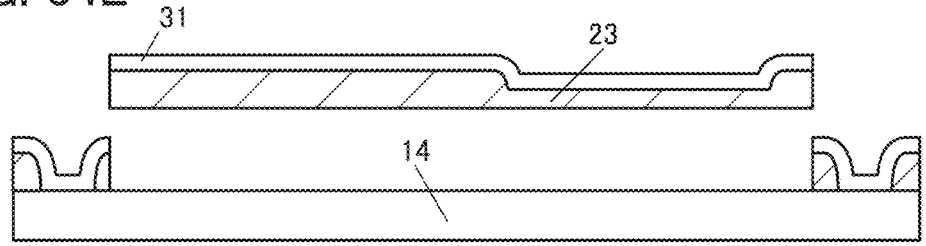

A separation starting point is formed in the resin layer 23 (FIG. 34D). Thus, the resin layer 23 and the formation substrate 14 can be separated (FIG. 34E).

Figure 35D:
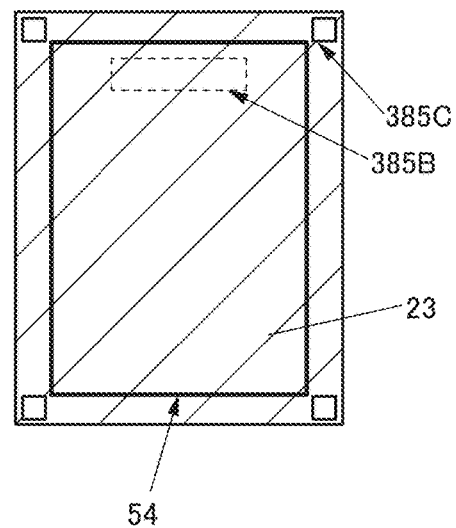

FIG. 34D and FIG. 35D illustrate an example in which a frame-shape cut 54 is made in the insulating layer 31 and the resin layer 23 with a sharp knife 64. An inside of a frame-shape cut 54 illustrated in FIG. 35D is a portion that is to be peeled from the formation substrate 14. The shape of the cut is not limited to a frame shape, and can be made along one or more sides of the resin layer 23, for example.

As described above, by forming the region in which the resin layer 23 is not provided over the formation substrate 14, the resin layer 23 can be peeled at a desired timing, increasing the yield in a process for manufacturing a display device.

This embodiment can be combined with any of the other embodiments as appropriate.

Embodiment 4

In this embodiment, a display module and electronic devices that can be fabricated using one embodiment of the present invention will be described with reference to FIG. 36 and FIGS. 37A to 37F.

Figure 36:
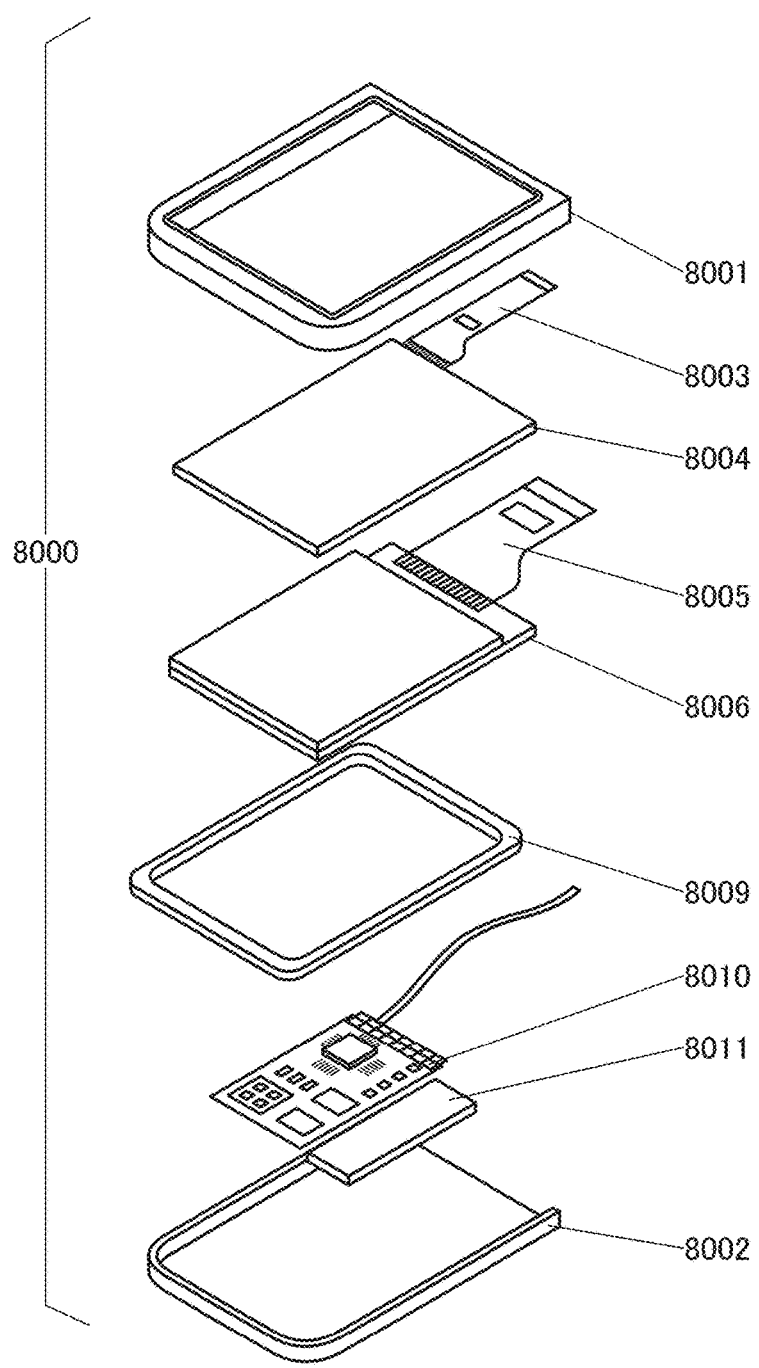
FIG. 36 illustrates an example of a display module.

In a display module 8000 in FIG. 36, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. Instead of providing the touch panel 8004, the display panel 8006 can have a touch panel function.

The frame 8009 protects the display panel 8006 and also functions as an electromagnetic shield for blocking electromagnetic waves generated by the operation of the printed circuit board 8010. The frame 8009 may function as a radiator plate.

The printed circuit board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

Highly reliable electronic devices with curved surfaces can be fabricated by one embodiment of the present invention. In addition, flexible and highly reliable electronic devices can be fabricated by one embodiment of the present invention.

Examples of electronic devices include a television set, a desktop or notebook personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions, for example, a function of displaying a variety of information (e.g., a still image, a moving image, and a text image) on a display portion, a touch panel function, a function of displaying a calendar, date, time, and the like, a function of executing a variety of software (programs), a wireless communication function, and a function of reading a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of taking a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic device of one embodiment of the present invention are not limited thereto, and the electronic devices can have a variety of functions.

Figure 37A:
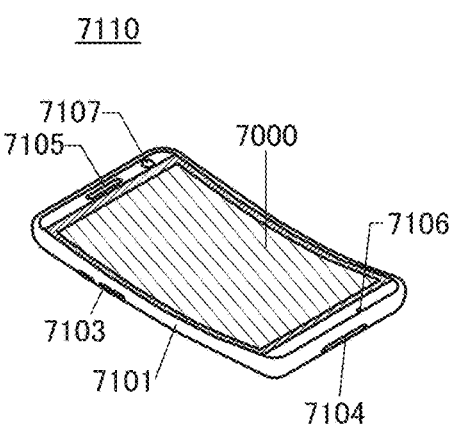
FIGS. 37A to 37F illustrate examples of electronic devices.
Figure 37B:
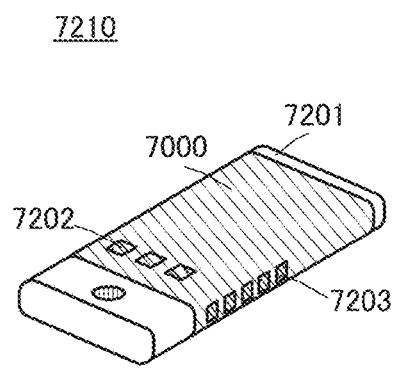
Figure 37C:
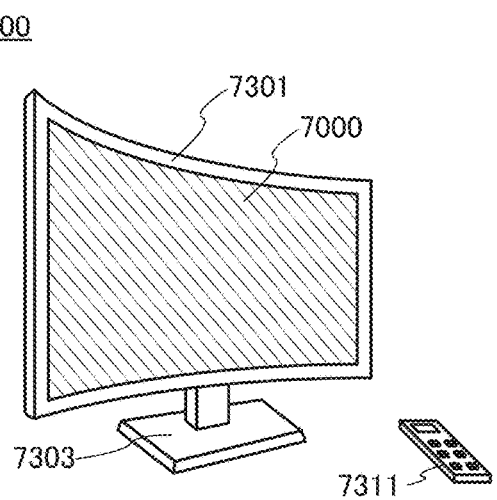

FIGS. 37A to 37C illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the display device of one embodiment of the present invention. One embodiment of the present invention makes it possible to provide a highly reliable electronic device having a curved display portion.

FIG. 37A illustrates an example of a mobile phone. A mobile phone 7110 illustrated in FIG. 37A includes a housing 7101, the display portion 7000, operation buttons 7103, an external connection port 7104, a speaker 7105, a microphone 7106, a camera 7107, and the like.

The mobile phone 7110 includes a touch sensor in the display portion 7000. Operations such as making a call and inputting text can be performed by touch on the display portion 7000 with a finger, a stylus, or the like.

With the operation buttons 7103, power can be on or off. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

FIG. 37B illustrates an example of a portable information terminal. A portable information terminal 7210 illustrated in FIG. 37B includes a housing 7201 and the display portion 7000. The portable information terminal 7210 may also include an operation button, an external connection port, a speaker, a microphone, an antenna, a camera, a battery, or the like. The display portion 7000 is provided with a touch sensor. The operation of the portable information terminal can be performed by touching the display portion 7000 with a finger, a stylus, or the like.

The portable information terminal illustrated in this embodiment functions as, for example, one or more of a telephone set, a notebook, and an information browsing system. Specifically, the portable information terminals each can be used as a smartphone. The portable information terminal illustrated in this embodiment is capable of executing, for example, a variety of applications such as mobile phone calls, e-mailing, reading and editing texts, music reproduction, Internet communication, and a computer game.

The portable information terminal 7210 can display characters, image information, and the like on its plurality of surfaces. For example, three operation buttons 7202 can be displayed on one surface, and information 7203 indicated by a rectangle can be displayed on another surface. FIG. 37B illustrates an example in which the operation buttons 7202 are displayed on the top surface of the portable information terminal 7210 and the information 7203 is displayed on the side surface of the portable information terminal 7210. Note that the operation buttons 7202 may be displayed on the side surface of the portable information terminal 7210 and the information 7203 may be displayed on the top surface of the portable information terminal 7210, for example. Information may be displayed on three or more surfaces of the portable information terminal 7210.

Examples of the information 7203 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information 7203.

FIG. 37C illustrates an example of a television set. In a television set 7300, the display portion 7000 is incorporated into a housing 7301. Here, the housing 7301 is supported by a stand 7303.

The television set 7300 illustrated in FIG. 37C can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 37D:
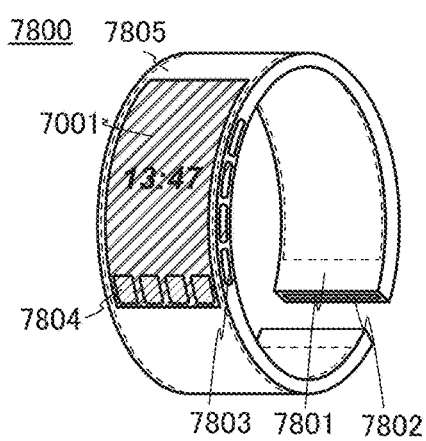
Figure 37E:
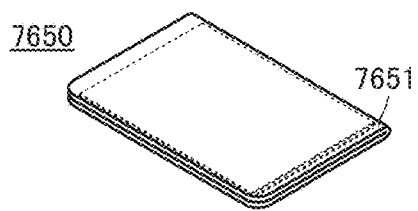
Figure 37F:
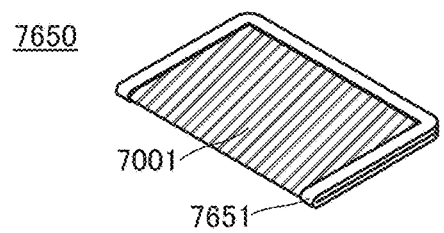

FIGS. 37D to 37F each illustrate an example of a portable information terminal including a flexible and bendable display portion 7001.

The display portion 7001 is fabricated using the display device or the like of one embodiment of the present invention. For example, a display device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a flexible display portion.

FIG. 37D illustrates an example of a wrist-watch-type portable information terminal. A portable information terminal 7800 includes a band 7801, the display portion 7001, an input/output terminal 7802, operation buttons 7803, and the like. The band 7801 functions as a housing. A flexible battery 7805 can be included in the portable information terminal 7800. The battery 7805 may be arranged to overlap with the display portion 7001, or the band 7801 and the like, for example.

The band 7801, the display portion 7001, and the battery 7805 have flexibility. Thus, the portable information terminal 7800 can be easily curved to have a desired shape.

With the operation buttons 7803, a variety of functions such as time setting, turning on or off of the power, turning on or off of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

FIGS. 37E and 37F illustrate an example of a foldable portable information terminal. FIG. 37E illustrates a portable information terminal 7650 that is folded so that the display portion 7001 is on the inside. FIG. 37F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged. Note that although FIGS. 37E and 37F illustrate the portable information terminal 7650 that is folded in two, the portable information terminal 7650 may be folded in three, four, or more. The portable information terminal 7650 may include an operation button, an external connection port, a speaker, a microphone, an antenna, a camera, a battery, or the like.

This embodiment can be combined with any of the other embodiments as appropriate.

Example 1

In this example, the results of separation of the resin layer and the formation substrate by the peeling method of one embodiment of the present invention will be described.

Figure 38A:
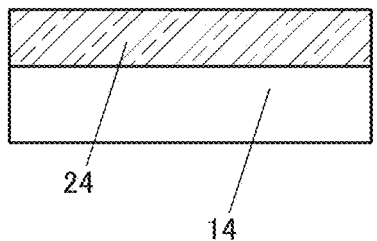
FIGS. 38A to 38D illustrate a method for manufacturing a sample of Example 1.
Figure 38B:
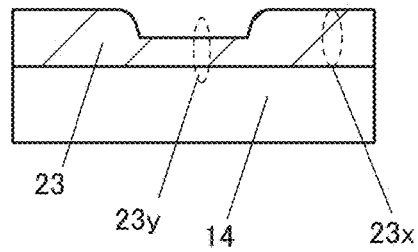

First, the positive photosensitive first layer 24 was formed over the formation substrate 14 by a spin coating method, and pre-baking was performed (FIG. 38A). Next, light exposure was performed using a photomask. A stepper was used as a light-exposure machine, and light exposure time was shorter (3000 msec) than that in conditions for forming an opening in the resin layer 23 (7500 msec). Subsequently, development was performed, and post-baking was performed at 400° C. for an hour, so that the resin layer 23 having a depressed portion was formed (FIG. 38B).

A glass substrate with a thickness of approximately 0.7 mm was used as the formation substrate 14. A photosensitive and thermosetting polyimide resin with a viscosity of approximately 30 cP was used for the first layer 24. A polyimide resin film was used as the resin layer 23. After the post-baking, a thick portion 23*x* of the resin layer 23 had a thickness of approximately 1.5 µm, and a thin portion 23*y* had a thickness (thickness to the bottom surface of the depressed portion) of approximately 0.3 µm.

Figure 38C:
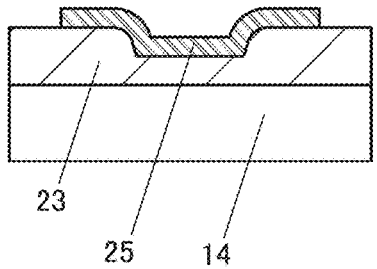

Next, a conductive layer 25 with a thickness of approximately 100 nm was formed over the resin layer 23 to overlap with the bottom surface of the depressed portion of the resin layer 23 (FIG. 38C).

A material of the conductive layer 25 differs among samples. Four kinds of materials, tungsten (W), an alloy of silver, palladium, and copper (Ag—Pd—Cu, hereinafter referred to as APC), titanium (Ti), and aluminum (Al) were used.

Figure 38D:
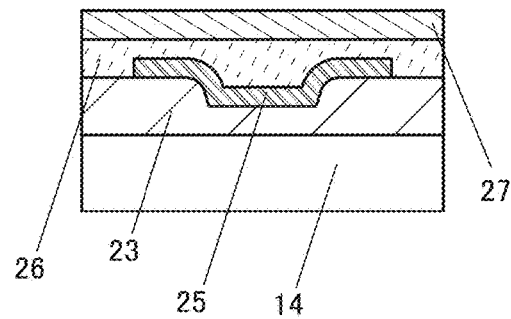

Then, a film 27 was attached with an adhesive layer 26 (FIG. 38D).

As the adhesive layer 26, an approximately 5-µm-thick thermosetting epoxy resin film was used. The film 27 has a stacked structure of an approximately 23-µm film and an approximately 100-µm protective film.

The resin layer 23 was irradiated with laser light from the formation substrate 14 side. In the top view, the laser light irradiation was performed on the entire surface of the formation substrate 14. Note that in the light irradiation, a light-blocking mask was provided in the peripheral portion of the formation substrate 14.

As a laser emitting laser light, an XeCl excimer laser (wavelength: 308 nm) was used. The laser was set as follows: the energy was 950 mJ, the energy density was 376.1 mJ/cm$^2$, the repetition rate was 60 Hz, and the scan rate was 3.6 mm/sec. The cross section of the laser light was shaped into a linear form with a size of 0.6 mm×300 mm by adjusting an optical system. An attenuator was used for the optical system. Irradiation energy attenuation by the attenuator was 10%.

After the laser light irradiation, a cut was made from the film 27 side in the inner side than the peripheral portion with a cutter, so that the resin layer 23 was peeled from the formation substrate 14.

Figure 39A:
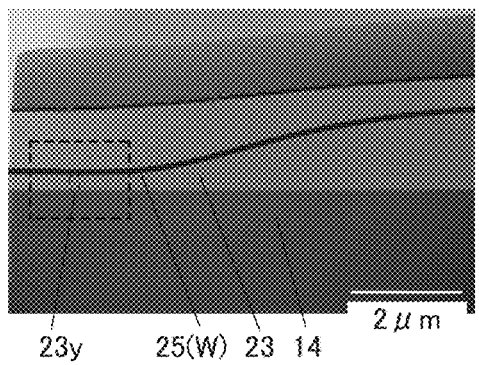
FIGS. 39A to 39F are cross-sectional STEM images of a sample of Example 1.
Figure 39B:
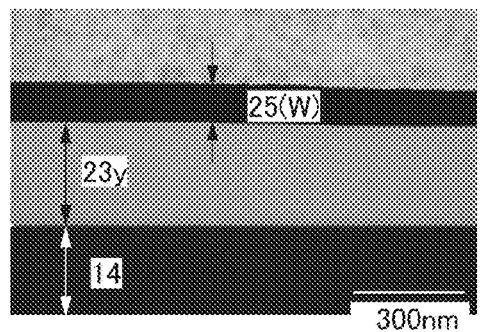

FIGS. 39A and 39B are cross-sectional STEM images of samples in which the resin layer 23 and the conductive layer 25 are stacked over the formation substrate 14. In the samples of photographs in FIGS. 39A and 39B, tungsten was used for the conductive layer 25.

FIG. 39A is a photograph including part of the depressed portion of the resin layer 23. FIG. 39B is an enlarged photograph showing a portion surrounded by a dotted line in FIG. 39A. FIG. 39B is a photograph including the thin portion 23y of the resin layer 23.

As shown in FIG. 39B, the conductive layer 25 (W) is formed over the formation substrate 14 to overlap with the bottom surface of the depressed portion of the resin layer 23.

Figure 39C:
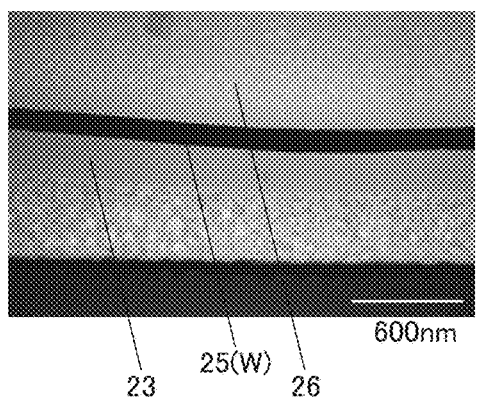
Figure 39D:
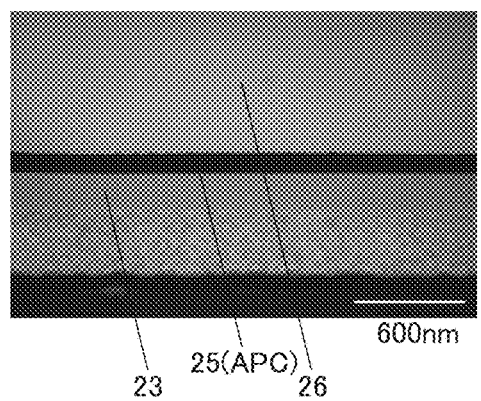
Figure 39E:
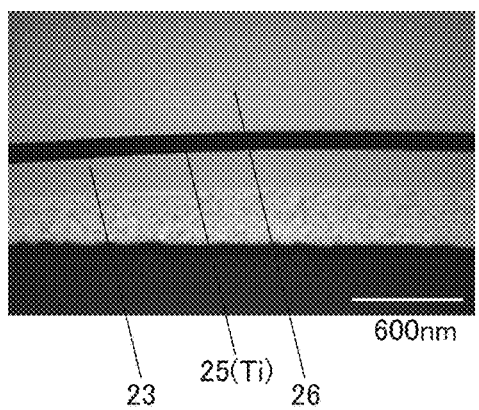
Figure 39F:
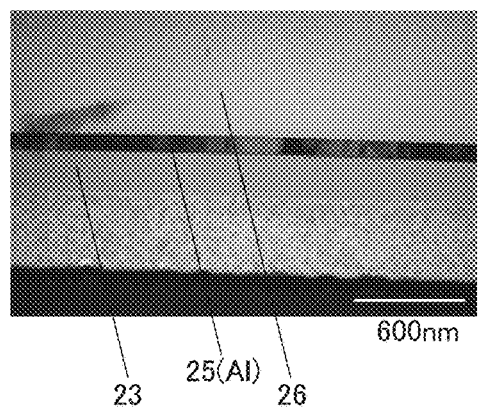

FIGS. 39C to 39F are cross-sectional STEM images of the film 27 side after the peeling of the formation substrate 14. FIG. 39C is a photograph showing a sample in which tungsten was used for the conductive layer 25, FIG. 39D is a photograph showing a sample in which APC was used for the conductive layer 25, FIG. 39E is a photograph showing a sample in which titanium was used for the conductive layer 25, and FIG. 39F is a photograph showing a sample in which aluminum was used for the conductive layer 25. In FIGS. 39C to 39F, layers below the resin layer 23 were formed for observation.

As shown in FIGS. 39C to 39F, in each sample, the resin layer 23 remains on the surface exposed by peeling, and the thickness of the resin layer 23 was approximately 210 nm to 250 nm. Accordingly, it was found that separation occurred in the resin layer 23 in each sample in this example.

According to the results in this example, by the peeling method of one embodiment of the present invention, the formation substrate and the resin layer can be separated at an interface which is around the boundary between the formation substrate and the resin layer.

This application is based on Japanese Patent Application serial no. 2016-099426 filed with Japan Patent Office on May 18, 2016 and Japanese Patent Application serial no. 2016-099428 filed with Japan Patent Office on May 18, 2016, the entire contents of which are hereby incorporated by reference.

What is claimed is:

1. A display device comprising:
    a resin layer comprising an opening;
    an insulating layer over the resin layer and comprising an opening;
    a transistor comprising an oxide semiconductor in a channel formation region over the insulating layer;
    a conductive layer over the insulating layer; and
    a display element electrically connected to the transistor,
    wherein the conductive layer overlaps with the opening of the insulating layer and the opening of the resin layer, and
    wherein at least part of the conductive layer is exposed in the opening of the resin layer.

2. The display device according to claim 1, wherein the resin layer comprises polyimide.

3. The display device according to claim 1, wherein a thickness of the resin layer is greater than or equal to 0.1 µm and less than or equal to 3 µm.

4. The display device according to claim 1, wherein the conductive layer comprises an oxide conductive layer.

5. The display device according to claim 1, wherein the oxide semiconductor of the transistor and the conductive layer comprise the same metal element.

6. The display device according to claim 1, wherein an exposed surface of the resin layer is positioned on an inner side than an exposed surface of the conductive layer.

7. A module comprising:
    the display device according to claim 1; and
    a circuit board,
    wherein the circuit board is electrically connected to the conductive layer through the opening of the resin layer.

8. An electronic device comprising:
    the module according to claim 7; and
    at least one of an antenna, a battery, a housing, a camera, a speaker, a microphone, and an operation button.

9. The display device according to claim 1, wherein an exposed surface of the resin layer is positioned on an outer side than an exposed surface of the conductive layer.

10. A display device comprising:
    a resin layer comprising an opening;
    an insulating layer over the resin layer and comprising an opening;
    a transistor comprising an oxide semiconductor in a channel formation region over the insulating layer;
    a conductive layer over the insulating layer; and
    a display element electrically connected to the transistor,
    wherein the insulating layer covers a periphery of the opening of the resin layer,
    wherein the conductive layer overlaps with the opening of the insulating layer and the opening of the resin layer, and
    wherein at least part of the conductive layer is exposed in the opening of the resin layer.

11. The display device according to claim 10, wherein the resin layer comprises polyimide.

12. The display device according to claim 10, wherein a thickness of the resin layer is greater than or equal to 0.1 μm and less than or equal to 3 μm.

13. The display device according to claim 10, wherein the conductive layer comprises an oxide conductive layer.

14. The display device according to claim 10, wherein the oxide semiconductor of the transistor and the conductive layer comprise the same metal element.

15. The display device according to claim 10, wherein an exposed surface of the resin layer is positioned on an inner side than an exposed surface of the conductive layer.

16. The display device according to claim 10, wherein an exposed surface of the resin layer is positioned on an outer side than an exposed surface of the conductive layer.

17. A module comprising:
the display device according to claim 10; and
a circuit board,
wherein the circuit board is electrically connected to the conductive layer through the opening of the resin layer.

18. An electronic device comprising:
the module according to claim 17; and
at least one of an antenna, a battery, a housing, a camera, a speaker, a microphone, and an operation button.

19. A display module comprising:
a circuit board;
a resin layer comprising an opening;
an insulating layer over the resin layer and comprising an opening;
a transistor comprising an oxide semiconductor in a channel formation region over the insulating layer;
a conductive layer over the insulating layer; and
a display element electrically connected to the transistor,
wherein the conductive layer overlaps with the opening of the insulating layer and the opening of the resin layer,
wherein the circuit board overlaps with the conductive layer and the opening of the resin layer, and
wherein the circuit board is electrically connected to the conductive layer through the opening of the resin layer.

20. The display module according to claim 19, wherein the resin layer comprises polyimide.

21. The display module according to claim 19, wherein a thickness of the resin layer is greater than or equal to 0.1 μm and less than or equal to 3 μm.

22. The display module according to claim 19, wherein the conductive layer comprises an oxide conductive layer.

23. The display module according to claim 19, wherein the oxide semiconductor of the transistor and the conductive layer comprise the same metal element.

24. The display device according to claim 19, wherein a surface of the circuit board side of the resin layer is positioned on an inner side than a surface of the circuit board side of the conductive layer.

25. The display device according to claim 19, wherein a surface of the circuit board side of the resin layer is positioned on an outer side than a surface of the circuit board side of the conductive layer.

* * * * *